(12) United States Patent
Yamazaki et al.

(10) Patent No.: US 9,153,602 B2
(45) Date of Patent: Oct. 6, 2015

(54) SEMICONDUCTOR DEVICE WHEREIN AN OXIDE SEMICONDUCTOR LAYER COMPRISES A CRYSTAL AND HAS A DEGREE OF CRYSTALLIZATION OF 80% OR MORE

(71) Applicant: Semiconductor Energy Laboratory Co., Ltd., Atsugi-shi, Kanagawa-ken (JP)

(72) Inventors: Shunpei Yamazaki, Setagaya (JP); Junichiro Sakata, Atsugi (JP); Masayuki Sakakura, Tochigi (JP); Yoshiaki Oikawa, Sagamihara (JP); Kenichi Okazaki, Tochigi (JP); Hotaka Maruyama, Tochigi (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/521,716

(22) Filed: Oct. 23, 2014

(65) Prior Publication Data

US 2015/0041806 A1      Feb. 12, 2015

Related U.S. Application Data

(63) Continuation of application No. 14/164,713, filed on Jan. 27, 2014, now Pat. No. 8,885,115, which is a continuation of application No. 12/848,404, filed on Aug. 2, 2010, now Pat. No. 8,654,272.

(30) Foreign Application Priority Data

Aug. 7, 2009   (JP) .................................. 2009-185317
Sep. 7, 2009   (JP) .................................. 2009-206489

(51) Int. Cl.
*G02F 1/136* (2006.01)
*G02F 1/1343* (2006.01)
*H01L 27/12* (2006.01)

(52) U.S. Cl.
CPC .......... *H01L 27/1225* (2013.01); *H01L 27/124* (2013.01)

(58) Field of Classification Search
USPC ............................................... 349/42, 43, 140
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

CN       001914552 A      2/2007
CN       101335293 A     12/2008
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(Continued)

*Primary Examiner* — Paul Lee
(74) *Attorney, Agent, or Firm* — Eric J. Robinson; Robinson Intellectual Property Law Office, P.C.

(57) ABSTRACT

An object is to improve reliability of a semiconductor device. A semiconductor device including a driver circuit portion and a display portion (also referred to as a pixel portion) over the same substrate is provided. The driver circuit portion and the display portion include thin film transistors in which a semiconductor layer includes an oxide semiconductor; a first wiring; and a second wiring. The thin film transistors each include a source electrode layer and a drain electrode layer. In the thin film transistor in the driver circuit portion, the semiconductor layer is sandwiched between a gate electrode layer and a conductive layer. The first wiring and the second wiring are electrically connected to each other in an opening provided in a gate insulating film through an oxide conductive layer.

16 Claims, 40 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,691,685 B2 | 4/2010 | Maekawa et al. |
| 7,719,185 B2 | 5/2010 | Jin et al. |
| 7,732,819 B2 | 6/2010 | Akimoto et al. |
| 7,745,798 B2 | 6/2010 | Takahashi |
| 7,910,490 B2 | 3/2011 | Akimoto et al. |
| 7,915,689 B2 | 3/2011 | Cho et al. |
| 7,932,521 B2 | 4/2011 | Akimoto et al. |
| 7,943,985 B2 | 5/2011 | Kim et al. |
| 8,017,947 B2 | 9/2011 | Kim et al. |
| 8,022,411 B2 | 9/2011 | Yoon et al. |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0093002 A1 | 4/2007 | Maekawa et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0012075 A1 | 1/2008 | Fukuda |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1* | 12/2008 | Akimoto et al. ............... 257/59 |
| 2009/0001374 A1 | 1/2009 | Inoue et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0044701 A1 | 2/2010 | Sano et al. |
| 2010/0065844 A1 | 3/2010 | Tokunaga |
| 2010/0072470 A1 | 3/2010 | Yamazaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0163863 A1 | 7/2010 | Yaegashi |
| 2011/0012112 A1 | 1/2011 | Yamazaki et al. |
| 2011/0012116 A1 | 1/2011 | Yamazaki et al. |
| 2011/0031492 A1 | 2/2011 | Yamazaki et al. |
| 2011/0031493 A1 | 2/2011 | Yamazaki et al. |
| 2011/0031496 A1 | 2/2011 | Yamazaki et al. |
| 2011/0031497 A1 | 2/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |

FOREIGN PATENT DOCUMENTS

| | | |
|---|---|---|
| EP | 1737044 A | 12/2006 |
| EP | 1770788 A | 4/2007 |
| EP | 1981085 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 06-202156 A | 7/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-029293 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-081362 A | 3/2007 |
| JP | 2007-096055 A | 4/2007 |
| JP | 2007-123861 A | 5/2007 |
| JP | 2007-163467 A | 6/2007 |
| JP | 2007-171932 A | 7/2007 |
| JP | 2007-258675 A | 10/2007 |
| JP | 2009-265271 A | 11/2009 |
| JP | 2010-098280 A | 4/2010 |
| WO | WO-2004/114391 | 12/2004 |
| WO | WO-2005/071478 | 8/2005 |
| WO | WO-2008/105347 | 9/2008 |

OTHER PUBLICATIONS

Ikeda. T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada. T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka. Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFe2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nozawa.T, "Transparent Circuit", Nikkei Electronics, Aug. 27, 2007, No. 959, pp. 39-52.
Chinese Office Action (Application No. 201010248811.5) Dated Mar. 4, 2014.

* cited by examiner

FIG. 14A
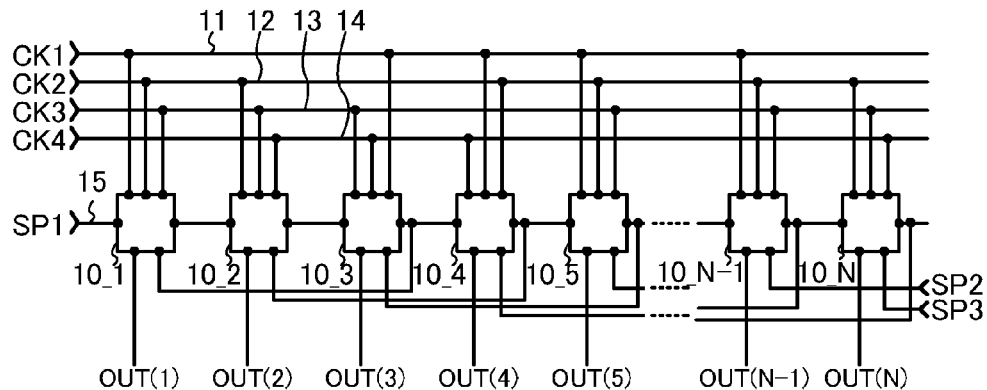
FIG. 14B
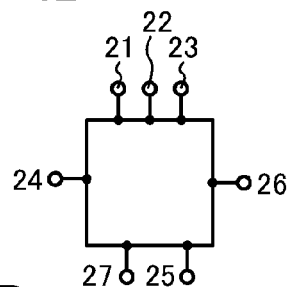
FIG. 14C
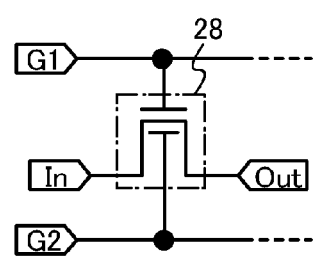
FIG. 14D

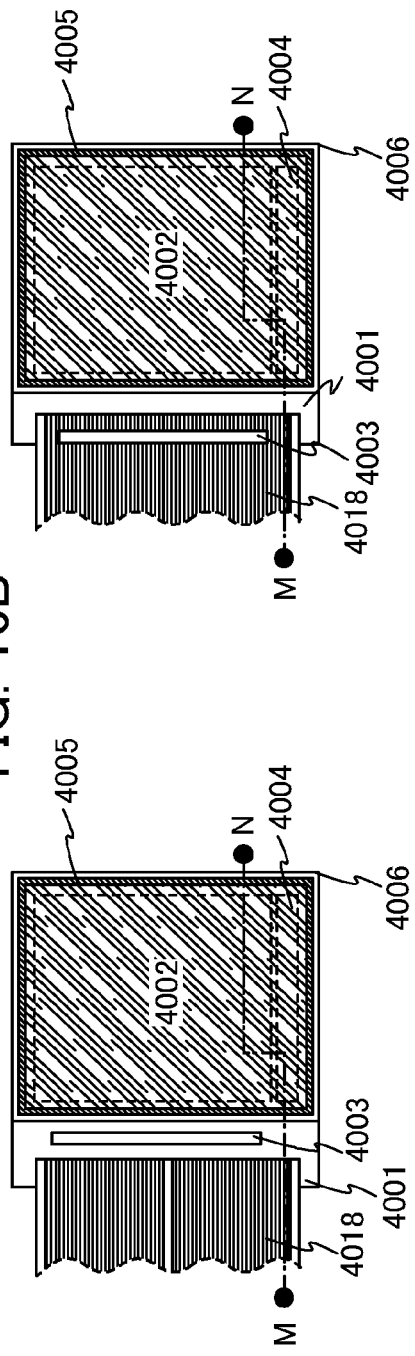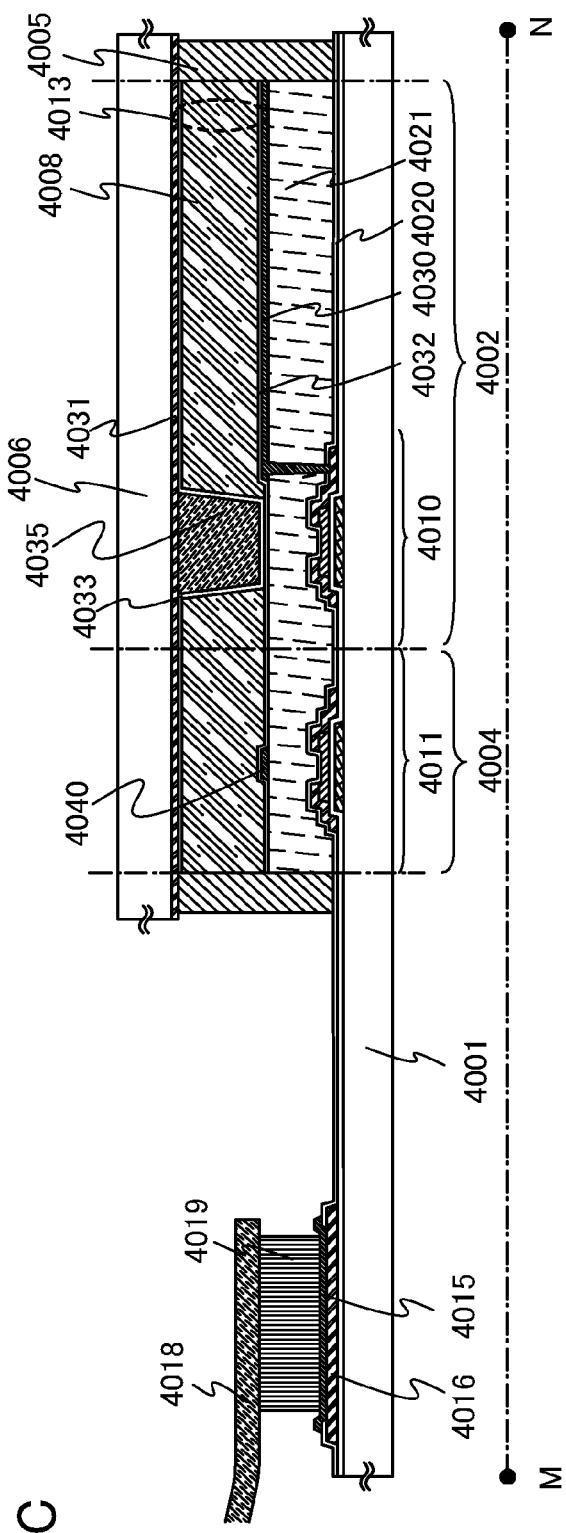

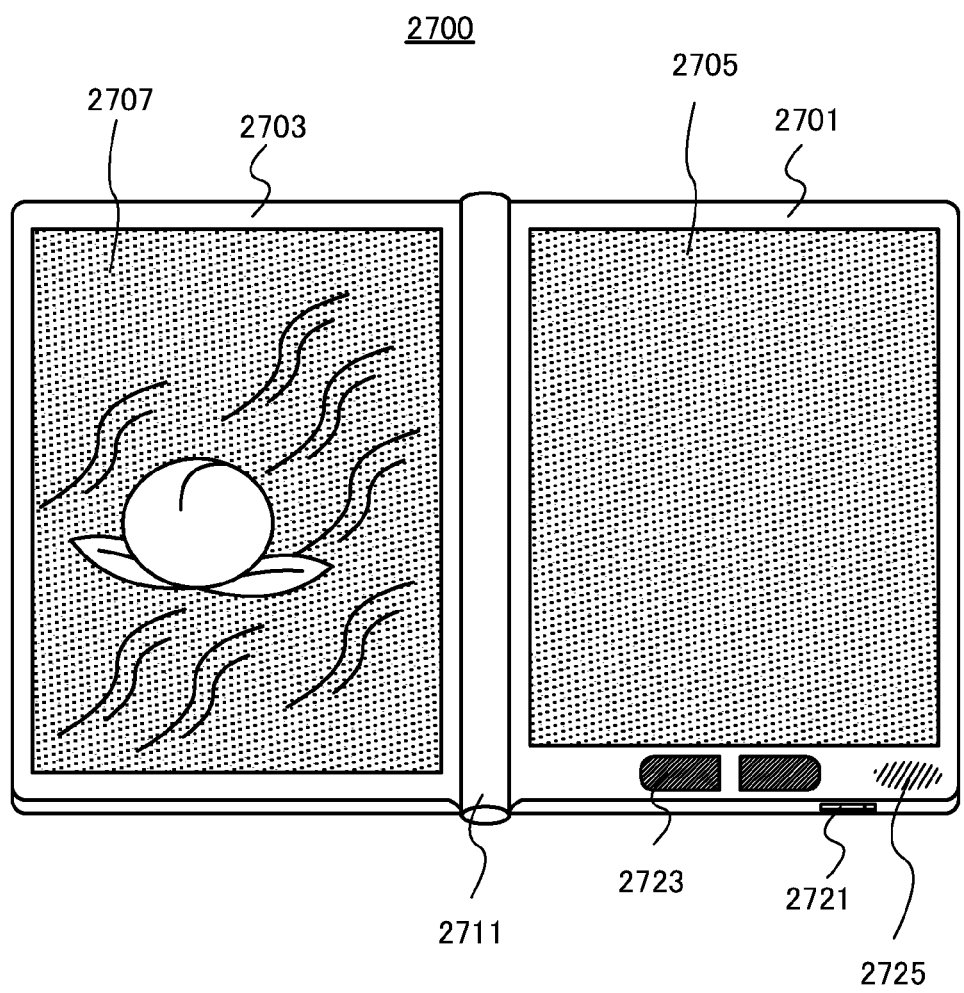

SEMICONDUCTOR DEVICE WHEREIN AN OXIDE SEMICONDUCTOR LAYER COMPRISES A CRYSTAL AND HAS A DEGREE OF CRYSTALLIZATION OF 80% OR MORE

BACKGROUND OF THE INVENTION

1. Field of the Invention

The present invention relates to a semiconductor device including an oxide semiconductor.

In this specification, a semiconductor device means all types of devices which can function by utilizing semiconductor characteristics, and an electro-optical device such as a liquid crystal display device, a semiconductor circuit, and an electronic appliance are all semiconductor devices.

2. Description of the Related Art

In recent years, a technique for forming a thin film transistor (TFT) by using a semiconductor thin film (having a thickness of approximately several nanometers to several hundreds of nanometers) formed over a substrate having an insulating surface has attracted attention. Thin film transistors are applied to a wide range of electronic devices such as integrated circuits (ICs) and electro-optical devices, and thin film transistors that are used as switching elements in image display devices are, in particular, urgently developed. There exists a wide variety of metal oxides and such metal oxides are used for various applications. Indium oxide is a well-known material and is used as a transparent electrode material which is necessary for liquid crystal displays and the like.

Some metal oxides have semiconductor characteristics. Examples of the metal oxides having semiconductor characteristics are tungsten oxide, tin oxide, indium oxide, zinc oxide, and the like. Thin film transistors in which a channel formation region is formed using such a metal oxide having semiconductor characteristics are already known (Patent Document 1 and Patent Document 2).

REFERENCE

Patent Document

[Patent Document 1] Japanese Published Patent Application No. 2007-123861
[Patent Document 2] Japanese Published Patent Application No. 2007-96055

SUMMARY OF THE INVENTION

High-speed operation, a relatively easy manufacturing process, and sufficient reliability are demanded for a thin film transistor including an oxide semiconductor film.

An object is to improve operation characteristics and reliability of a thin film transistor including an oxide semiconductor film.

In particular, higher operation speed of a thin film transistor used in a driver circuit is preferable.

For example, the operation speed becomes higher when the channel length (L) of a thin film transistor is shortened or when the channel width (W) is increased. However, in the case where the channel length (L) is shortened, a problem of switching characteristics such as small on/off ratio arises. Further, there is a problem in that the capacity load increases when the channel width (W) is increased.

Another object is to provide a semiconductor device including a thin film transistor having stable electric characteristics even when the channel length is short.

When a plurality of different circuits is formed over an insulating surface, for example, when a pixel portion and a driver circuit are formed over one substrate, excellent switching characteristics such as a high on-off ratio is needed for a thin film transistor used for the pixel portion, while high operation speed is needed for a thin film transistor used for the driver circuit. In particular, as the definition of a display device is higher, writing time of a displayed image is reduced. Therefore, it is preferable that the thin film transistor used for the driver circuit operate at high speed.

Further, another object is to reduce variation in electric characteristics of the thin film transistor including an oxide semiconductor film.

An embodiment of the present invention is a semiconductor device which includes a driver circuit portion and a display portion (also referred to as a pixel portion) over the same substrate, in which the driver circuit portion and the display portion include thin film transistors, a first wiring (also referred to as a terminal or a connection electrode), and a second wiring (also referred to as a terminal or a connection electrode); in which the thin film transistors each include a gate electrode including metal, a gate insulating film over the gate electrode, an oxide semiconductor layer over the gate insulating film, a source electrode (also referred to as a source electrode layer) and a drain electrode (also referred to as a drain electrode layer) including metal over the oxide semiconductor layer, and a protective insulating layer over the oxide semiconductor layer and the source and drain electrodes; in which the thin film transistor in the driver circuit portion includes a conductive layer in a region overlapping with the oxide semiconductor layer over the protective insulating layer; in which the thin film transistor in the display portion is electrically connected to a pixel electrode (also referred to as a pixel electrode layer); and in which the first wiring is formed using the same material as that of the gate electrode, the second wiring is formed using the same material as that of the source electrode or the drain electrode, and the first wiring and the second wiring in the driver circuit portion are electrically connected to each other through an opening (contact hole) formed in the gate insulating film and the protective insulating layer.

An embodiment of the present invention is a semiconductor device which includes a driver circuit portion and a display portion (also referred to as a pixel portion) over the same substrate, in which the driver circuit portion and the display portion include thin film transistors, a first wiring, and a second wiring; in which the thin film transistors each include a gate electrode including metal, a gate insulating film over the gate electrode, an oxide semiconductor layer over the gate insulating film, a source electrode and a drain electrode including metal over the oxide semiconductor layer, and a protective insulating layer over the oxide semiconductor layer and the source and drain electrodes; in which the thin film transistor in the driver circuit portion includes a conductive layer in a region overlapping with the oxide semiconductor layer over the protective insulating layer; in which the thin film transistor in the display portion is electrically connected to a pixel electrode; and in which the first wiring is formed using the same material as that of the gate electrode, the second wiring is formed using the same material as that of the source electrode or the drain electrode, and the first wiring and the second wiring in the driver circuit portion are electrically connected to each other through an opening formed in the gate insulating film.

As the thin film transistor for the pixel and the thin film transistor for the driver circuit, inverted-staggered thin film transistors having a bottom-gate structure are used. The thin film transistor for the pixel and the thin film transistor for the driver circuit are each a channel-etched thin film transistor in which an oxide insulating film is provided in contact with an oxide semiconductor layer exposed between a source electrode layer and a drain electrode layer.

The thin film transistor for the driver circuit has a structure in which the oxide semiconductor layer is sandwiched between the gate electrode and the conductive layer. With this structure, variation in threshold voltage of the thin film transistor can be reduced; accordingly, a semiconductor device including the thin film transistor with stable electric characteristics can be provided. The conductive layer may have the same potential as the gate electrode layer or may have a floating potential or a fixed potential such as GND potential or 0V. By setting the potential of the conductive layer to an appropriate value, the threshold voltage of the thin film transistor can be controlled.

An embodiment of the present invention for realizing the above structure is a manufacturing method of a semiconductor device which includes the steps of forming first electrodes each functioning as a gate electrode and a first wiring using the same material as that of the first electrodes in a first region in which a driver circuit portion is formed and a second region in which a display portion is formed over the same substrate by a first photolithography step; forming a first insulating film functioning as a gate insulating film over the first electrodes and the first wiring; forming oxide semiconductor layers over the first insulating film by a second photolithography step; performing heat treatment for dehydrating or dehydrogenating the oxide semiconductor layers; forming second electrodes each functioning as a source electrode, third electrodes each functioning as a drain electrode, and a second wiring using the same material as that of the source electrodes or the drain electrodes over the oxide semiconductor layers by a third photolithography step; forming a second insulating film functioning as a protective insulating layer over the second electrodes, the third electrodes, and the oxide semiconductor layers; selectively removing the first insulating film and the second insulating film in a region which overlaps with the first wiring to form a first opening, selectively removing the second insulating film in a region which overlaps with the second wiring to form a second opening, and selectively removing the second insulating film in a region which overlaps with one of the second electrode and the third electrode in the second region to form a third opening by a fourth photolithography step; and forming a first conductive layer which electrically connects the first wiring to the second wiring through the first opening and the second opening, forming a fourth electrode using the same material as that of the first conductive layer in a portion which overlaps with the oxide semiconductor layer with the second insulating film interposed therebetween in the first region, and forming a fifth electrode functioning as a pixel electrode, which is formed using the same material as that of the first conductive layer and electrically connected to a thin film transistor in the second region through the third opening by a fifth photolithography step.

Since the first to third openings can be formed by the same photolithography step, and the pixel electrode, the first conductive layer, and the fourth electrode can be formed by the same photolithography step, the above structure can be realized without increasing the number of photolithography steps.

Through the five-time photolithography steps, a semiconductor device in which the driver circuit portion and the display portion are formed over one substrate can be provided.

An embodiment of the present invention for realizing the above structure is a manufacturing method of a semiconductor device which includes the steps of forming first electrodes each functioning as a gate electrode and a first wiring using the same material as that of the first electrodes in a first region in which a driver circuit portion is formed and a second region in which a display portion is formed over the same substrate by a first photolithography step; forming a first insulating film functioning as a gate insulating film over the first electrodes and the first wiring; forming oxide semiconductor layers over the first insulating film by a second photolithography step; performing heat treatment for dehydrating or dehydrogenating the oxide semiconductor layers; selectively removing the first insulating film over the first wiring by a third photolithography step to form a fourth opening; forming second electrodes each functioning as a source electrode, third electrodes each functioning as a drain electrode, and a second wiring using the same material as that of the second electrodes or the third electrodes over the oxide semiconductor layers by a fourth photolithography step; forming a second insulating film functioning as a protective insulating layer over the second electrodes, the third electrodes, and the oxide semiconductor layers; selectively removing the second insulating film in a region which overlaps with one of the second electrode and the third electrode in the second region to form a third opening by a fifth photolithography step; and forming a fourth electrode in a region which overlaps with the oxide semiconductor layer with the second insulating film interposed therebetween in the first region and forming a fifth electrode functioning as a pixel electrode, which is formed using the same material as that of the fourth electrode and electrically connected to a thin film transistor in the second region through the third opening by a sixth photolithography step.

The formation of the fourth opening by the third photolithography step may be performed before the oxide semiconductor layers are formed by the second photolithography step as long as it is after the formation of the first insulating film.

Since the photolithography step for providing the opening over the first wiring is added after the formation of the oxide semiconductor layers, the number of photolithography steps is increased as compared to the former embodiment, that is, the photolithography step is performed six times in all for forming the driver circuit portion and the display portion over one substrate. However, the height of a step in the opening for connecting the first wiring to the second wiring can be only the thickness of the first insulating film; accordingly, the first wiring and the second wiring can be surely connected to each other with favorable coverage, which increases reliability of the semiconductor device.

Note that in the above-described photolithography steps, an etching step may be performed with the use of a mask layer formed using a multi-tone mask which is a light-exposure mask through which light is transmitted so as to have a plurality of intensities.

Since a mask layer formed with the use of a multi-tone mask has a plurality of film thicknesses and further can be changed in shape by performing etching on the mask layer, the mask layer can be used in a plurality of etching steps for processing into different patterns. Therefore, a mask layer corresponding to at least two kinds or more of different patterns can be formed with one multi-tone mask. Thus, the number of light-exposure masks can be reduced and the number of corresponding photolithography steps can also be reduced, whereby simplification of a process can be realized.

With the above structure, at least one of the above problems can be resolved.

For example, the oxide semiconductor used in this specification is formed into a thin film represented by $InMO_3(ZnO)_m$ (m>0), and a thin film transistor whose oxide semiconductor layer is formed using the thin film is manufactured. Note that M represents one or more metal elements selected from Ga, Fe, Ni, Mn, and Co. As an example, M may be Ga or may include the above metal element in addition to Ga; for example, M may be Ga and Ni or Ga and Fe. Moreover, in the above oxide semiconductor, in some cases, a transition metal element such as Fe or Ni or an oxide of the transition metal is included as an impurity element in addition to a metal element included as M. In this specification, among the oxide semiconductor layers whose composition formulae are represented by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As a metal oxide applied to the oxide semiconductor layer, any of the following metal oxides can be applied besides the above: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon oxide may be included in the oxide semiconductor layer formed using the above metal oxide.

In the case where heat treatment is performed in an atmosphere of an inert gas such as nitrogen or a rare gas (such as argon or helium), the oxide semiconductor layer becomes an oxygen-deficient type so as to be a low-resistance oxide semiconductor layer, that is, an n-type (such as n$^-$-type) oxide semiconductor layer. Then, the oxide semiconductor layer is made in an oxygen-excess state by formation of an oxide insulating film which is in contact with the oxide semiconductor layer and heat treatment after the formation so as to be a high-resistance oxide semiconductor layer, that is, an i-type oxide semiconductor layer. In addition, it can also be said that solid phase oxidation by which the oxide semiconductor layer is made in an oxygen-excess state is performed. Accordingly, it is possible to manufacture and provide a semiconductor device including a highly reliable thin film transistor having favorable electric characteristics.

As dehydration or dehydrogenation, heat treatment is performed in an atmosphere of an inert gas such as nitrogen or a rare gas (such as argon or helium) at higher than or equal to 400° C. and lower than a strain point of the substrate, preferably higher than or equal to 420° C. and lower than or equal to 570° C., so that impurities such as moisture included in the oxide semiconductor layer is reduced. In addition, water ($H_2O$) can be prevented from being contained again in the oxide semiconductor layer later.

The heat treatment for dehydration or dehydrogenation is preferably performed in a nitrogen atmosphere with an $H_2O$ concentration of 20 ppm or lower. Alternatively, the heat treatment may be performed in ultra-dry air with an $H_2O$ concentration of 20 ppm or lower.

The oxide semiconductor layer is subjected to dehydration or dehydrogenation under such a heat treatment condition that two peaks of water or at least one peak of water at around 300° C. is not detected when TDS is performed up to 450° C. on the oxide semiconductor layer subjected to dehydration or dehydrogenation. Therefore, even if TDS is performed up to 450° C. on a thin film transistor including an oxide semiconductor layer subjected to dehydration or dehydrogenation, at least the peak of water at around 300° C. is not detected.

In addition, it is important to prevent water and hydrogen from being contained again in the oxide semiconductor layer by preventing exposure to air with the use of the same furnace that is used for dehydration or dehydrogenation of the oxide semiconductor layer at the time when the temperature is lowered after performing the dehydration or dehydrogenation at heating temperature T. When a thin film transistor is formed using an oxide semiconductor layer obtained by changing an oxide semiconductor layer into a low-resistance oxide semiconductor layer, that is, an n-type (such as n$^-$-type) oxide semiconductor layer by dehydration or dehydrogenation and then by changing the low-resistance oxide semiconductor layer into a high-resistance oxide semiconductor layer so as to be an i-type oxide semiconductor layer, the threshold voltage ($V_{th}$) of the thin film transistor can be positive, so that a so-called normally-off switching element can be realized. It is desirable for a semiconductor device (a display device) that a channel be formed with gate threshold voltage that is a positive value and as close to 0 V as possible. If the threshold voltage of the thin film transistor is negative, it tends to be normally on; in other words, current flows between the source electrode and the drain electrode even when the gate voltage is 0 V. In an active matrix display device, electric characteristics of thin film transistors included in a circuit are important and performance of the display device depends on the electric characteristics. Among the electric characteristics of thin film transistors, in particular, threshold voltage is important. When the threshold voltage value is high or is on the minus side although the field effect mobility is high, it is difficult to control the circuit. When a thin film transistor has a large absolute value of the threshold voltage, the thin film transistor cannot perform the switching function as a TFT and may be a load when the transistor is driven at low voltage. In the case of an n-channel thin film transistor, it is preferable that after application of the positive voltage as gate voltage, a channel be formed and drain current begin to flow. A transistor in which a channel is not formed unless the driving voltage is increased and a transistor in which a channel is formed and drain current flows even in the case of the negative voltage state are unsuitable for a thin film transistor used in a circuit.

In addition, a gas atmosphere in which the temperature is lowered from the heating temperature T may be switched to a gas atmosphere which is different from the gas atmosphere in which the temperature is raised to the heating temperature T. For example, cooling is performed by using the furnace in which dehydration or dehydrogenation is performed and by filling the furnace with a high-purity oxygen gas, a high-purity $N_2O$ gas, or ultra-dry air (having a dew point of −40° C. or lower, preferably −60° C. or lower) without exposure to air.

Electric characteristics of a thin film transistor are improved using an oxide semiconductor film cooled slowly (or cooled) in an atmosphere which does not include moisture (having a dew point of −40° C. or lower, preferably −60° C. or lower) after moisture which is included in the film is reduced by heat treatment for dehydration or dehydrogenation, and a high-performance thin film transistor which can be mass-produced is realized.

In this specification, heat treatment in an atmosphere of an inert gas such as nitrogen or a rare gas (such as argon or helium) is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

In the case where heat treatment is performed in an atmosphere of an inert gas such as nitrogen or a rare gas (such as argon or helium), the oxide semiconductor layer becomes an oxygen-deficient type by the heat treatment so as to be a low-resistance oxide semiconductor layer, that is, an n-type (such as n⁻-type) oxide semiconductor layer.

Further, a region overlapping with the drain electrode layer is formed as a high-resistance drain region (also referred to as an HRD region) which is an oxygen-deficient region. In addition, a region overlapping with the source electrode layer is formed as a high-resistance source region (also referred to as an HRS region) which is an oxygen-deficient region.

Specifically, the carrier concentration of the high-resistance drain region is higher than or equal to $1\times10^{18}/cm^3$ and is at least higher than the carrier concentration of a channel formation region (lower than $1\times10^{18}/cm^3$). Note that the carrier concentration in this specification is a carrier concentration obtained by Hall effect measurement at room temperature.

Then, the channel formation region is formed by placing at least part of the dehydrated or dehydrogenated oxide semiconductor layer in an oxygen-excess state so as to be a high-resistance oxide semiconductor layer, that is, an i-type oxide semiconductor layer. Note that as the treatment for placing the dehydrated or dehydrogenated oxide semiconductor layer in an oxygen-excess state, the following treatment is given, for example: deposition of an oxide insulating film which is in contact with the dehydrated or dehydrogenated oxide semiconductor layer by a sputtering method; heat treatment after forming the oxide insulating film or heat treatment in an atmosphere including oxygen, or cooling treatment in an oxygen atmosphere or ultra-dry air (having a dew point of −40° C. or lower, preferably −60° C. or lower) after heat treatment in an inert gas atmosphere, after the deposition of the oxide insulating film; or the like.

In order to form a channel formation region in at least a part (a portion which overlaps with the gate electrode layer) of the dehydrated or dehydrogenated oxide semiconductor layer, the oxide semiconductor layer may be selectively made in an oxygen-excess state; thus, the resistance in the oxygen-excess region can be increased; that is, the region can have an i-type conductivity. A source electrode layer and a drain electrode layer which are metal electrodes of Ti or the like are formed over and in contact with the dehydrated or dehydrogenated oxide semiconductor layer, and an exposed region which overlaps with neither the source electrode layer nor the drain electrode layer may be selectively made in an oxygen-excess state, so that a channel formation region can be formed. In the case where the oxide semiconductor layer is selectively made in an oxygen-excess state, a first high-resistance source region which overlaps with the source electrode layer and a second high-resistance drain region which overlaps with the drain electrode layer are formed, and a channel formation region is formed between the first high-resistance source region and the second high-resistance drain region. In other words, the channel formation region is formed between the source electrode layer and the drain electrode layer in a self-aligned manner.

Accordingly, it is possible to manufacture and provide a semiconductor device including a highly reliable thin film transistor having favorable electric characteristics.

Note that by forming the high-resistance drain region in the oxide semiconductor layer overlapping with the drain electrode layer, the reliability when a driver circuit is formed can be improved. Specifically, by forming the high-resistance drain region, a structure can be obtained in which conductivity can be varied from the drain electrode layer to the high-resistance drain region and the channel formation region. Therefore, in the case where the thin film transistor operates with the drain electrode layer connected to a wiring for supplying a high power supply potential VDD, the high-resistance drain region serves as a buffer and a high electric field is not applied locally even if a high electric field is applied between the gate electrode layer and the drain electrode layer, so that the withstand voltage of the thin film transistor can be improved.

In addition, the high-resistance drain region and the high-resistance source region are formed in the oxide semiconductor layer overlapping with the drain electrode layer and the source electrode layer, so that reduction in leakage current can be achieved in the channel formation region in forming the driver circuit. In particular, when the high-resistance drain region is formed, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In this case, in the channel formation region, leakage current flowing from the high-resistance drain region on the drain electrode layer side to the channel formation region can be concentrated on the vicinity of an interface between the channel formation region and a gate insulating layer which has high resistance when the transistor is off. Thus, the amount of leakage current in a back channel portion (part of a surface of the channel formation region which is apart from the gate electrode layer) can be reduced.

Further, the high-resistance source region which overlaps with the source electrode layer and the high-resistance drain region which overlaps with the drain electrode layer overlap with each other with part of the gate electrode layer and the gate insulating layer interposed therebetween, depending on the width of the gate electrode layer, and the intensity of an electric field in the vicinity of an end portion of the drain electrode layer can be reduced more effectively.

Further, an oxide conductive layer may be formed between the oxide semiconductor layer and the source and drain electrodes. The oxide conductive layer preferably contains zinc oxide as a component and preferably does not contain indium oxide. For example, zinc oxide, zinc aluminum oxide, zinc aluminum oxynitride, gallium zinc oxide, or the like can be used. The oxide conductive layer also functions as a low-resistance drain (LRD, also referred to as an LRN (low-resistance n-type conductivity)) region. Specifically, the carrier concentration of the low-resistance drain region is higher than that of the high-resistance drain region (the HRD region) and preferably in a range of $1\times10^{20}/cm^3$ or higher and $1\times10^{21}/cm^3$ or lower. Provision of the oxide conductive layer between the oxide semiconductor layer and the source and drain electrodes can reduce contact resistance between the electrodes and the oxide semiconductor layer and realizes higher speed operation of the transistor. Accordingly, frequency characteristics of a peripheral circuit (a driver circuit) can be improved.

The oxide conductive layer and a metal layer for forming the source and drain electrodes can be formed in succession.

Further, the above-described first wiring and the second wiring may be formed using a wiring that is formed by stacking a metal material and the same material as that of the oxide conductive layer functioning as an LRN region or an LRD region. By stacking the metal and the oxide conductive layer, coverage at the step such as an overlapping portion of wirings or an opening can be improved; thus, wiring resistance can be lowered. Furthermore, effects of preventing local increase in resistance of wiring due to migration or the like and preventing disconnection of a wiring can be expected; accordingly, a highly reliable semiconductor device can be provided.

Regarding the above-described connection between the first wiring and the second wiring, when the oxide conductive layer is sandwiched therebetween, it is expected to prevent increase in contact resistance which is caused by formation of an insulating oxide on a metal surface in the connection portion (contact portion); accordingly, a highly reliable semiconductor device can be provided.

Since a thin film transistor is easily broken due to static electricity or the like, a protective circuit for protecting the thin film transistor for the pixel portion is preferably provided over the same substrate for a gate line or a source line. The protective circuit is preferably formed using a non-linear element including an oxide semiconductor layer.

Note that ordinal numbers such as "first" and "second" in this specification are used for convenience. Therefore, they do not denote the order of steps, the stacking order of layers, and particular names which specify the invention.

A semiconductor device including a thin film transistor which uses an oxide semiconductor layer and has excellent electric characteristics and high reliability can be realized.

BRIEF DESCRIPTION OF THE DRAWINGS

In the accompanying drawing:

FIGS. 14A to 14D are circuit diagrams showing a configuration of a shift register;
FIGS. 16A to 16C illustrate semiconductor devices;
FIG. 18 is an external view of an example of an e-book reader.

DETAILED DESCRIPTION OF THE INVENTION

Figure 1:
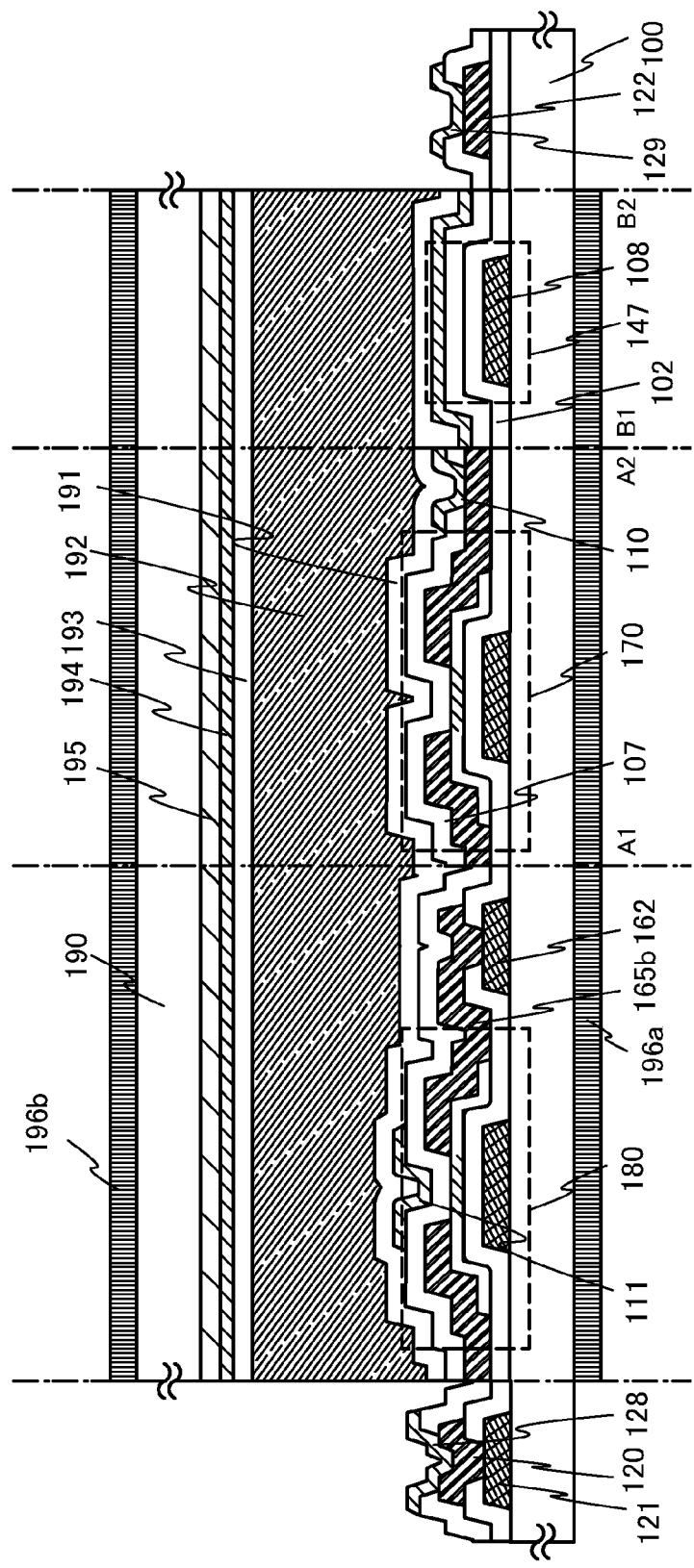
FIG. 1 illustrates a semiconductor device.

Embodiments are described in detail with reference to drawings. The present invention is not limited to the following description, and it is easily understood by those skilled in the art that modes and details of the present invention can be changed in various ways without departing from the spirit and scope of the present invention. Therefore, the present invention is not construed as being limited to description of the embodiments below. Note that in the structures described below, the same portions or portions having similar functions are denoted by the same reference numerals through different drawings, and description of such portions is not repeated.

Embodiment 1

A manufacturing process of a semiconductor device including a thin film transistor will be described with reference to FIG. 1, FIGS. 2A to 2C, FIGS. 3A to 3C, FIGS. 4A to 4C, and FIG. 5.

A liquid crystal display device as a semiconductor device which is one embodiment of the present invention is illustrated in FIG. 1. In the liquid crystal display device in FIG. 1, a substrate 100 which is provided with a pixel portion including a thin film transistor 170 and a capacitor 147, a driver circuit portion including a thin film transistor 180, a pixel electrode layer 110, and an insulating layer 191 serving as an alignment film, and a counter substrate 190 which is provided with an insulating layer 193 serving as an alignment film, a counter electrode layer 194, and a coloring layer 195 serving as a color filter face each other with a liquid crystal layer 192 positioned between the substrates. The substrate 100 is provided with a polarizing plate (a layer including a polarizer, also simply referred to as a polarizer) 196a on the side opposite to the liquid crystal layer 192, and the counter substrate 190 is provided with a polarizing plate 196b on the side opposite to the liquid crystal layer 192. A first terminal 121, a connection electrode 120, and a terminal electrode 128 for connection are provided in a terminal portion for a gate wiring, and a second terminal 122 and a terminal electrode 129 for connection are provided in a terminal portion for a source wiring.

In the thin film transistor 180 of the driver circuit portion, a conductive layer 111 is provided over a gate electrode layer and a semiconductor layer, and a drain electrode layer 165b is electrically connected to a conductive layer 162 which is formed in the same step as the gate electrode layer. In the pixel portion, a drain electrode layer of the thin film transistor 170 is electrically connected to the pixel electrode layer 110.

Hereinafter, a manufacturing method will be described with reference to FIGS. 2A to 2C, FIGS. 3A to 3C, FIGS. 4A to 4C, FIG. 5, and FIGS. 11A to 11D. FIG. 5 is a plan view of the pixel portion of the liquid crystal display device, and FIG. 1, FIGS. 2A to 2C, FIGS. 3A to 3C, and FIGS. 4A to 4C correspond to cross-sectional views taken along lines A1-A2 and B1-B2 of FIG. 5.

Figure 2:
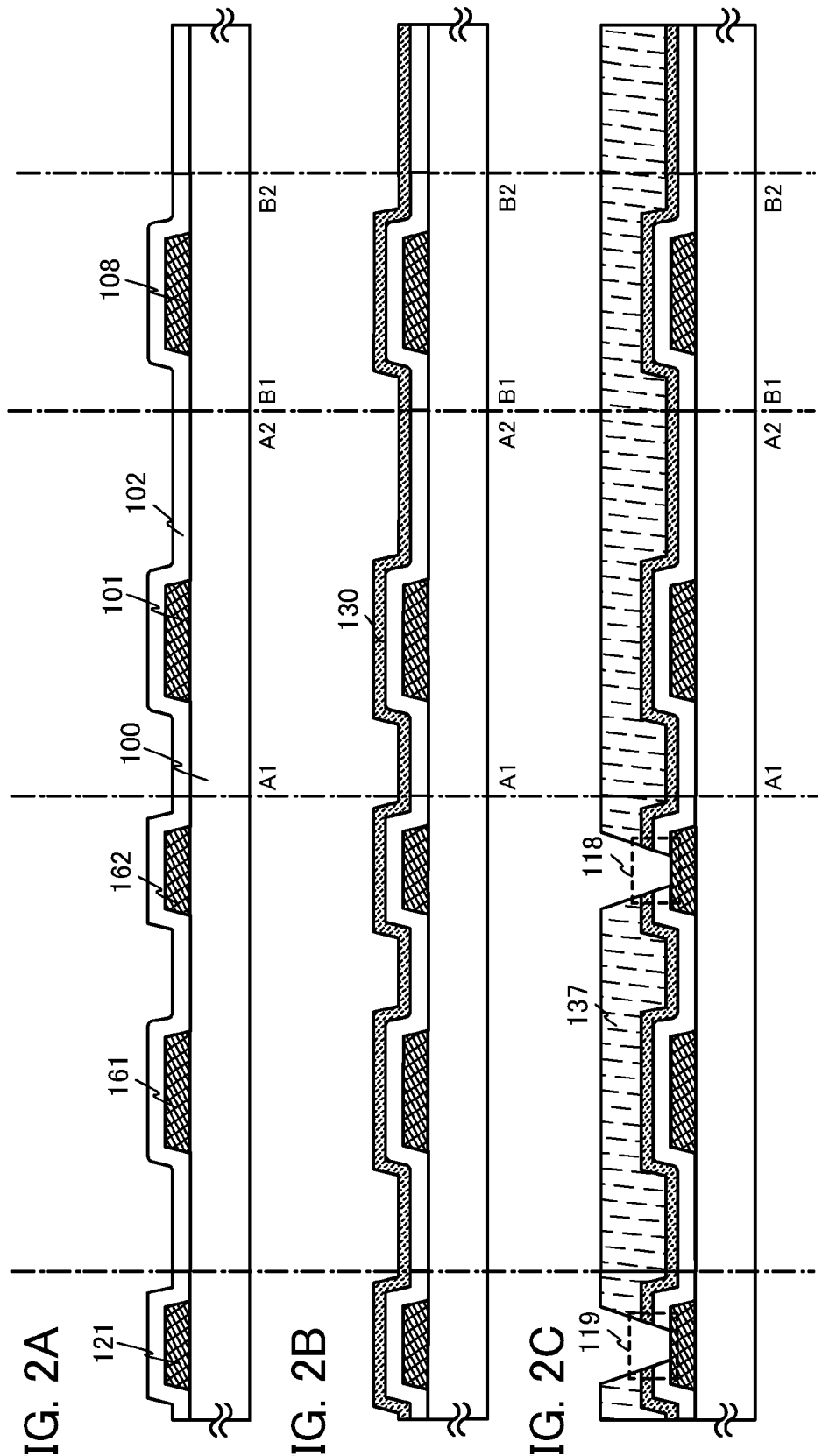
FIGS. 2A to 2C illustrate a manufacturing method of a semiconductor device.

A conductive layer is formed over the entire surface of the substrate 100 having an insulating surface. A resist mask is formed over the conductive layer by performing a first photolithography step, and then unnecessary portions are removed by etching, so that wirings and electrodes (a gate electrode layer 101, a gate electrode layer 161, the conductive layer 162, a capacitor wiring (also referred to as a capacitor wiring layer) 108, and the first terminal 121) are formed. Etching is preferably performed so that end portions of the wirings and electrodes have tapered shapes as illustrated in FIG. 2A, because coverage with a film stacked thereover can be improved. Note that the gate electrode layer 101 and the gate electrode layer 161 are included in the gate wiring.

Although there is no particular limitation on a substrate that can be used as the substrate 100 having an insulating surface, it is necessary that the substrate 100 having an insulating surface have at least enough heat resistance to heat treatment to be performed later. A glass substrate can be used as the substrate 100 having an insulating surface.

As the glass substrate, the one whose strain point is 730° C. or higher may be used in the case where the temperature of the heat treatment to be performed later is high. As a material of the glass substrate, a glass material such as aluminosilicate glass, aluminoborosilicate glass, or barium borosilicate glass is used. Note that in the case where a larger amount of barium oxide (BaO) than boric acid is contained, a glass substrate is heat-resistant and of more practical use. Therefore, it is preferable that a glass substrate containing more BaO than $B_2O_3$ be used.

Note that a substrate formed of an insulator such as a ceramic substrate, a quartz substrate, or a sapphire substrate may be used instead of the above glass substrate. Alternatively, crystallized glass or the like may be used. Since the liquid crystal display device described in this embodiment is a transmissive liquid crystal display device, a light-transmitting substrate is used as the substrate 100; however, in the case where a reflective liquid crystal display device is formed, a non-light-transmitting substrate such as a metal substrate may be used as the substrate 100.

An insulating film serving as a base film may be provided between the substrate 100, and the gate electrode layer 101, the gate electrode layer 161, the conductive layer 162, the capacitor wiring 108, and the first terminal 121. The base film has a function of preventing diffusion of an impurity element from the substrate 100, and can be formed to have a single-layer structure or a stacked-layer structure of a silicon nitride film, a silicon oxide film, a silicon nitride oxide film, or a silicon oxynitride film.

The gate electrode layer 101, the gate electrode layer 161, the conductive layer 162, the capacitor wiring 108, and the first terminal 121 can be formed to have a single-layer structure or a stacked-layer structure using a metal material such as molybdenum, titanium, chromium, tantalum, tungsten, aluminum, copper, neodymium, or scandium or an alloy material containing any of these materials as its main component.

For example, as a two-layer structure of the gate electrode layer 101, the gate electrode layer 161, the conductive layer 162, the capacitor wiring 108, and the first terminal 121, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. Alternatively, a three-layer structure in which a tungsten layer or a tungsten nitride layer, an aluminum-silicon alloy layer or an aluminum-titanium alloy layer, and a titanium nitride layer or a titanium layer are stacked is preferable.

Next, a gate insulating layer 102 is formed over the gate electrode layer 101, the gate electrode layer 161, the conductive layer 162, the capacitor wiring 108, and the first terminal 121 (see FIG. 2A).

The gate insulating layer 102 can be formed to have a single-layer structure or a stacked-layer structure of a silicon oxide layer, a silicon nitride layer, a silicon oxynitride layer, a silicon nitride oxide layer, or an aluminum oxide layer by a plasma CVD method, a sputtering method, or the like. For example, a silicon oxynitride layer may be formed by a plasma CVD method using $SiH_4$, oxygen, and nitrogen as a film formation gas. The thickness of the gate insulating layer 102 is set to greater than or equal to 100 nm and less than or equal to 500 nm. In the case where the gate insulating layer 102 has a stacked-layer structure, stacked layers including a first gate insulating layer having a thickness of greater than or equal to 50 nm and less than or equal to 200 nm and a second gate insulating layer having a thickness of greater than or equal to 5 nm and less than or equal to 300 nm over the first gate insulating layer are employed.

In this embodiment, a silicon nitride layer having a thickness of 200 nm or less is formed by a plasma CVD method as the gate insulating layer 102.

Next, an oxide semiconductor film 130 having a thickness of greater than or equal to 2 nm and less than or equal to 200 nm is formed over the gate insulating layer 102 (see FIG. 2B).

Note that before the oxide semiconductor film is formed by a sputtering method, dust on a surface of the gate insulating layer 102 is preferably removed by reverse sputtering in which an argon gas is introduced and plasma is generated. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

In order that the oxide semiconductor film 130 may be amorphous even through heat treatment for dehydration or dehydrogenation after formation of the oxide semiconductor film 130, the oxide semiconductor film 130 preferably has a small thickness of 50 nm or less. When the oxide semiconductor film is formed to have a small thickness, crystallization of an oxide semiconductor layer can be suppressed even through heat treatment which is performed after formation of the oxide semiconductor layer.

The oxide semiconductor film 130 is formed using an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, an In—Ga—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 130 is formed by a sputtering method with the use of an In—Ga—Zn—O-based oxide semiconductor target. Further, the oxide semiconductor film 130 can be formed by a sputtering method in a rare gas (typically argon) atmosphere, an oxygen atmosphere, or an atmosphere of a rare gas (typically argon) and oxygen. In the case of using a sputtering method, it is preferable that deposition is performed with the use of a target containing $SiO_2$ at greater than or equal to 2 wt % and less than or equal to 10 wt %, so that $SiO_x$ (x>0) which hinders crystallization is contained in the oxide semiconductor film 130; in this way, the oxide semiconductor film 130 can be prevented from being crystallized in heat treatment for dehydration or dehydrogenation performed later.

Here, the oxide semiconductor film is formed in an atmosphere of argon and oxygen (argon:oxygen=30 sccm:20 sccm and the oxygen flow ratio is 40%), with the use of an oxide semiconductor target containing In, Ga, and Zn ($In_2O_3$:$Ga_2O_3$:ZnO=1:1:1 [molar ratio] and In:Ga:Zn=1:1:0.5 [atomic ratio]), under conditions as follows: the distance between the substrate and the target is 100 mm; the pressure is 0.2 Pa; and the direct current (DC) power source is 0.5 kW. Note that a pulse direct current (DC) power source is preferable because dust can be reduced and the film thickness can be uniform. The In—Ga—Zn—O-based non-single-crystal film is formed to a thickness of 5 nm to 200 nm. In this embodiment, as the oxide semiconductor film, a 20-nm-thick In—Ga—Zn—O-based non-single-crystal film is formed by a sputtering method with the use of an In—Ga—Zn—O-based oxide semiconductor target.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, and films of plural kinds of materials can be deposited by electric discharge at the same time in the same chamber.

In addition, there are also a sputtering apparatus provided with a magnet system inside the chamber and used for a magnetron sputtering method, and a sputtering apparatus used for an ECR sputtering method in which plasma generated with the use of microwaves is used without using glow discharge.

In addition, as a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

Next, a resist mask 137 is formed over the oxide semiconductor film 130 by performing a second photolithography step. And then unnecessary portions of the oxide semiconductor film 130 and the gate insulating layer 102 are removed by etching to form a contact hole 119 reaching the first terminal 121 and a contact hole 118 reaching the conductive layer 162 in the gate insulating layer 102 (see FIG. 2C).

When the contact holes are formed in the gate insulating layer 102 in the state where the oxide semiconductor film 130 is stacked over the entire surface of the gate insulating layer 102 in such a manner, the resist mask is not directly in contact with the surface of the gate insulating layer 102; accordingly, contamination of the surface of the gate insulating layer 102 (e.g., attachment of impurities or the like to the gate insulating layer 102) can be prevented. Thus, a favorable state of the interface between the gate insulating layer 102 and the oxide semiconductor film 130 can be obtained, thereby improving reliability.

Alternatively, a resist pattern may be directly formed on the gate insulating layer, and then the contact holes may be formed. In such a case, heat treatment is preferably performed after removing the resist, to dehydrate, dehydrogenate, or dehydroxylate the surface of the gate insulating film. For example, impurities such as hydrogen and water included in the gate insulating layer may be removed by heat treatment (at higher than or equal to 400° C. and less than the strain point of the substrate) under an inert gas (nitrogen, helium, neon, or argon) atmosphere or an oxygen atmosphere.

Figure 3:
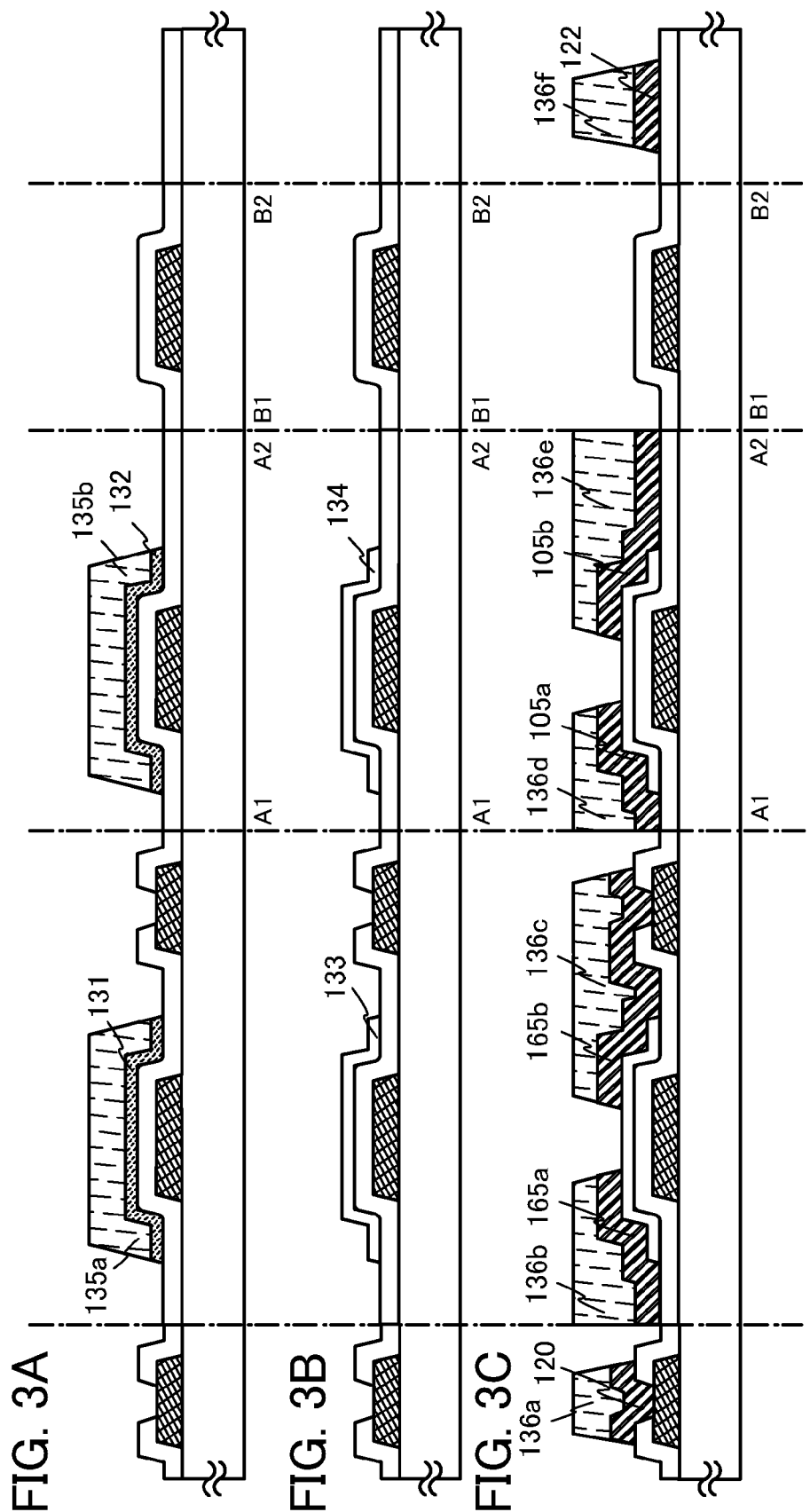
FIGS. 3A to 3C illustrate a manufacturing method of a semiconductor device.

Next, the resist mask 137 is removed, and the oxide semiconductor film 130 is etched with the use of resist masks 135a and 135b formed in a third photolithography step, so that island-shaped oxide semiconductor layers 131 and 132 are formed (see FIG. 3A). Further, the resist masks 135a and 135b used for forming the island-shaped oxide semiconductor layers may be formed by an ink-jet method. When the resist masks are formed by an ink-jet method, the photomask is unnecessary; accordingly, the manufacturing cost can be reduced.

Next, dehydration or dehydrogenation is performed on the oxide semiconductor layers 131 and 132, so that dehydrated or dehydrogenated oxide semiconductor layers 133 and 134 are formed (see FIG. 3B). The temperature of first heat treatment in which dehydration or dehydrogenation is performed is higher than or equal to 400° C. and lower than the strain point of the substrate, preferably 425° C. or higher. Note that in the case where the temperature of the first heat treatment is 425° C. or higher, the heat treatment time may be one hour or less; while in the case where the temperature of the first heat treatment is lower than 425° C., the heat treatment time is set to more than one hour. Here, the substrate is introduced into an electric furnace which is one example of a heat treatment apparatus, and the oxide semiconductor layers are subjected to heat treatment under a nitrogen atmosphere. Then, the oxide semiconductor layers are not exposed to air, and water and hydrogen can be prevented from being contained again in the oxide semiconductor layers. In this manner, the oxide semiconductor layers are formed. In this embodiment, slow cooling is performed from a heating temperature T at which the dehydration or dehydrogenation is performed on the oxide semiconductor layers to such a temperature that water is not contained again, specifically, to a temperature that is lower than the heating temperature T by 100° C. or more, with use of the same electric furnace under a nitrogen atmosphere. The dehydration or dehydrogenation may be performed under a rare gas (e.g., helium, neon, or argon) atmosphere without limitation to a nitrogen atmosphere.

When the oxide semiconductor layers are subjected to heat treatment at 400° C. to 700° C., the dehydration or dehydrogenation of the oxide semiconductor layers can be achieved; thus, water ($H_2O$) can be prevented from being contained again in the oxide semiconductor layers later.

An example of a mechanism of water elimination in an oxide semiconductor film was analyzed along the reaction pathway below (reaction caused by not only water but also OH or H in the oxide semiconductor film). Note that as the oxide semiconductor film, an In—Ga—Zn—O-based amorphous film was used.

In addition, the optimal molecular structure of the simulation model in the ground state was calculated using the density functional theory (DFT). In the DFT, the total energy is represented as the sum of potential energy, electrostatic energy between electrons, electron kinetic energy, and exchange-correlation energy including all the complicated interactions between electrons. Also in the DFT, an exchange-correlation interaction is approximated by a functional (that is, a function of another function) of one electron potential represented in terms of electron density to enable high-speed and highly-accurate calculations. Here, B3LYP which is a hybrid functional was used to specify the weight of each parameter related to exchange-correlation energy. In addition, as a basis function, LanL2DZ (a basis function in which a split valence basis is added to the effective core potential of the Ne shell) was applied to indium atoms, gallium atoms, and zinc atoms, and 6-311 (a basis function of a triple-split valence basis set using three contraction functions for each valence orbital) was applied to the other atoms. By the above basis functions, for example, orbits of 1s to 3s are considered in the case of hydrogen atoms while orbits of is to 4s and 2p to 4p are considered in the case of oxygen atoms. Furthermore, to improve calculation accuracy, the p function and the d function as polarization basis sets were added to hydrogen atoms and oxygen atoms, respectively.

Note that Gaussian 03 was used as a quantum chemistry computational program. A high performance computer (Altix 4700, manufactured by SGI) was used for the calculation.

Figure 39:
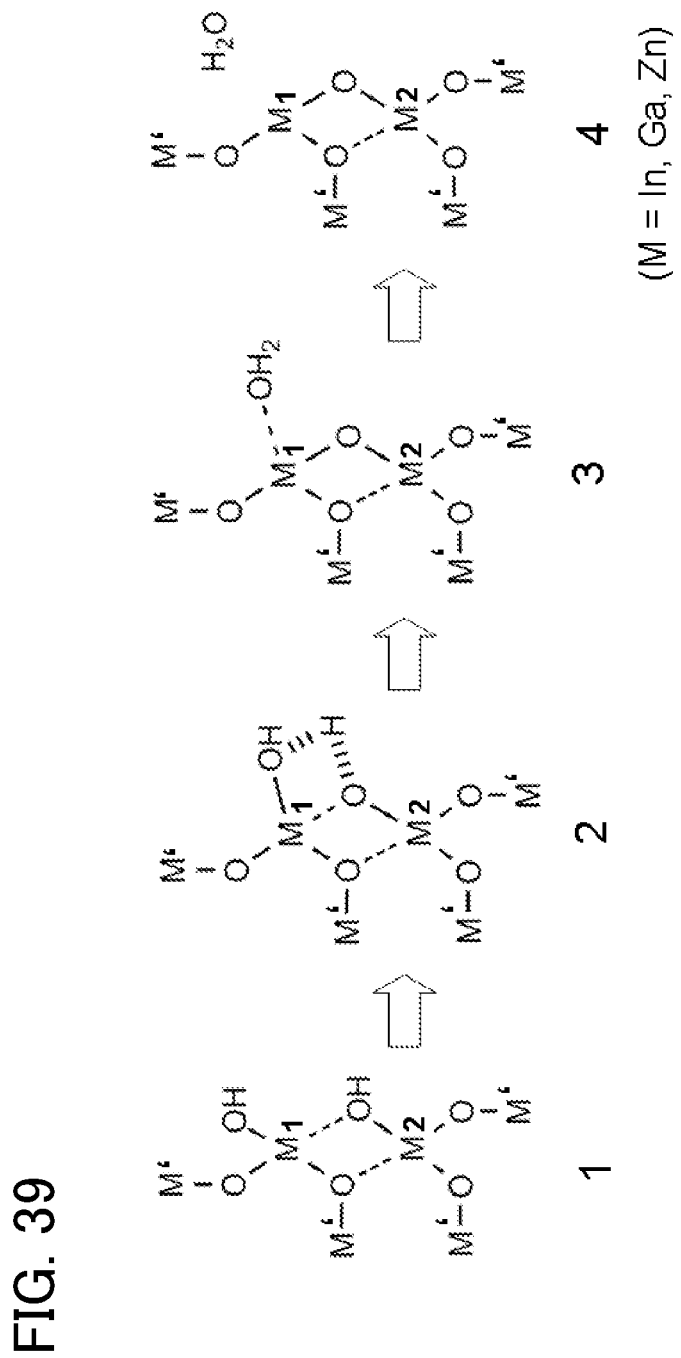
FIG. 39 shows a calculation result of a mechanism of generation and elimination of water.

It is thought that heat treatment for dehydration or dehydrogenation causes —OH groups included in the oxide semiconductor film to react with each other and thus to generate $H_2O$. Therefore, the mechanism of generation and elimination of water was analyzed as shown in FIG. 39. Note that since Zn is divalent, in the case where $M_1$ and/or $M_2$ is/are Zn in FIG. 39, one M'-O bond bonded to Zn is deleted for each or both of $M_1$ and $M_2$ in FIG. 39.

In FIG. 39, M represents a metal atom and is any of three kinds: In, Ga, and Zn. At the starting state 1, —OH forms a coordinate bond to cross-link $M_1$ to $M_2$. At the transition state 2, H of the —OH is dislocated to the other —OH. At the intermediate state 3, the generated $H_2O$ molecule forms a coordinate bond with the metal atom. At the end state 4, the $H_2O$ molecule is eliminated and moves away to infinity.

There are six combinations of ($M_1$-$M_2$): 1; In—In, 2; Ga—Ga, 3; Zn—Zn, 4; In—Ga, 5; In—Zn, and 6; Ga—Zn. Simulation was performed for all the combinations. In this simulation, cluster computing was employed using a calculation model in which M' is replaced with H for simplifying the calculation.

In the simulation, the energy diagram corresponding to the reaction pathway in FIG. 39 was obtained. Of all the six combinations of ($M_1$-$M_2$), a simulation result of the case 1 (In—In) is shown in FIG. 40.

Figure 40:
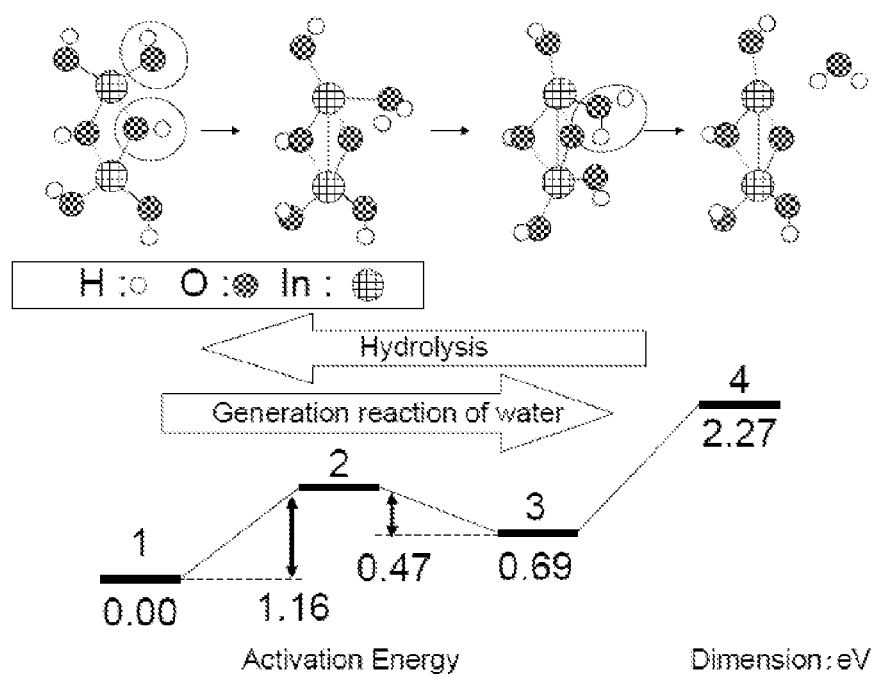
FIG. 40 shows a calculation result of an energy diagram.

From FIG. 40, the activation energy for generating water was found to be 1.16 eV. Due to elimination of the generated water molecule, the end state 4 is less stable by 1.58 eV than the intermediate state 3.

When looking at FIG. 40 in the opposite direction as a reaction from the right to the left, the reaction can be perceived as a reaction in which water enters the oxide semiconductor film. In this case, the activation energy at the time when water coordinated to the metal is hydrolyzed to produce two OH groups is 0.47 eV.

Similarly, the reaction pathways for the other combinations (M1-M2) were analyzed. The activation energies (Ea [eV]) in the generation reaction of water in the cases 1 to 6 are shown in Table 1.

TABLE 1

|  | 1 | 2 | 3 | 4 | 5 | 6 |
|---|---|---|---|---|---|---|
| $M_1$-$M_2$ | In—In | Ga—Ga | Zn—Zn | In—Ga | In—Zn | Ga—Zn |
| Ea | 1.16 | 1.25 | 2.01 | 1.14 | 1.35 | 1.4 |

It can be noticed from Table 1 that the generation reaction of water is more likely to be caused in the cases 1 (In—In) and 4 (In—Ga). On the contrary, the generation reaction of water is less likely to be caused in the case 3 (Zn—Zn). Accordingly, it can be assumed that the generation reaction of water using Zn atoms is less likely to be caused.

The heat treatment apparatus is not limited to the electric furnace, and for example may be an RTA (rapid thermal annealing) apparatus such as a GRTA (gas rapid thermal annealing) apparatus or an LRTA (lamp rapid thermal annealing) apparatus. An LRTA apparatus is an apparatus for heating a process object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. Further, the LRTA apparatus may have not only a lamp but also a device for heating a process object by heat conduction or heat radiation from a heating element such as a resistance heating element. GRTA is a method of heat treatment using a high-temperature gas. As the gas, an inert gas which does not react with a process object by heat treatment, such as nitrogen or a rare gas such as argon is used. The heat treatment may be performed at 600° C. to 750° C. for several minutes using an RTA method.

Note that in the first heat treatment, it is preferable that water, hydrogen, and the like be not contained in nitrogen or a rare gas such as helium, neon, or argon. In particular, the heat treatment which is performed on the oxide semiconductor layers for dehydration or dehydrogenation at 400° C. to 700° C. is preferably performed in a nitrogen atmosphere in which the concentration of $H_2O$ is 20 ppm or lower. Alternatively, it is preferable that nitrogen or a rare gas such as helium, neon, or argon introduced into an apparatus for heat treatment have a purity of 6N (99.9999%) or more, more preferably, 7N (99.99999%) or more; that is, an impurity concentration is preferably set to 1 ppm or lower, more preferably, 0.1 ppm or lower.

Depending on conditions of the first heat treatment and the material of the oxide semiconductor layers, the oxide semiconductor layers may crystallize to be microcrystalline or polycrystalline. For example, the oxide semiconductor layers may crystallize to become microcrystalline semiconductor layers having a degree of crystallization of 90% or more, or 80% or more. Further, depending on the conditions of the first heat treatment and the material of the oxide semiconductor layers, the oxide semiconductor layers may be amorphous oxide semiconductor containing no crystalline component.

Alternatively, the first heat treatment may be performed on the oxide semiconductor film 130 before being processed into the island-shaped oxide semiconductor layers 131 and 132, instead of on the island-shaped oxide semiconductor layers 131 and 132. In that case, after the first heat treatment, the substrate is taken out of the heating apparatus and a photolithography step is performed.

The heat treatment for dehydration or dehydrogenation of the oxide semiconductor layers may be performed at any of the following timings: after the oxide semiconductor layers are formed; after a source electrode and a drain electrode are formed over the oxide semiconductor layer; and after a passivation film is formed over the source electrode and the drain electrode.

Further, the step of forming the contact holes 118 and 119 in the gate insulating layer 102 as illustrated in FIG. 2C may be performed after the dehydration or dehydrogenation treatment on the oxide semiconductor film 130.

Note that the etching of the oxide semiconductor film may be dry etching, without limitation to wet etching.

As an etching gas used for dry etching, a gas containing chlorine (a chlorine-based gas such as chlorine ($Cl_2$), triboron chloride ($BCl_3$), tetrasilicon chloride ($SiCl_4$), or tetracarbon tetrachloride ($CCl_4$)) is preferably used.

Alternatively, a gas containing fluorine (a fluorine-based gas such as carbon tetrafluoride ($CF_4$), hexasulfur fluoride ($SF_6$), trinitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the films into desired shapes, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a mixed solution of phosphoric acid, acetic acid, and nitric acid, or the like can be used. In addition, ITO-07N (produced by KANTO CHEMICAL CO., INC.) may also be used.

The etchant used in the wet etching is removed by cleaning together with the material which is etched off. Waste liquid of the etchant containing the removed material may be purified and the material contained in the waste liquid may be reused. When a material such as indium contained in the oxide semiconductor layers is collected from the waste liquid after the etching and is reused, the resources can be efficiently used and the cost can be reduced.

In order to etch the film into desired shapes, etching conditions (e.g., etchant, etching time, temperature, or the like) are controlled as appropriate depending on the material.

Next, a metal conductive film is formed using a metal material over the oxide semiconductor layers 133 and 134 by a sputtering method or a vacuum evaporation method.

As a material of the metal conductive film, an element selected from Al, Cr, Cu, Ta, Ti, Mo, or W; an alloy containing any of these elements as a component; an alloy film containing any of these elements in combination; and the like can be given. The metal conductive film may have a single-layer structure or a stacked-layer structure of two or more layers. For example, a single-layer structure of an aluminum film containing silicon; a two-layer structure of an aluminum film and a titanium film stacked thereover; a three-layer structure of a Ti film, an aluminum film stacked thereover, and a Ti film stacked thereover; and the like can be given. Alternatively, an alloy film containing aluminum and one or more elements selected from titanium (Ti), tantalum (Ta), tungsten (W), molybdenum (Mo), chromium (Cr), neodymium (Nd), or scandium (Sc), or a nitride film containing one of more of these elements may be used.

If heat treatment is performed after formation of the metal conductive film, it is preferable that the metal conductive film have heat resistance enough to withstand the heat treatment.

Next, resist masks 136a, 136b, 136c, 136d, 136e, and 136f are formed by performing a fourth photolithography step, and unnecessary portions of the metal conductive film are removed by etching, so that a source electrode layer 105a, a drain electrode layer 105b, a source electrode layer 165a, a drain electrode layer 165b, the connection electrode 120, and the second terminal 122 are formed (see FIG. 3C).

Note that each material and etching conditions are adjusted as appropriate so that the oxide semiconductor layers 133 and 134 are not removed by etching of the metal conductive film.

In this embodiment, a Ti film is used as the metal conductive film, an In—Ga—Zn—O-based oxide is used for the oxide semiconductor layers 133 and 134, and an ammonium hydroxide/hydrogen peroxide mixture (a mixed solution of ammonia, water, and a hydrogen peroxide solution) is used as an etchant.

In the fourth photolithography step, the connection electrode 120 and the second terminal 122, which are formed using the same material as that of the source electrode layers 105a and 165a and the drain electrode layers 105b and 165b, are formed in the respective terminal portions. Note that the second terminal 122 is electrically connected to a source wiring (a source wiring including the source electrode layers 105a and 165a). The connection electrode 120 is formed in contact with the first terminal 121 in the contact hole 119 and electrically connected to the first terminal 121.

Note that the resist masks 136a, 136b, 136c, 136d, 136e, and 136f used for forming the source electrode layers and the drain electrode layers may be formed by an ink-jet method. When the resist masks are formed by an ink-jet method, the photomask is unnecessary; accordingly, the manufacturing cost can be reduced.

Next, the resist masks 136a, 136b, 136c, 136d, 136e, and 136f are removed, and an oxide insulating film 107 serving as a protective insulating film in contact with the oxide semiconductor layers 133 and 134 is formed.

In each of the oxide semiconductor layers 133 and 134, a region in contact with the oxide insulating film is formed at this stage. In these regions, the region that overlaps with the gate electrode layer with the gate insulating layer interposed therebetween and also overlaps with the oxide insulating film 107 is the channel formation region.

The oxide insulating film 107 is formed to a thickness of at least 1 nm or more and can be formed using a method by which impurities such as water and hydrogen are prevented from entering the oxide insulating film 107, for example, by a sputtering method as appropriate. When hydrogen is contained in the oxide insulating film 107, entry of the hydrogen to the oxide semiconductor layers or extraction of oxygen in the oxide semiconductor layers by the hydrogen is caused, thereby making the backchannels of the oxide semiconductor layers have a lower resistance (to have an n-type conductivity) and forming parasitic channels. Therefore, it is preferable that a formation method in which hydrogen is not used is employed in order to form the oxide insulating film 107 containing as little hydrogen as possible.

In this embodiment, a silicon oxide film is formed to a thickness of 300 nm as the oxide insulating film 107 by a sputtering method. The substrate temperature in film formation may be from room temperature to 300° C. or lower and in this embodiment, is room temperature. The formation of the silicon oxide film by a sputtering method can be performed under a rare gas (typically, argon) atmosphere or an oxygen atmosphere. As a target, a silicon oxide target or a silicon target can be used. For example, with use of a silicon target, a silicon oxide film can be formed by a sputtering method under an oxygen atmosphere. Note that as the oxide insulating film formed in contact with the oxide semiconductor layers having low resistance by performing the first heat treatment, an inorganic insulating film which does not contain impurities such as moisture, hydrogen ions, and OH⁻ and which blocks entry of these from the outside is used. Typically, a silicon oxide film, a silicon nitride oxide film, a gallium oxide film, an aluminum oxide film, an aluminum oxynitride film, or the like is used.

Figure 4:
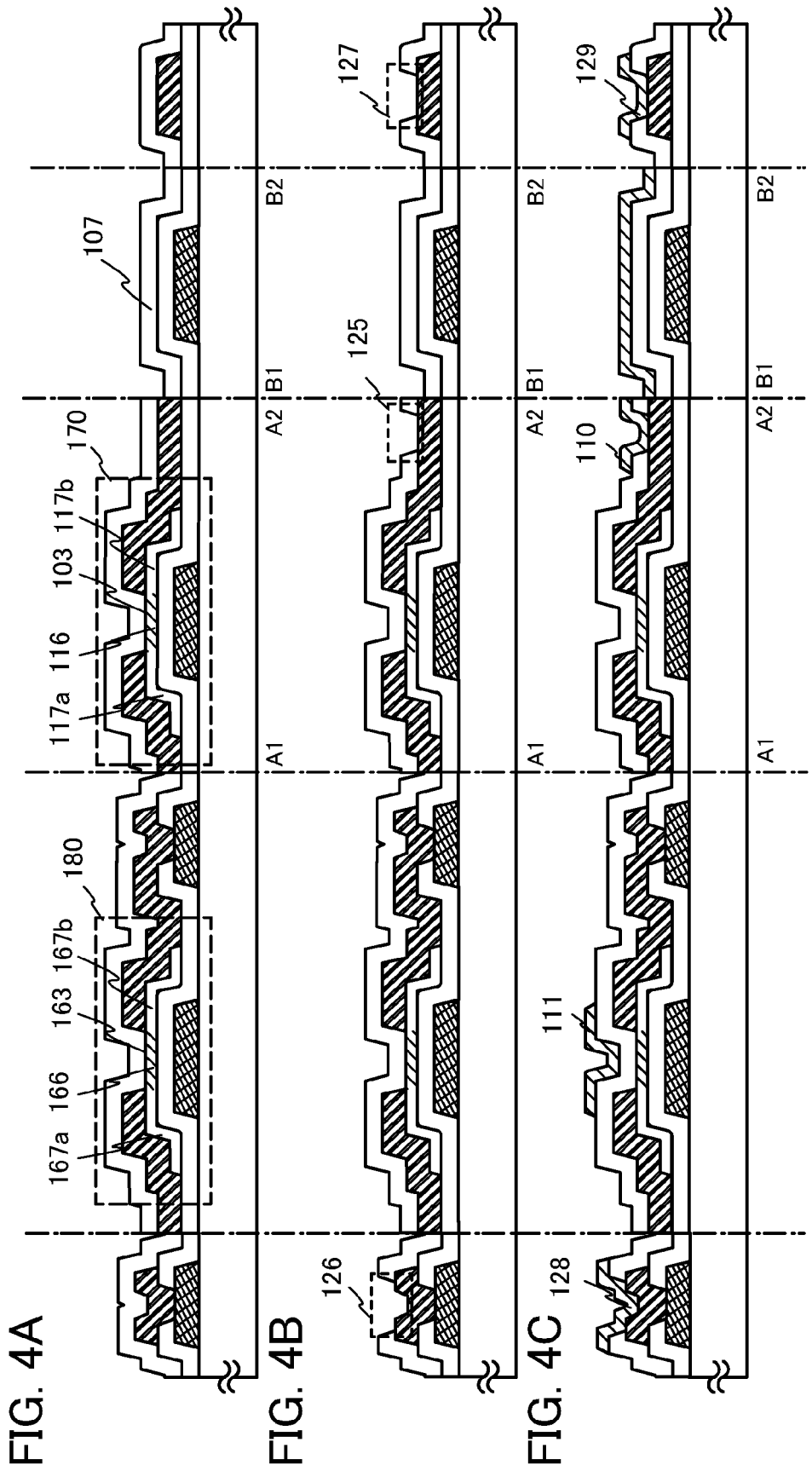
FIGS. 4A to 4C illustrate a manufacturing method of a semiconductor device.
Figure 5:
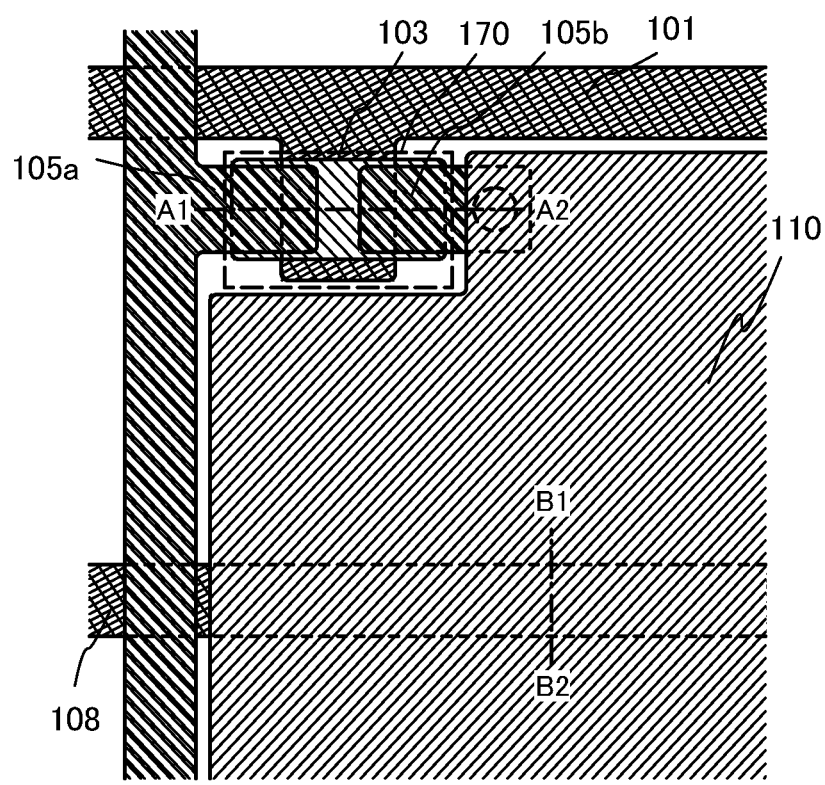
FIG. 5 illustrates a semiconductor device.

Next, second heat treatment (preferably at higher than or equal to 200° C. and lower than or equal to 400° C., for example, higher than or equal to 250° C. and lower than or equal to 350° C.) is performed in an inert gas atmosphere or a nitrogen gas atmosphere (see FIG. 4A). For example, the second heat treatment is performed at 250° C. for one hour in a nitrogen atmosphere. By the second heat treatment, part of the oxide semiconductor layers 133 and 134 which overlaps with the oxide insulating film 107 is heated in the state of being in contact with the oxide insulating film 107.

In the above steps, heat treatment for dehydration or dehydrogenation is performed on the oxide semiconductor layers after deposition to reduce the resistance, and then, part of the oxide semiconductor layers is selectively made to be in an oxygen-excess state.

As a result, in the oxide semiconductor layer 133, a channel formation region 166 overlapping with the gate electrode layer 161 has i-type conductivity, and a high-resistance source region 167a overlapping with the source electrode layer 165a and a high-resistance drain region 167b overlapping with the drain electrode layer 165b are formed in a self-aligned manner; thus, the oxide semiconductor layer 163 is formed. Similarly, in the oxide semiconductor layer 134, a channel formation region 116 overlapping with the gate electrode layer 101 has i-type conductivity, and a high-resistance source region 117a overlapping with the source electrode layer 105a and a high-resistance drain region 117b overlapping with the drain electrode layer 105b are formed in a self-aligned manner; thus, the oxide semiconductor layer 103 is formed.

By formation of the high-resistance drain regions 117b and 167b (or the high-resistance source regions 117a and 167a) in the oxide semiconductor layers 103 and 163 which overlap with the drain electrode layers 105b and 165b (and the source electrode layers 105a and 165a), respectively, reliability in a formed circuit can be improved. Specifically, by formation of the high-resistance drain region 117b, a structure can be employed in which conductivity is gradually changed from the drain electrode layer 105b to the channel formation region 116 through the high-resistance drain region 117b; similarly, by formation of the high-resistance drain region 167b, a structure can be employed in which conductivity is gradually changed from the drain electrode layer 165b to the channel formation region 166 through the high-resistance drain region 167b. Therefore, when the transistors operate in the state of being connected to a wiring which supplies the drain electrode layers 105b and 165b with a high power source potential VDD, the high-resistance drain regions serve as buffers so that a local high electric field is not applied even when a high electric field is applied between the gate electrode layer 101 and the drain electrode layer 105b and between the gate electrode layer 161 and the drain electrode layer 165b; in this manner, the transistors each can have a structure with an increased withstand voltage.

In addition, by formation of the high-resistance drain regions 117b and 167b (or the high-resistance source regions 117a and 167a) in the oxide semiconductor layers 103 and 163 which overlap with the drain electrode layers 105b and 165b (and the source electrode layers 105a and 165a), respectively, leakage current in the channel formation regions 116 and 166 which may flow in a formed circuit can be reduced.

In this embodiment, after a silicon oxide film is formed by a sputtering method as the oxide insulating film 107, heat treatment is performed at 250° C. to 350° C., whereby oxygen enters each of the oxide semiconductor layers from the exposed portion (the channel formation region) of the oxide semiconductor layer between the source region and the drain region, and is diffused thereinto. By formation of the silicon oxide film by a sputtering method, an excessive amount of oxygen can be contained in the silicon oxide film, and oxygen can enter the oxide semiconductor layers and can be diffused thereinto through the heat treatment. Oxygen enters the oxide semiconductor layers and is diffused thereinto, whereby the channel formation region can have higher resistance (i.e., the channel formation region can have i-type conductivity). Thus, the thin film transistors can serve as normally-off transistors.

Through the above steps, the thin film transistors 170 and 180 can be manufactured in the pixel portion and the driver circuit portion, respectively, over the same substrate. Each of the thin film transistors 170 and 180 is a bottom-gate thin film transistor including an oxide semiconductor layer in which a high-resistance source region, a high-resistance drain region, and a channel formation region are formed. Therefore, in each of the thin film transistors 170 and 180, the high-resistance drain region or the high-resistance source region serves as a buffer so that a local high electric field is not applied even when a high electric field is applied; in this manner, the thin film transistors 170 and 180 can each have a structure with an increased withstand voltage.

By formation of the driver circuit portion and the pixel portion over the same substrate, a connection wiring between the driver circuit and an external signal can be shortened; thus, reduction in size and cost of the semiconductor device can be realized.

A protective insulating layer may be additionally formed over the oxide insulating film 107. For example, a silicon nitride film is formed by an RF sputtering method. The RF sputtering method is preferable as a formation method of the protective insulating layer because it achieves high mass productivity. The protective insulating layer is formed using an inorganic insulating film which does not contain impurities such as moisture, hydrogen ions, and OH⁻ and blocks entry of these from the outside. Typically, a silicon nitride film, an aluminum nitride film, a silicon nitride oxide film, an aluminum oxynitride film, or the like is used.

Next, a resist mask is formed by performing a fifth photolithography step, and the oxide insulating film 107 is etched, so that a contact hole 125 reaching the drain electrode layer 105b is formed. Then, the resist mask is removed (see FIG. 4B). In addition, by this etching, a contact hole 127 reaching the second terminal 122 and a contact hole 126 reaching the connection electrode 120 are also formed. Note that the resist mask for forming the contact holes may be formed by an inkjet method. When the resist mask is formed by an inkjet method, a photomask is not used; thus, the manufacturing cost can be reduced.

Next, a conductive film having a light-transmitting property is formed. The conductive film having a light-transmitting property is formed using indium oxide ($In_2O_3$), an indium oxide-tin oxide alloy ($In_2O_3$—$SnO_2$, abbreviated as ITO), or the like by a sputtering method, a vacuum evaporation method, or the like. Alternatively, the conductive film having a light-transmitting property may be formed using an Al—Zn—O-based non-single-crystal film containing nitrogen (i.e., an Al—Zn—O—N-based non-single-crystal film), a Zn—O-based non-single-crystal film containing nitrogen, or a Sn—Zn—O-based non-single-crystal film containing nitrogen. Note that the proportion (atomic %) of zinc in the Al—Zn—O—N-based non-single-crystal film is 47 atomic % or less, and is larger than that of aluminum in the Al—Zn—O—N-based non-single-crystal film. The proportion (atomic %) of aluminum in the Al—Zn—O—N-based non-single-crystal film is larger than that of nitrogen in the Al—Zn—O—N-based non-single-crystal film. Etching treatment of such a material is performed with a hydrochloric acid based solution. However, since a residue is easily generated particularly in etching of ITO, an indium oxide-zinc oxide alloy ($In_2O_3$—ZnO) may be used to improve etching processability.

Note that the unit of the proportion of the conductive film having a light-transmitting property is atomic %, and the proportion is evaluated by analysis using an electron probe X-ray microanalyzer (EPMA).

Next, a resist mask is formed by performing a sixth photolithography step, and unnecessary portions of the conductive film having a light-transmitting property are removed by etching, so that the pixel electrode layer 110, the conductive layer 111, and the terminal electrodes 128 and 129 are formed. Then, the resist mask is removed. FIG. 4C illustrates a cross-sectional view at this stage. Note that FIG. 5 is a plan view at this stage.

In the sixth photolithography step, a storage capacitor is formed with the capacitor wiring 108 and the pixel electrode layer 110, in which the gate insulating layer 102 and the oxide insulating film 107 in the capacitor portion are used as a dielectric.

The capacitor 147, which is a storage capacitor including the gate insulating layer 102 as a dielectric, the capacitor wiring, and the capacitor electrode (also referred to as the capacitor electrode layer), can also be formed over the same substrate as the driver circuit portion and the pixel portion. Instead of providing the capacitor wiring, the pixel electrode may be overlapped with a gate wiring of an adjacent pixel with the protective insulating film and the gate insulating layer interposed therebetween, so that a storage capacitor is formed.

The terminal electrodes 128 and 129 which are formed in the terminal portion function as electrodes or wirings connected to an FPC. The terminal electrode 128 formed over the first terminal 121 with the connection electrode 120 interposed therebetween serves as a connection terminal electrode which functions as an input terminal for the gate wiring. The terminal electrode 129 formed over the second terminal 122 serves as a connection terminal electrode which functions as an input terminal for the source wiring.

Figure 11A:
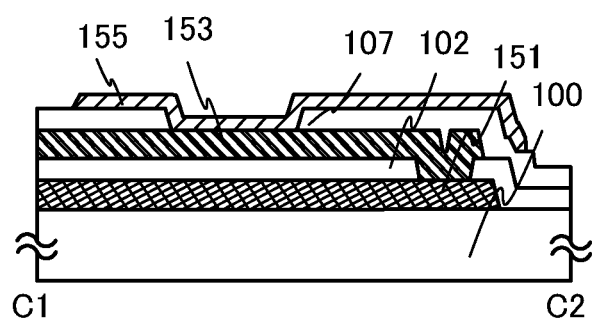
FIGS. 11A to 11D illustrate a semiconductor device.
Figure 11B:
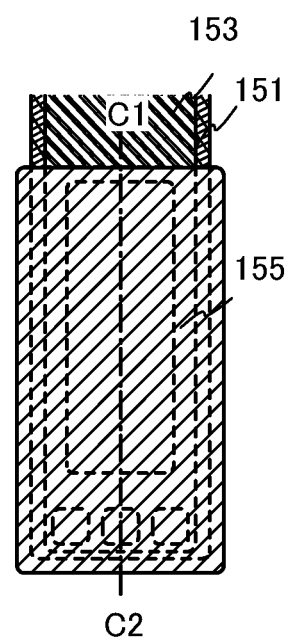

Further, FIGS. 11A and 11B are a cross-sectional view of a gate wiring terminal portion at this stage and a top view thereof, respectively. FIG. 11A is a cross-sectional view taken along line C1-C2 of FIG. 11B. In FIG. 11A, a conductive film 155 formed over the oxide insulating film 107 is a connection terminal electrode serving as an input terminal. Furthermore, in FIG. 11A, in the terminal portion, a first terminal 151 formed from the same material as the gate wiring and a connection electrode 153 formed from the same material as the source wiring are overlapped with each other with the gate insulating layer 102 interposed therebetween, are partly in direct contact with each other, and are electrically connected to each other. In addition, the connection electrode 153 and the conductive film 155 are in direct contact with each other in a contact hole provided in the oxide insulating film 107 and are electrically connected.

Figure 11C:
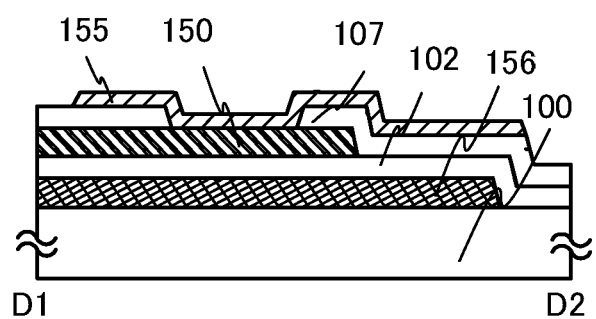
Figure 11D:
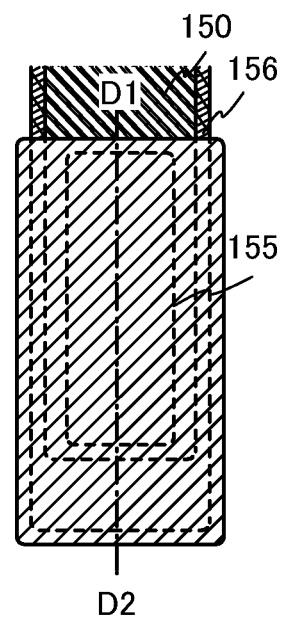

Further, FIGS. 11C and 11D are a cross-sectional view of a source wiring terminal portion and a top view thereof, respectively. FIG. 11C is a cross-sectional view taken along line D1-D2 of FIG. 11D. In FIG. 11C, the conductive film 155 formed over the oxide insulating film 107 is a connection terminal electrode serving as an input terminal. In FIG. 11C, in the terminal portion, an electrode 156 formed from the same material as the gate wiring is located below and overlapped with a second terminal 150 electrically connected to the source wiring, with the gate insulating layer 102 interposed therebetween. The electrode 156 is not electrically connected to the second terminal 150. When the electrode 156 is not electrically connected to the second terminal 150 and is set to, for example, floating, GND, or 0 V so that the potential of the electrode 156 is different from the potential of the second terminal 150, a capacitor for preventing noise or static electricity can be formed. The second terminal 150 is electrically connected to the conductive film 155 through the oxide insulating film 107.

A plurality of gate wirings, source wirings, and capacitor wirings are provided in accordance with the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of terminals, and the number of terminals may be determined by a practitioner as appropriate.

Through these six photolithography steps using six photomasks, the driver circuit portion including the thin film transistor 180, the pixel portion including the thin film transistor 170, the capacitor 147 including the storage capacitor, and external extraction terminal portions can be completed. The thin film transistors and the storage capacitor are arranged in respective pixels in matrix so that a pixel portion is formed, which can be used as one of substrates for manufacturing an active matrix display device. In this specification, such a substrate is referred to as an active matrix substrate for convenience.

When an active matrix liquid crystal display device is manufactured, an active matrix substrate and a counter substrate provided with a counter electrode are attached to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is a terminal for setting the common electrode at a fixed potential such as GND or 0 V.

The insulating layer 191 serving as an alignment film is formed over the oxide insulating film 107, the conductive layer 111, and the pixel electrode layer 110.

The coloring layer 195, the counter electrode layer 194, and the insulating layer 193 serving as an alignment film are formed over the counter substrate 190. The substrate 100 and the counter substrate 190 are attached to each other with a spacer which adjusts a cell gap of the liquid crystal display device and the liquid crystal layer 192 positioned therebetween, with use of a sealant (not illustrated). This attachment step may be performed under reduced pressure.

As the sealant, it is typically preferable to use a visible light curable resin, an ultraviolet curable resin, or a thermosetting resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant.

The liquid crystal layer 192 is formed by filling a space with a liquid crystal material. The liquid crystal layer 192 may be formed by a dispenser method (a dripping method) in which a liquid crystal is dripped before the attachment of the substrate 100 to the counter substrate 190, or by an injection method in which a liquid crystal is injected by using a capillary phenomenon after the attachment of the substrate 100 to the counter substrate 190. There is no particular limitation on the kind of liquid crystal material, and a variety of materials can be used. If a material exhibiting a blue phase is used as the liquid crystal material, an alignment film does not need to be provided.

The polarizing plate 196a is provided on the outer side of the substrate 100, and the polarizing plate 196b is provided on the outer side of the counter substrate 190. In this manner, a transmissive liquid crystal display device of this embodiment can be manufactured (see FIG. 1).

Although not illustrated in this embodiment, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique so-called black insertion by which an entirely black image is displayed every other frame.

Alternatively, a driving method called double-frame rate driving may be employed in which a vertical synchronizing frequency is 1.5 times or more, preferably 2 times or more as high as a normal vertical synchronizing frequency, whereby moving image characteristics are improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

The use of an oxide semiconductor for a thin film transistor leads to reduction in manufacturing cost. In particular, when an oxide insulating film is formed in contact with oxide semiconductor layers using the above method, thin film transistors having stable electric characteristics can be manufactured and provided. Therefore, a semiconductor device which includes highly reliable thin film transistors having favorable electric characteristics can be provided.

The channel formation regions in the semiconductor layers are high-resistance regions; thus, electric characteristics of the thin film transistors are stabilized and increase in off current can be prevented. Therefore, a semiconductor device including highly reliable thin film transistors having favorable electric characteristics can be provided.

Since the thin film transistor is easily broken due to static electricity or the like, the protective circuit is preferably provided over the same substrate as the pixel portion and the driver circuit portion. The protective circuit is preferably formed using a non-linear element including an oxide semiconductor layer. For example, a protective circuit is provided between the pixel portion, and a scan line input terminal and a signal line input terminal. In this embodiment, a plurality of protective circuits are provided so that the pixel transistor and the like are not broken when surge voltage due to static electricity or the like is applied to the scan line, the signal line, or a capacitor bus line. Accordingly, the protective circuit has a structure for releasing charge to a common wiring when surge voltage is applied to the protective circuit. The protective circuit includes non-linear elements which are arranged in parallel between the scan line and the common wiring. Each of the non-linear elements includes a two-terminal element such as a diode or a three-terminal element such as a transistor. For example, the non-linear element can be formed through the same steps as the thin film transistor 170 of the pixel portion. For example, characteristics similar to those of a diode can be achieved by connecting a gate terminal to a drain terminal of a transistor.

This embodiment can be implemented in appropriate combination with any of the structures described in the other embodiments.

Embodiment 2

In this embodiment, an example in which oxide conductive layers are provided as a source region and a drain region between the oxide semiconductor layer and the source and drain electrode layers in Embodiment 1 will be described with reference to FIGS. 6A to 6D and FIGS. 7A and 7B. Therefore, part of this embodiment can be performed in a manner similar to that of Embodiment 1, and repetitive description of the same portions as or portions having functions similar to those in Embodiment 1 and steps for manufacturing such portions will be omitted. Further, since the steps in FIGS. 6A to 6D and FIGS. 7A and 7B are the same as the steps in FIG. 1, FIGS. 2A to 2C, FIGS. 3A to 3C, FIGS. 4A to 4C, and FIG. 5 except some points, the same portions are denoted by the same reference numerals and the detailed description of the same portions will be omitted.

Figure 6:
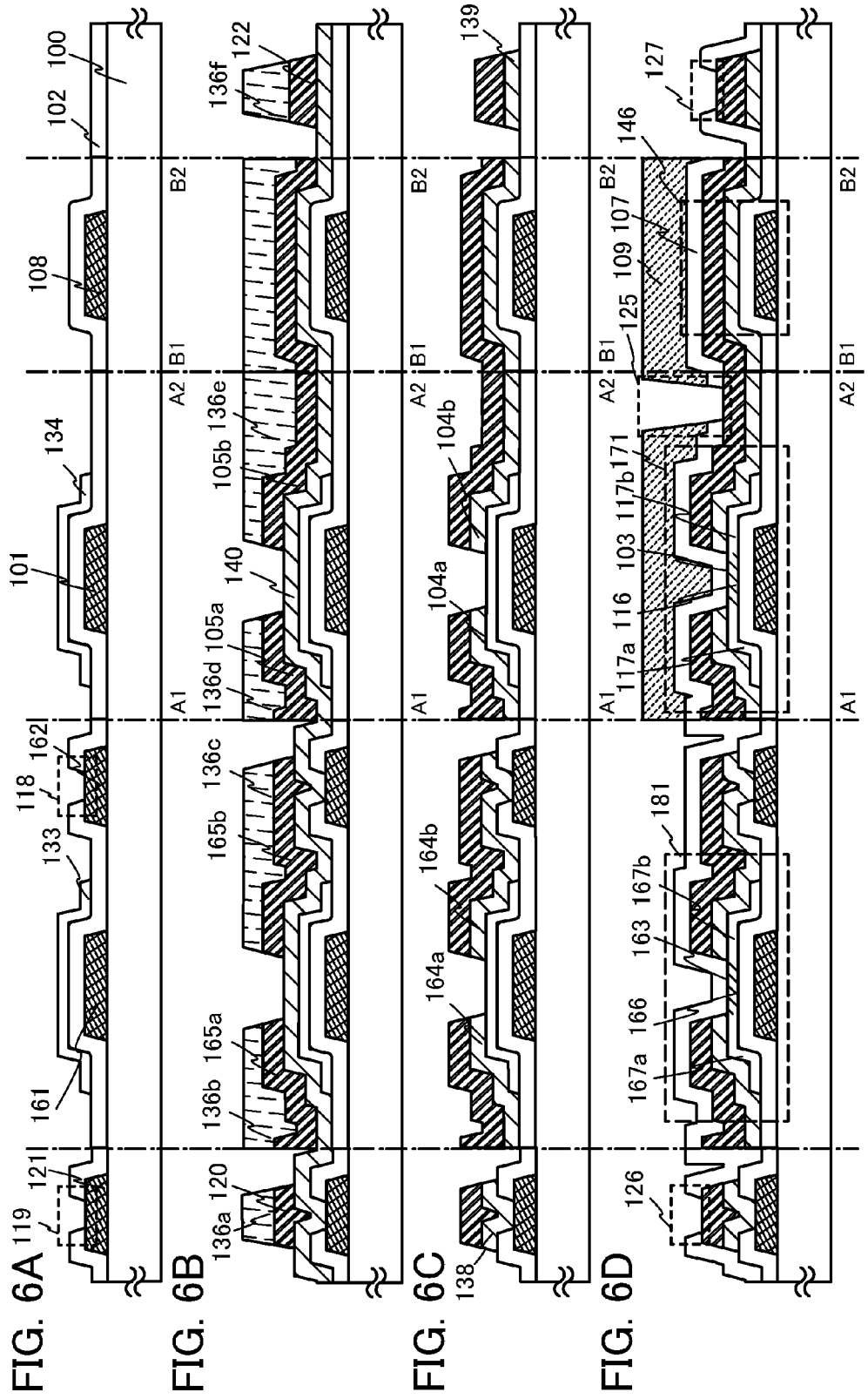
FIGS. 6A to 6D illustrate a manufacturing method of a semiconductor device.

First, the steps up to the step of FIG. 3B in Embodiment 1 are performed in accordance with Embodiment 1. FIG. 6A is the same as FIG. 3B.

An oxide conductive film 140 is formed over the dehydrated or dehydrogenated oxide semiconductor layers 133 and 134, and a metal conductive film formed using a conductive metal material is stacked over the oxide conductive film 140.

As the formation method of the oxide conductive film 140, a sputtering method, a vacuum evaporation method (an electron beam evaporation method or the like), an arc discharge ion plating method, or a spray method can be used. A material of the oxide conductive film 140 preferably contains zinc oxide as a component and preferably does not contain indium oxide. For such an oxide conductive film 140, zinc oxide, aluminum zinc oxide, aluminum zinc oxynitride, gallium zinc oxide, or the like can be used. The thickness of the oxide conductive film 140 is set as appropriate in a range of 50 nm to 300 nm inclusive. In the case of using a sputtering method, it is preferable to use a target including $SiO_2$ at 2 wt % to 10 wt % inclusive and make $SiO_x$ (x>0) which inhibits crystallization be contained in the oxide conductive film in order to suppress crystallization at the time of heat treatment for dehydration or dehydrogenation in a later step.

Next, the resist masks 136a, 136b, 136c, 136d, 136e, and 136f are formed by performing a fourth photolithography step, and unnecessary portions of the metal conductive film are removed by etching, so that the source electrode layer 105a, the drain electrode layer 105b, the source electrode layer 165a, the drain electrode layer 165b, the connection electrode 120, and the second terminal 122 are formed (see FIG. 6B).

Note that each material and etching conditions are adjusted as appropriate so that the oxide conductive film 140 and the oxide semiconductor layers 133 and 134 are not removed by etching of the metal conductive film.

Next, the resist masks 136a, 136b, 136c, 136d, 136e, and 136f are removed, and the oxide conductive film 140 is etched using the source electrode layer 105a, the drain electrode layer 105b, the source electrode layer 165a, and the drain electrode layer 165b as masks, so that oxide conductive layers 164a and 164b and oxide conductive layers 104a and 104b are formed (see FIG. 6C). The oxide conductive film 140 containing zinc oxide as a component can be easily etched with an alkaline solution such as a resist stripping solution, for example. In addition, oxide conductive layers 138 and 139 are also formed in respective terminal portions in this step.

Etching treatment for dividing the oxide conductive film to form channel formation regions is performed by utilizing the difference in etching rates between the oxide semiconductor layers and the oxide conductive film. The oxide conductive film over the oxide semiconductor layers is selectively etched utilizing a higher etching rate of the oxide conductive film as compared to that of the oxide semiconductor layers.

Therefore, removal of the resist masks 136a, 136b, 136c, 136d, 136e, and 136f is preferably performed by ashing. In the case of etching with a stripping solution, etching conditions (the kind of the etchant, the concentration, and the etching time) are adjusted as appropriate so that the oxide conductive film 140 and the oxide semiconductor layers 133 and 134 are not etched excessively.

As described in this embodiment, in the case where the island-shaped oxide semiconductor layers are formed by etching, the oxide conductive film and the metal conductive film are stacked thereover, and etching is performed using the same masks to form a wiring pattern including source electrode layers and drain electrode layers, oxide conductive films can be left under the wiring pattern of the metal conductive film.

At the contact portion between the gate wiring (the conductive layer 162) and the source wiring (the drain electrode layer 165b), the oxide conductive layer 164b is formed below the source wiring. The oxide conductive layer 164b serves as a buffer, and further the oxide conductive layer 164b does not form an insulating oxide with metal, which is preferable.

The oxide insulating film 107 serving as a protective insulating film is formed in contact with the oxide semiconductor layers 133 and 134. In this embodiment, a silicon oxide film with a thickness of 300 nm is formed by a sputtering method as the oxide insulating film 107.

Then, second heat treatment (preferably at a temperature of 200° C. to 400° C. inclusive, for example at a temperature of 250° C. to 350° C. inclusive) is performed in an inert gas atmosphere or a nitrogen gas atmosphere. For example, the second heat treatment is performed at 250° C. in a nitrogen atmosphere for one hour. By the second heat treatment, part of the oxide semiconductor layers 133 and 134 which overlaps with the oxide insulating film 107 is heated in the state of being in contact with the oxide insulating film 107.

In the above-described steps, the formed oxide semiconductor layers are subjected to heat treatment for dehydration or dehydrogenation to have a lower resistance and then part of the oxide semiconductor layers is selectively made in an oxygen-excess state.

As the result, the channel formation region 166, which overlaps with the gate electrode layer 161, in the oxide semiconductor layer 133 comes to have an i-type conductivity, and the high-resistance source region 167a which overlaps with the source electrode layer 165a and the oxide conductive layer 164a and the high-resistance drain region 167b which overlaps with the drain electrode layer 165b and the oxide conductive layer 164b are formed in a self-aligned manner; thus the oxide semiconductor layer 163 is formed. In a similar manner, the channel formation region 116 in the oxide semiconductor layer 134 comes to have an i-type conductivity, and the high-resistance source region 117a which overlaps with the source electrode layer 105a and the oxide conductive layer 104a and the high-resistance drain region 117b which overlaps with the drain electrode layer 105b and the oxide conductive layer 104b are formed in a self-aligned manner; thus the oxide semiconductor layer 103 is formed.

The oxide conductive layers 104b and 164b which are disposed between the oxide semiconductor layers 103 and 163 and the drain electrode layers 105b and 165b each also function as a low-resistance drain (LRD, also referred to as an LRN (low-resistance n-type conductivity)) region. Similarly, the oxide conductive layers 104a and 164a which are disposed between the oxide semiconductor layers 103 and 163 and the source electrode layers 105a and 165a each also function as a low-resistance source (LRS, also referred to as an LRN (low-resistance n-type conductivity)) region. With the structure of the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (the HRD region) and preferably in a range of $1\times10^{20}/cm^3$ or higher and $1\times10^{21}/cm^3$ or lower.

Through the above-described steps, a thin film transistor 181 and a thin film transistor 171 can be manufactured in a driver circuit portion and a pixel portion, respectively, over one substrate. The thin film transistors 171 and 181 are each a bottom-gate thin film transistor which includes an oxide semiconductor layer including a high-resistance source region, a high-resistance drain region, and a channel formation region. Therefore, even when high electric field is applied to the thin film transistors 171 and 181, the high-resistance drain regions and the high-resistance source regions each serve as a buffer and local high electric field is not applied; in this manner, the structure realizes the improved withstand voltage of the transistors.

In a capacitor portion, a capacitor 146 which is formed from the stack of the capacitor wiring 108, the gate insulating layer 102, an oxide conductive layer formed in the same step as that of the oxide conductive layer 104b, a metal conductive layer formed in the same step as that of the drain electrode layer 105b, and the oxide insulating film 107 is formed.

Next, a planarization insulating layer 109 is formed over the oxide insulating film 107. In this embodiment, the planarization insulating layer 109 is formed only in the pixel portion. The planarization insulating layer 109 can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer 109 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer 109, and any of the following can be used depending on a material thereof: a method such as a sputtering method, an SOG method, spin coating, dipping, spray coating, or a droplet discharging method (e.g., an ink-jet method, screen printing, or offset printing); a tool such as doctor knife, roll coater, curtain coater, or knife coater; or the like. In this embodiment, photosensitive acrylic is used to form the planarization insulating layer 109.

Next, a resist mask is formed by performing a fifth photolithography step, and the contact hole 125 which reaches the drain electrode layer 105b is formed by etching the planarization insulating layer 109 and the oxide insulating film 107. Then, the resist mask is removed (see FIG. 6D). In addition, the contact hole 126 reaching the connection electrode 120 and the contact hole 127 reaching the second terminal 122 are also formed by this etching.

Next, a light-transmitting conductive film is formed. Resist masks are formed by performing a sixth photolithography step and unnecessary portions are removed by etching to form the pixel electrode layer 110, the conductive layer 111, and the terminal electrodes 128 and 129. Then, the resist masks are removed (see FIG. 7A).

Figure 7:
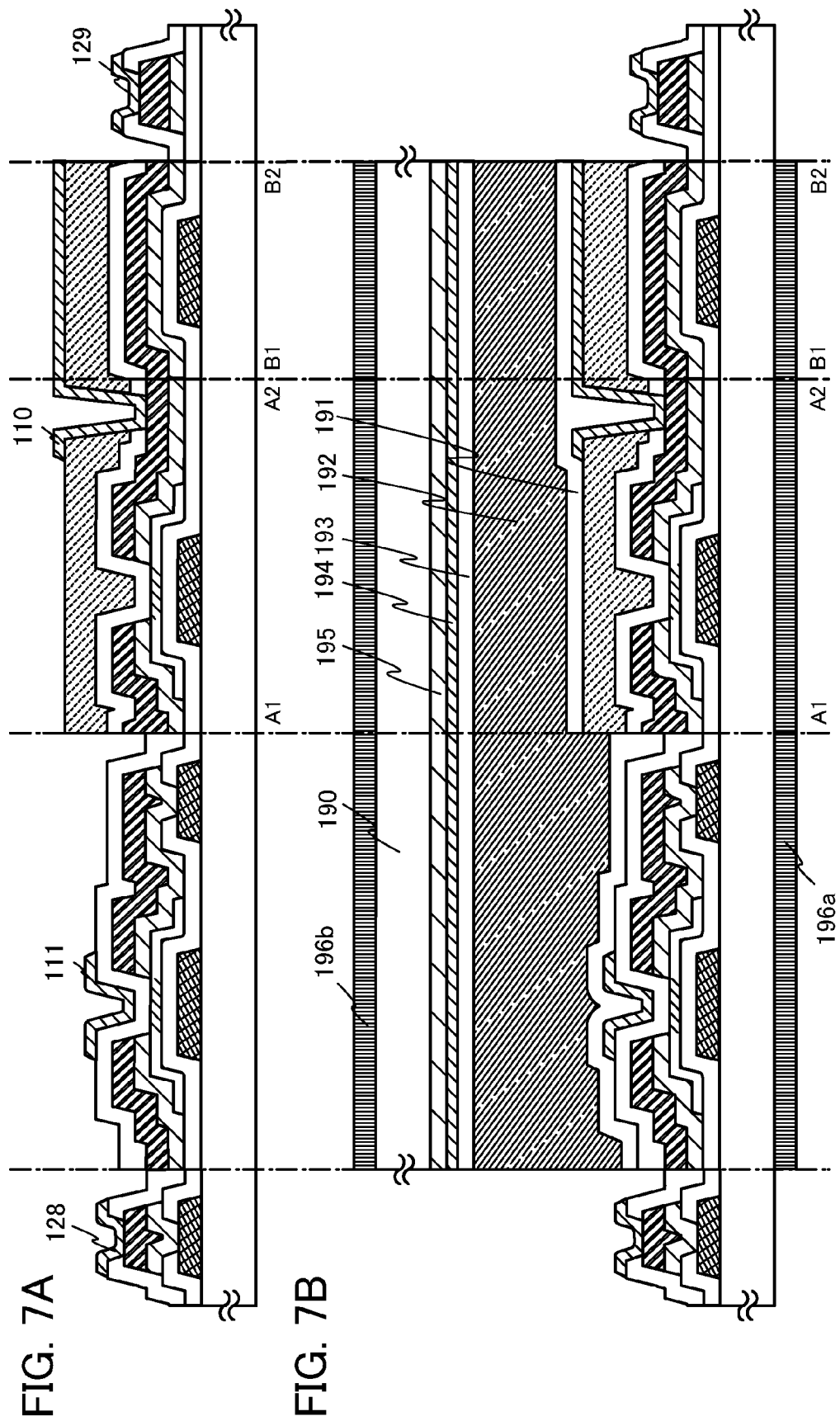
FIGS. 7A and 7B illustrate a manufacturing method of a semiconductor device.

In a similar manner to that of Embodiment 1, the counter substrate 190 is attached to the substrate 100 with the liquid crystal layer 192 interposed therebetween; thus, a liquid crystal display device of this embodiment is manufactured (see FIG. 7B).

When the oxide conductive layers are provided as the source region and the drain region between the oxide semiconductor layer and the source and drain electrode layers, the source region and the drain region can have lower resistance and the transistor can operate at high speed. It is effective to use the oxide conductive layers for a source region and a drain region in order to improve frequency characteristics of a peripheral circuit (a driver circuit). This is because the contact between a metal electrode (e.g., Ti) and an oxide conductive layer can reduce the contact resistance as compared to the contact between a metal electrode (e.g., Ti) and an oxide semiconductor layer.

There has been a problem in that molybdenum (Mo) which is used as a part of a wiring material (e.g., Mo/Al/Mo) in a liquid crystal panel has high contact resistance with an oxide semiconductor layer. This is because Mo is less likely to be oxidized and has a weaker effect of extracting oxygen from the oxide semiconductor layer as compared to Ti, and a contact interface between Mo and the oxide semiconductor layer is not changed to have an n-type conductivity. However, even in such a case, the contact resistance can be reduced by interposing an oxide conductive layer between the oxide semiconductor layer and source and drain electrode layers; accordingly, frequency characteristics of a peripheral circuit (a driver circuit) can be improved.

The channel length of the thin film transistor is determined at the time of etching the oxide conductive layer; accordingly, the channel length can be further shortened. For example, the channel length can be set as small as 0.1 μm to 2 μm inclusive; in this way, operation speed can be increased.

Embodiment 3

In this embodiment, another example in which oxide conductive layers are provided as a source region and a drain region between the oxide semiconductor layer and the source and drain electrode layers in Embodiment 1 or 2 will be described with reference to FIGS. 8A to 8D and FIGS. 9A and 9B. Therefore, part of this embodiment can be performed in a manner similar to that of Embodiment 1 or 2, and repetitive description of the same portions as or portions having functions similar to those in Embodiment 1 or 2 and steps for manufacturing such portions will be omitted. Further, since the steps in FIGS. 8A to 8D and FIGS. 9A and 9B are the same as the steps in FIG. 1, FIGS. 2A to 2C, FIGS. 3A to 3C, FIGS. 4A to 4C, FIG. 5, FIGS. 6A to 6D, and FIGS. 7A and 7B except some points, the same portions are denoted by the same reference numerals and the detailed description of the same portions will be omitted.

First, in accordance with Embodiment 1, a metal conductive film is formed over the substrate 100, and the metal conductive film is etched using a resist mask formed in a first photolithography step, so that the first terminal 121, the gate electrode layer 161, the conductive layer 162, the gate electrode layer 101, and the capacitor wiring 108 are formed.

Next, the gate insulating layer 102 is formed over the first terminal 121, the gate electrode layer 161, the conductive layer 162, the gate electrode layer 101, and the capacitor wiring 108, and then an oxide semiconductor film and an oxide conductive film are stacked. The gate insulating layer, the oxide semiconductor film, and the oxide conductive film can be formed in succession without being exposed to air.

Resist masks are formed over the oxide conductive film in a second photolithography step. The gate insulating layer, the oxide semiconductor film, and the oxide conductive film are etched using the resist masks to form the contact hole 119 reaching the first terminal 121 and the contact hole 118 reaching the conductive layer 162.

The resist masks formed in the second photolithography step are removed, and resist masks are newly formed over the oxide conductive film in a third photolithography step. With the use of the resist masks in the third photolithography step, island-shaped oxide semiconductor layers and island-shaped oxide conductive layers are formed.

When the contact holes are formed in the gate insulating layer in the state where the oxide semiconductor film and the oxide conductive film are stacked over the entire surface of the gate insulating layer in such a manner, the resist masks are not directly in contact with the surface of the gate insulating layer; accordingly, contamination of the surface of the gate insulating layer (e.g., attachment of impurities or the like to the gate insulating layer) can be prevented. Thus, a favorable state of the interface between the gate insulating layer and the oxide semiconductor film and the oxide conductive film can be obtained, thereby improving reliability.

Next, heat treatment for dehydration or dehydrogenation is performed in the state where the oxide semiconductor layers and the oxide conductive layers are stacked. With the heat treatment at 400° C. to 700° C., the dehydration or dehydrogenation of the oxide semiconductor layers can be achieved; thus, water ($H_2O$) can be prevented from being contained again in the oxide semiconductor layers later.

As long as a substance which inhibits crystallization such as silicon oxide is not contained in the oxide conductive layers, this heat treatment crystallizes the oxide conductive layers. A crystal of the oxide conductive layers grows in a columnar shape with respect to a base surface. Accordingly, when the metal conductive film in an upper layer over the oxide conductive layers is etched in order to form a source electrode layer and a drain electrode layer, formation of an undercut can be prevented.

Further, by the heat treatment for dehydration or dehydrogenation of the oxide semiconductor layers, conductivity of the oxide conductive layers can be improved. Note that only the oxide conductive layers may be subjected to heat treatment at a temperature lower than that for the oxide semiconductor layers.

Alternatively, the first heat treatment may be performed on the oxide semiconductor film and the oxide conductive film before being processed into the island-shaped oxide semiconductor layers and the island-shaped oxide conductive layers, instead of on the island-shaped oxide semiconductor layers and the island-shaped oxide conductive layers. In that case, after the first heat treatment, the substrate is taken out of the heating apparatus and a photolithography step is performed.

Figure 8:
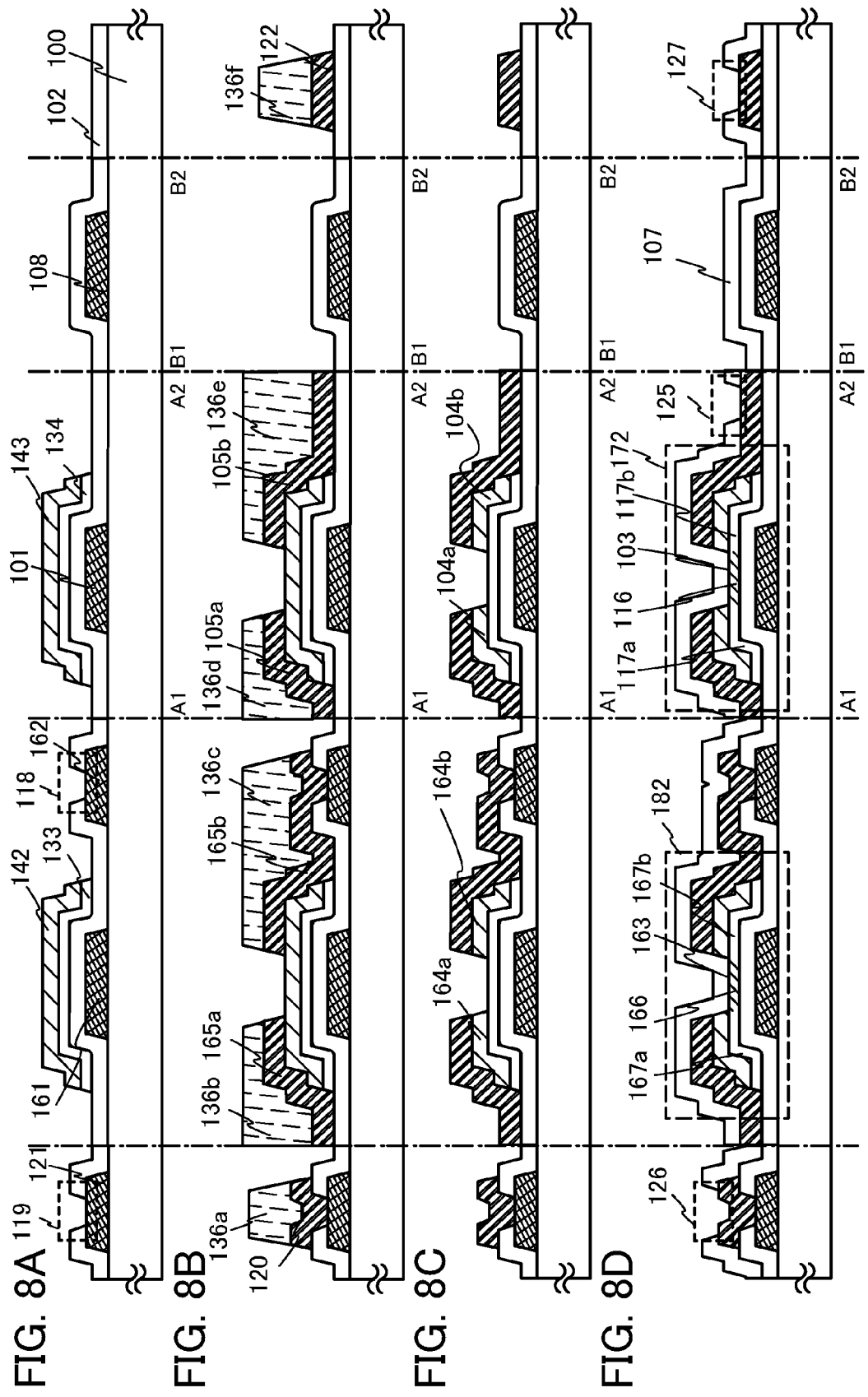
FIGS. 8A to 8D illustrate a manufacturing method of a semiconductor device.

Through the above-described steps, the oxide semiconductor layers 133 and 134 and oxide conductive layers 142 and 143 can be obtained (see FIG. 8A). The oxide semiconductor layer 133 and the oxide conductive layer 142 are island-shaped stacked layers formed using the same mask, and the oxide semiconductor layer 134 and the oxide conductive layer 143 are island-shaped stacked layers formed using the same mask.

Next, the resist masks 136a, 136b, 136c, 136d, 136e, and 136f are formed by performing a fourth photolithography step, and unnecessary portions of the metal conductive film are removed by etching, so that the source electrode layer 105a, the drain electrode layer 105b, the source electrode layer 165a, the drain electrode layer 165b, the connection electrode 120, and the second terminal 122 are formed (see FIG. 8B).

Note that each material and etching conditions are adjusted as appropriate so that the oxide conductive layers 142 and 143 and the oxide semiconductor layers 133 and 134 are not removed by etching of the metal conductive film.

Next, the resist masks 136a, 136b, 136c, 136d, 136e, and 136f are removed, and then the oxide conductive layers 142 and 143 are etched using the source electrode layer 105a, the drain electrode layer 105b, the source electrode layer 165a, and the drain electrode layer 165b as masks, so that the oxide conductive layers 164a and 164b and the oxide conductive layers 104a and 104b are formed (see FIG. 8C). The oxide conductive layers 142 and 143 containing zinc oxide as a component can be easily etched with an alkaline solution such as a resist stripping solution, for example.

Therefore, removal of the resist masks 136a, 136b, 136c, 136d, 136e, and 136f is preferably performed by ashing. In the case of etching with a stripping solution, etching conditions (the kind of the etchant, the concentration, and the etching time) are adjusted as appropriate so that the oxide conductive layers 142 and 143 and the oxide semiconductor layers 133 and 134 are not etched excessively.

The oxide insulating film 107 serving as a protective insulating film is formed in contact with the oxide semiconductor layers 133 and 134. In this embodiment, a silicon oxide film with a thickness of 300 nm is formed by a sputtering method as the oxide insulating film 107.

Then, second heat treatment (preferably at a temperature of 200° C. to 400° C. inclusive, for example at a temperature of 250° C. to 350° C. inclusive) is performed in an inert gas atmosphere or a nitrogen gas atmosphere. For example, the second heat treatment is performed at 250° C. in a nitrogen atmosphere for one hour. By the second heat treatment, part of the oxide semiconductor layers 133 and 134 which overlaps with the oxide insulating film 107 is heated in the state of being in contact with the oxide insulating film 107.

In the above-described steps, the formed oxide semiconductor layers are subjected to heat treatment for dehydration or dehydrogenation to have a lower resistance and then part of the oxide semiconductor layers is selectively made in an oxygen-excess state.

As the result, the channel formation region 166, which overlaps with the gate electrode layer 161, in the oxide semiconductor layer 133 comes to have an i-type conductivity, and the high-resistance source region 167a which overlaps with the source electrode layer 165a and the oxide conductive layer 164a and the high-resistance drain region 167b which overlaps with the drain electrode layer 165b and the oxide conductive layer 164b are formed in a self-aligned manner; thus the oxide semiconductor layer 163 is formed. In a similar manner, the channel formation region 116, which overlaps with the gate electrode layer 101, in the oxide semiconductor layer 134 comes to have an i-type conductivity, and the high-resistance source region 117a which overlaps with the source electrode layer 105a and the oxide conductive layer 104a and the high-resistance drain region 117b which overlaps with the drain electrode layer 105b and the oxide conductive layer 104b are formed in a self-aligned manner; thus the oxide semiconductor layer 103 is formed.

The oxide conductive layers 104b and 164b which are disposed between the oxide semiconductor layers 103 and 163 and the drain electrode layers 105b and 165b each also function as a low-resistance drain (LRD, also referred to as an LRN) region. Similarly, the oxide conductive layers 104a and 164a which are disposed between the oxide semiconductor layers 103 and 163 and the source electrode layers 105a and 165a each also function as a low-resistance source (LRS, also referred to as an LRN) region. With the structure of the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (the HRD region) and preferably in a range of $1 \times 10^{20}/cm^3$ or higher and $1 \times 10^{21}/cm^3$ or lower.

Through the above-described steps, a thin film transistor 182 and a thin film transistor 172 can be manufactured in a driver circuit portion and a pixel portion, respectively, over one substrate. The thin film transistors 172 and 182 are each a bottom-gate thin film transistor which includes an oxide semiconductor layer including a high-resistance source region, a high-resistance drain region, and a channel formation region. Therefore, even when high electric field is applied to the thin film transistors 172 and 182, the high-resistance drain regions and the high-resistance source regions each serve as a buffer and local high electric field is not applied; in this manner, the structure realizes the improved withstand voltage of the transistors.

Next, a resist mask is formed by performing a fifth photolithography step, and the contact hole 125 which reaches the drain electrode layer 105b is formed by etching the oxide insulating film 107. Then, the resist mask is removed (see FIG. 8D). In addition, the contact hole 126 reaching the connection electrode 120 and the contact hole 127 reaching the second terminal 122 are also formed by this etching.

Next, a light-transmitting conductive film is formed. Resist masks are formed by performing a sixth photolithography step, and then unnecessary portions are removed by etching to form the pixel electrode layer 110, the conductive layer 111, and the terminal electrodes 128 and 129. Then, the resist masks are removed (see FIG. 9A).

Figure 9:
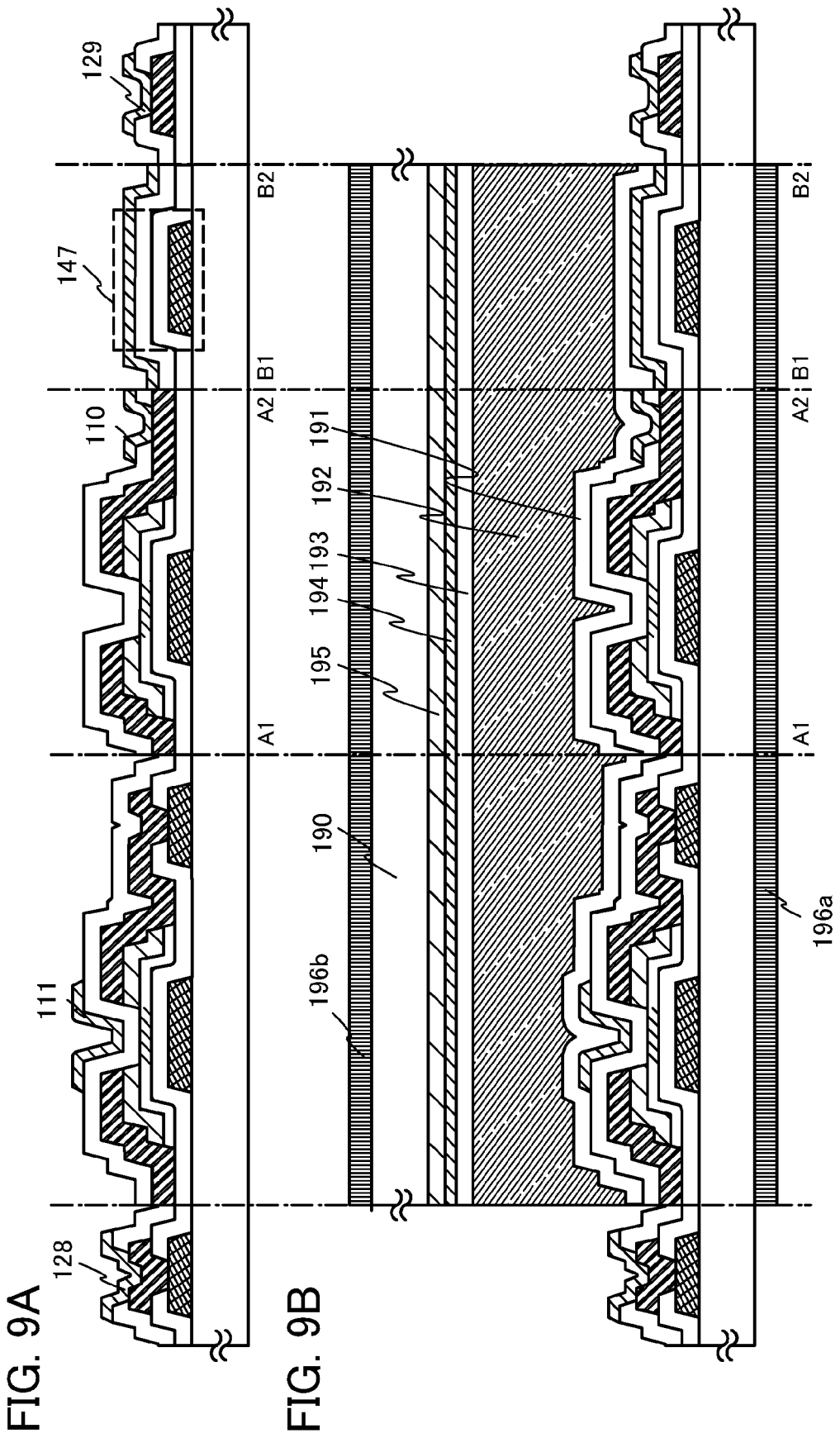
FIGS. 9A and 9B illustrate a manufacturing method of a semiconductor device.

In a similar manner to that of Embodiment 1, the counter substrate 190 is attached to the substrate 100 with the liquid crystal layer 192 interposed therebetween; thus, a liquid crystal display device of this embodiment is manufactured (see FIG. 9B).

When the oxide conductive layers are provided as the source region and the drain region between the oxide semiconductor layer and the source and drain electrode layers, the source region and the drain region can have lower resistance and the transistor can operate at high speed. It is effective to use the oxide conductive layers for a source region and a drain region to improve frequency characteristics of a peripheral circuit (a driver circuit). This is because the contact between a metal electrode (e.g., Ti) and an oxide conductive layer can reduce the contact resistance as compared to the contact between a metal electrode (e.g., Ti) and an oxide semiconductor layer.

The contact resistance can be reduced by interposing the oxide conductive layers between the oxide semiconductor layer and the source and drain electrode layers; accordingly, frequency characteristics of a peripheral circuit (a driver circuit) can be improved.

The channel length of the thin film transistor is determined at the time of etching the oxide conductive layer; accordingly, the channel length can be further shortened. For example, the channel length can be set as small as 0.1 μm to 2 μm inclusive; in this way, operation speed can be increased.

Embodiment 4

In this embodiment, an example of a liquid crystal display device including a liquid crystal layer sealed between a first substrate and a second substrate will be described in which a common connection portion electrically connected to a counter electrode provided for the second substrate is formed over the first substrate. Note that a thin film transistor is formed as a switching element over the first substrate, and the common connection portion is manufactured in the same process as the switching element in the pixel portion, thereby being obtained without complicating the process.

The common connection portion is provided in a position that overlaps with a sealant for bonding the first substrate and the second substrate, and is electrically connected to the counter electrode through conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the counter electrode.

Figure 36A:
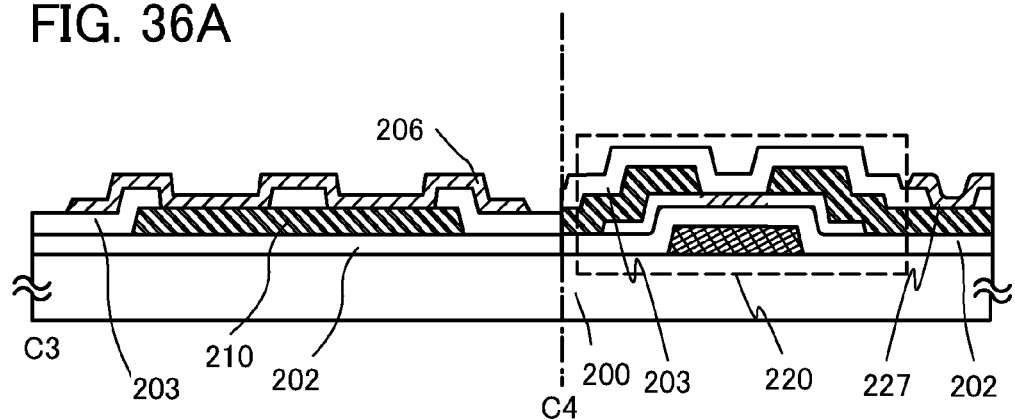
FIGS. 36A and 36B illustrate a semiconductor device.

FIG. 36A is a cross-sectional view of a semiconductor device in which a thin film transistor and a common connection portion are formed over the same substrate.

In FIG. 36A, a thin film transistor 220 electrically connected to a pixel electrode layer 227 is a channel etched thin film transistor and is provided in the pixel portion. In this embodiment, the thin film transistor 220 has the same structure as the thin film transistor 170 of Embodiment 1.

Figure 36B:
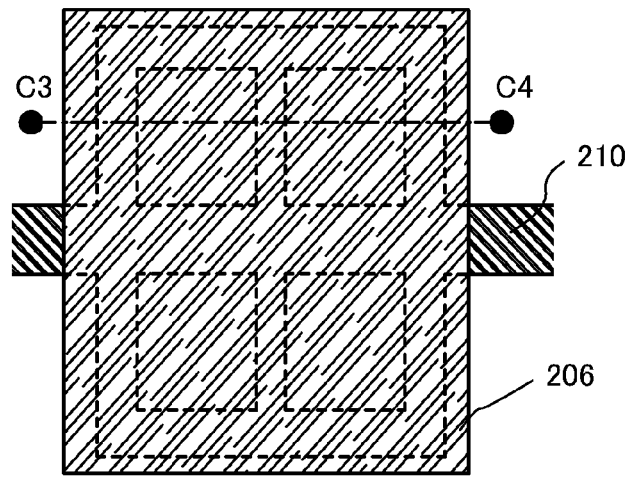

FIG. 36B illustrates an example of a top view of the common connection portion, and a cross section of the common connection portion taken along dashed line C3-C4 in FIG. 36B corresponds to FIG. 36A. Note that in FIG. 36B, the same portions as those in FIG. 36A are denoted by the same reference numerals.

A common potential line 210 is provided over a gate insulating layer 202, and formed using the same material and step as those of the source electrode layer and the drain electrode layer of the thin film transistor 220.

Further, the common potential line 210 is covered with a protective insulating layer 203. The protective insulating layer 203 has a plurality of opening portions overlapping with the common potential line 210. These opening portions are formed in the same step as that of the contact hole that connects the drain electrode layer of the thin film transistor 220 to the pixel electrode layer 227.

Note that because of a significant difference in area size, the term "contact hole" in the pixel portion and the term "opening portion" in the common connection portion are distinctively used here. Further, in FIG. 36A, the pixel portion and the common connection portion are not illustrated on the same scale. For example, the length of the dashed line C3-C4 in the common connection portion is approximately 500 μm while the width of the thin film transistor is less than 50 μm; thus, the common connection portion actually has ten times or more as large area as the thin film transistor. However, for simplicity, the pixel portion and the common connection portion are illustrated on different scales in FIG. 36A.

A common electrode layer 206 is provided over the protective insulating layer 203, and formed using the same material and step as those of the pixel electrode layer 227 in the pixel portion.

In this manner, the common connection portion is manufactured in the same process as the switching element in the pixel portion. The common potential line preferably has a structure capable of reducing wiring resistance as a metal wiring.

The first substrate provided with the pixel portion and the common connection portion and the second substrate having the counter electrode are fixed with the sealant.

When the sealant contains conductive particles, the pair of substrates are aligned so that the sealant overlaps with the common connection portion. For example, in a small-sized liquid crystal panel, two common connection portions are arranged so as to overlap with the sealant at opposite corners of the pixel portion or the like. In a large-sized liquid crystal panel, four or more common connection portions are arranged so as to overlap with the sealant.

Note that the common electrode layer 206 is an electrode in contact with the conductive particles contained in the sealant, and is electrically connected to the counter electrode of the second substrate.

When a liquid crystal injection method is used, the pair of substrates are fixed with the sealant, and then liquid crystal is injected between the pair of substrates. Alternatively, when a liquid crystal dropping method is used, the sealant is drawn on the second substrate or the first substrate, liquid crystal is dropped thereon, and then the pair of substrates are bonded to each other under reduced pressure.

An example of the common connection portion electrically connected to the counter electrode is described in this embodiment; however, without any limitation thereto, such a common connection portion can be used as a connection portion connected to any other wiring, an external connection terminal, or the like.

This embodiment can be implemented in appropriate combination with any of the structures described in the other embodiments.

Embodiment 5

Figure 10:
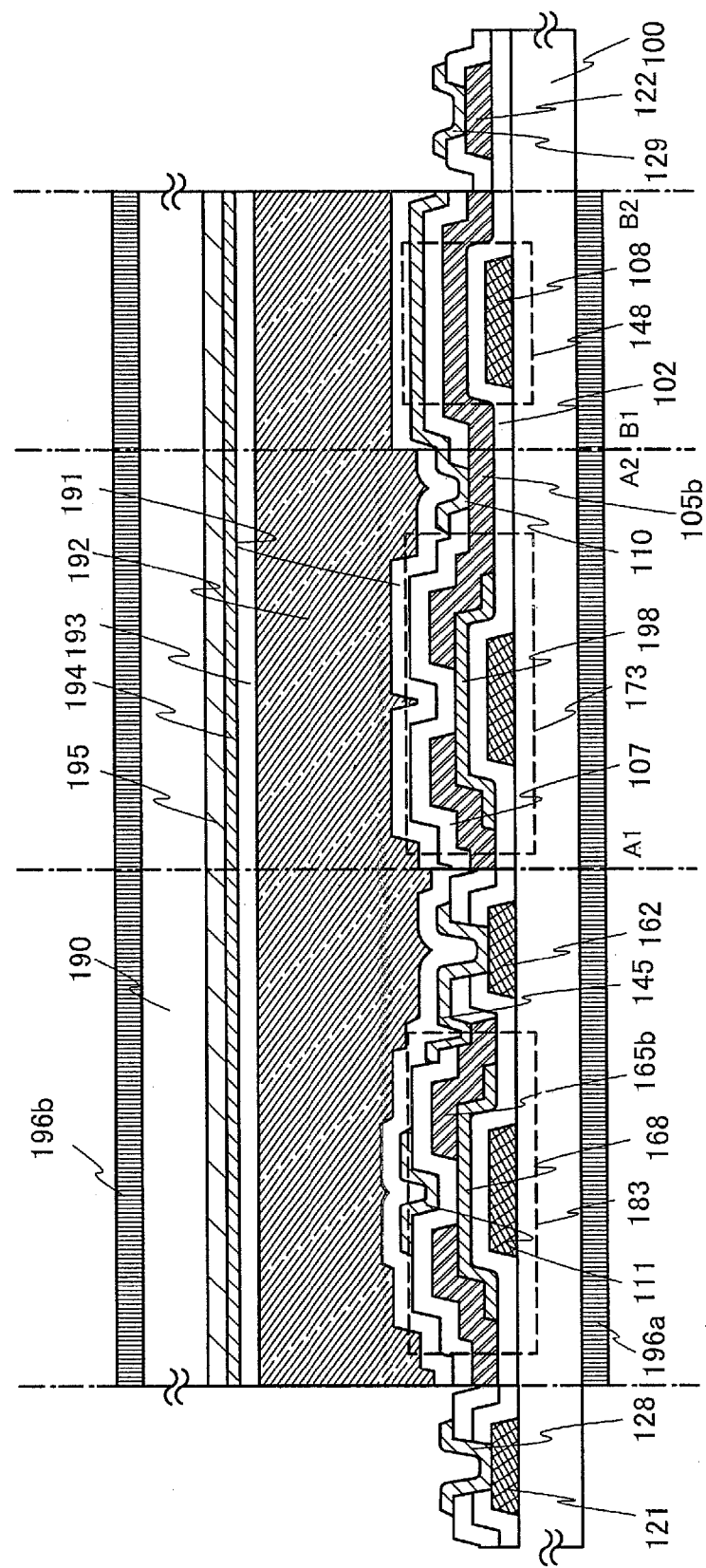
FIG. 10 illustrates a semiconductor device.

In this embodiment, an example of a manufacturing process of a thin film transistor, which is partly different from that of Embodiment 1, will be described with reference to FIG. 10. FIG. 10 is the same as FIG. 1, FIGS. 2A to 2C, FIGS. 3A to 3C, FIGS. 4A to 4C, and FIG. 5 except some differences in the process. Therefore, the same portions are denoted by the same reference numerals, and detailed description of the same portions is omitted.

First, in accordance with Embodiment 1, gate electrode layers, a gate insulating layer, and the oxide semiconductor film 130 are formed over a substrate, and the oxide semiconductor film 130 is processed into the island-shaped oxide semiconductor layers 131 and 132 by a second photolithography step.

Next, dehydration or dehydrogenation of the oxide semiconductor layers 131 and 132 is performed. The temperature of first heat treatment for dehydration or dehydrogenation is set at higher than or equal to 400° C. and lower than a strain point of the substrate, preferably 425° C. or higher. Note that the heat treatment time may be 1 hour or shorter when the temperature of the heat treatment is 425° C. or higher, but is set to longer than 1 hour when the temperature of the heat treatment is lower than 425° C. In this embodiment, the substrate is introduced into an electric furnace, which is one of heat treatment apparatuses, and heat treatment is performed on the oxide semiconductor layers in a nitrogen atmosphere. Then, the oxide semiconductor layers are not exposed to air, which prevents water or hydrogen from being contained again in the oxide semiconductor layers. In this manner, oxide semiconductor layers are obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas and the $N_2O$ gas do not include water, hydrogen, and the like. Alternatively, the purity of an oxygen gas or an $N_2O$ gas which is introduced into the heat treatment apparatus is preferably 6N (99.9999%) or higher, more preferably 7N (99.99999%) or higher (that is, the impurity concentration of the oxygen gas or the $N_2O$ gas is 1 ppm or lower, preferably 0.1 ppm or lower).

The heat treatment apparatus is not limited to the electric furnace, and for example may be an RTA (rapid thermal annealing) apparatus such as a GRTA (gas rapid thermal annealing) apparatus or an LRTA (lamp rapid thermal annealing) apparatus. An LRTA apparatus is an apparatus for heating a process object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. Further, the LRTA apparatus may have not only a lamp but also a device for heating a process object by heat conduction or heat radiation from a heating element such as a resistance heating element. GRTA is a method of heat treatment using a high-temperature gas. As the gas, an inert gas which does not react with a process object by heat treatment, such as nitrogen or a rare gas such as argon is used. The heat treatment may be performed at 600° C. to 750° C. for several minutes using an RTA method.

Further, after the first heat treatment for dehydration or dehydrogenation, heat treatment may be performed at higher than or equal to 200° C. and lower than or equal to 400° C., preferably higher than or equal to 200° C. and lower than or equal to 300° C., in an atmosphere of an oxygen gas or an $N_2O$ gas.

Alternatively, the first heat treatment can be performed on the oxide semiconductor film 130 before being processed into the island-shaped oxide semiconductor layers 131 and 132, instead of on the island-shaped oxide semiconductor layers 131 and 132. In that case, after the first heat treatment, the substrate is taken out of the heating apparatus and subjected to a photolithography step.

Through the above process, the entire region of the oxide semiconductor film is made in an oxygen-excess state, whereby higher resistance (i-type conductivity) is obtained. Accordingly, oxide semiconductor layers 168 and 198 whose entire region has i-type conductivity are formed.

Next, resist masks are formed over the oxide semiconductor layers 168 and 198 by a third photolithography step, and selective etching is performed to form a source electrode layer and a drain electrode layer. Then, the oxide insulating film 107 is formed by a sputtering method.

Next, in order to reduce variation in electric characteristics of the thin film transistors, heat treatment (preferably at higher than or equal to 150° C. and lower than 350° C.) may be performed in an inert gas atmosphere or a nitrogen gas atmosphere. For example, heat treatment is performed at 250° C. for 1 hour in a nitrogen atmosphere.

Resist masks are formed by a fourth photolithography step, and selective etching is performed to form contact holes reaching the first terminal 121, the conductive layer 162, the drain electrode layer 105b, and the second terminal 122 in the gate insulating layer and the oxide insulating film. After a light-transmitting conductive film is formed, resist masks are formed by a fifth photolithography step, and selective etching is performed to form the pixel electrode layer 110, the conductive layer 111, the terminal electrode 128, the terminal electrode 129, and a wiring layer 145.

This embodiment shows an example in which the first terminal 121 and the terminal electrode 128 are directly connected to each other without the connection electrode 120 interposed therebetween. In addition, the drain electrode layer 165b and the conductive layer 162 are connected to each other through the wiring layer 145.

In a capacitor portion, a capacitor 148 which is formed from the stack of the capacitor wiring 108, the gate insulating layer 102, a metal conductive layer formed in the same step as that of the source electrode layer and the drain electrode layer, the oxide insulating film 107, and the pixel electrode layer 110 is formed.

Through the above-described steps, a thin film transistor 183 and a thin film transistor 173 can be manufactured in a driver circuit portion and a pixel portion, respectively, over one substrate.

In a similar manner to that of Embodiment 1, the counter substrate 190 is attached to the substrate 100 with the liquid crystal layer 192 interposed therebetween; thus, a liquid crystal display device of this embodiment is manufactured (see FIG. 10).

This embodiment can be implemented in appropriate combination with any of the structures described in the other embodiments.

Embodiment 6

In this embodiment, an example will be described below in which at least some of driver circuits and a thin film transistor disposed in a pixel portion are formed over one substrate.

The thin film transistor disposed in the pixel portion is formed in accordance with any of Embodiments 1, 2, 3, 4, and 5. Since the thin film transistor described in any of Embodiments 1, 2, 3, 4, and 5 is an n-channel TFT, some of driver circuits that can be constituted by n-channel TFTs among the driver circuits are formed over the substrate where the thin film transistor in the pixel portion is formed.

Figure 12A:
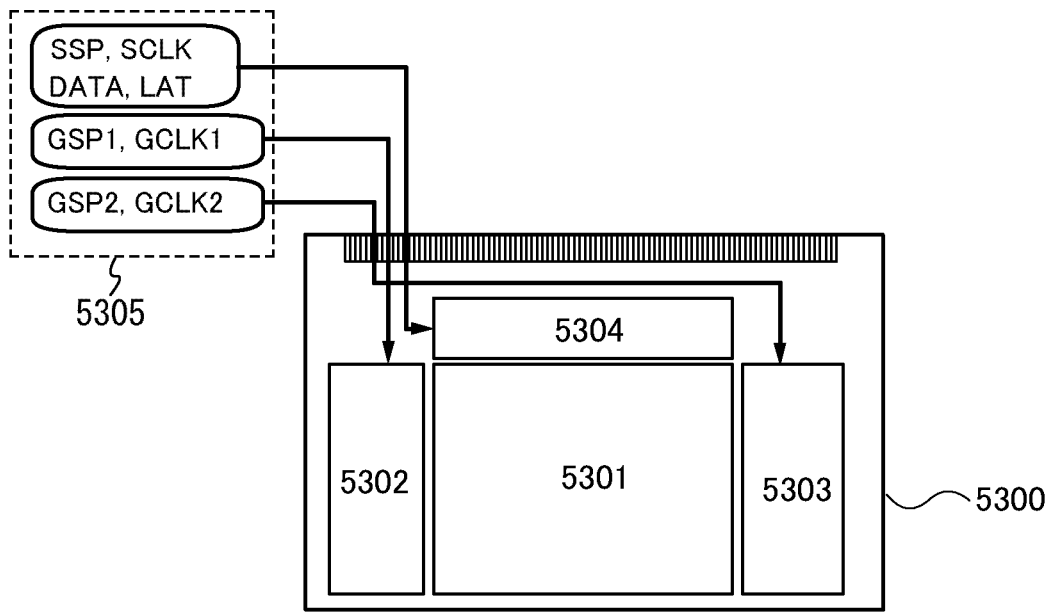
FIGS. 12A and 12B are block diagrams each illustrating a semiconductor device.

FIG. 12A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that in cross regions of the scan lines and the signal lines, pixels each having a display element are arranged in a matrix. The substrate 5300 of the display device is connected to a timing control circuit 5305 (also referred to as a controller or a control IC) through a connection portion such as a flexible printed circuit (FPC).

In FIG. 12A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that cost can be reduced. Moreover, the number of connections in the connection portion which are formed when wirings are extended from a driver circuit provided outside the substrate 5300 can be reduced, and the reliability or yield can be increased.

Note that the timing control circuit 5305 supplies, for example, a first scan line driver circuit start signal (GSP1) and a scan line driver circuit clock signal (GCLK1) to the first scan line driver circuit 5302. Furthermore, the timing control circuit 5305 supplies, for example, a second scan line driver circuit start signal (GSP2) (which is also referred to as a start pulse) and a scan line driver circuit clock signal (GCLK2) to the second scan line driver circuit 5303. Moreover, the timing control circuit 5305 supplies a signal line driver circuit start signal (SSP), a signal line driver circuit clock signal (SCLK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 12B:
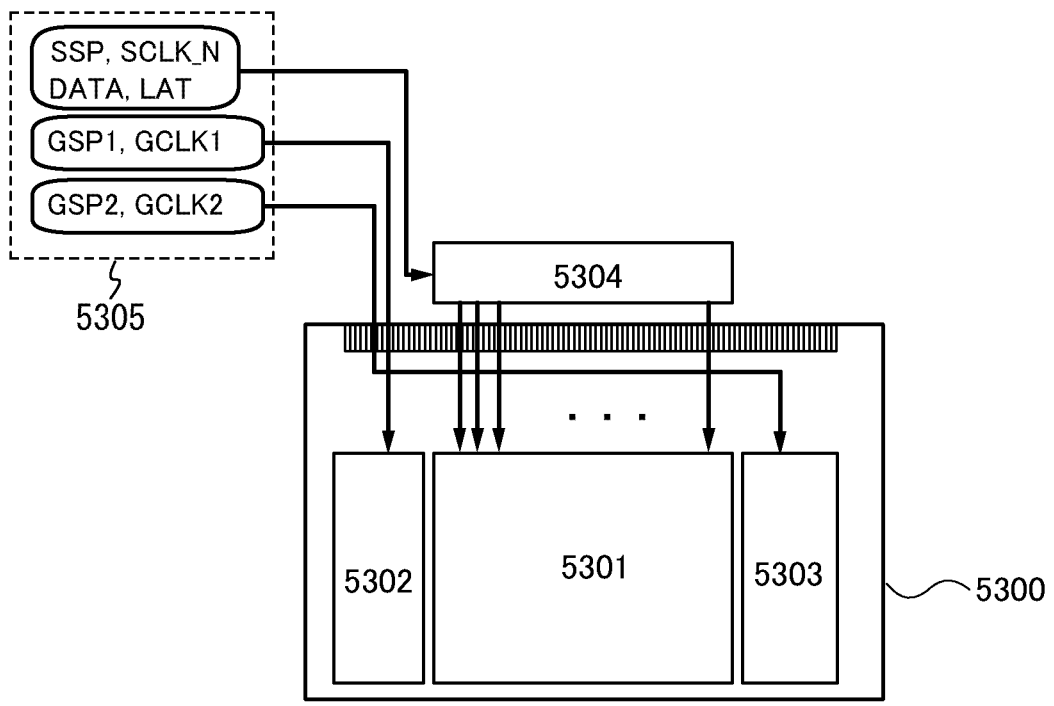

FIG. 12B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor. Thus, increase in size of the display device, reduction in cost, improvement in yield, or the like can be achieved.

Figure 13A:
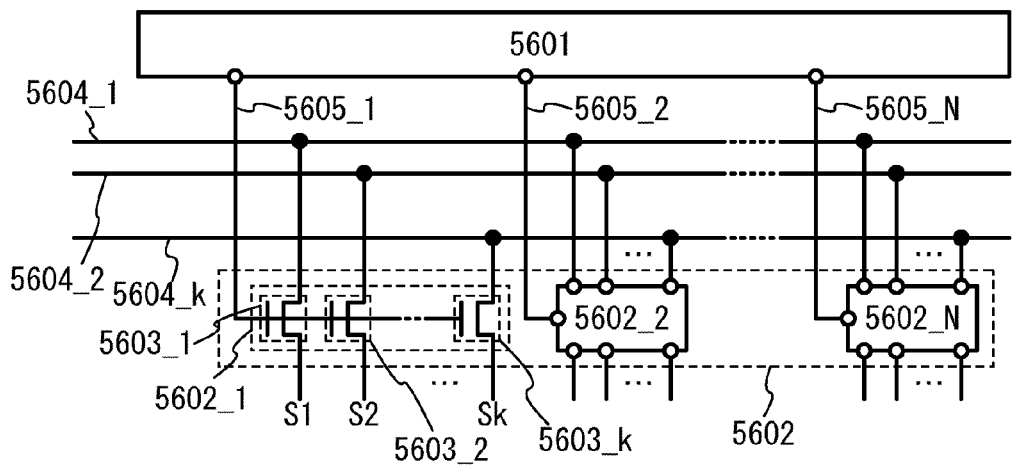
FIGS. 13A and 13B show a configuration of a signal line driver circuit.
Figure 13B:
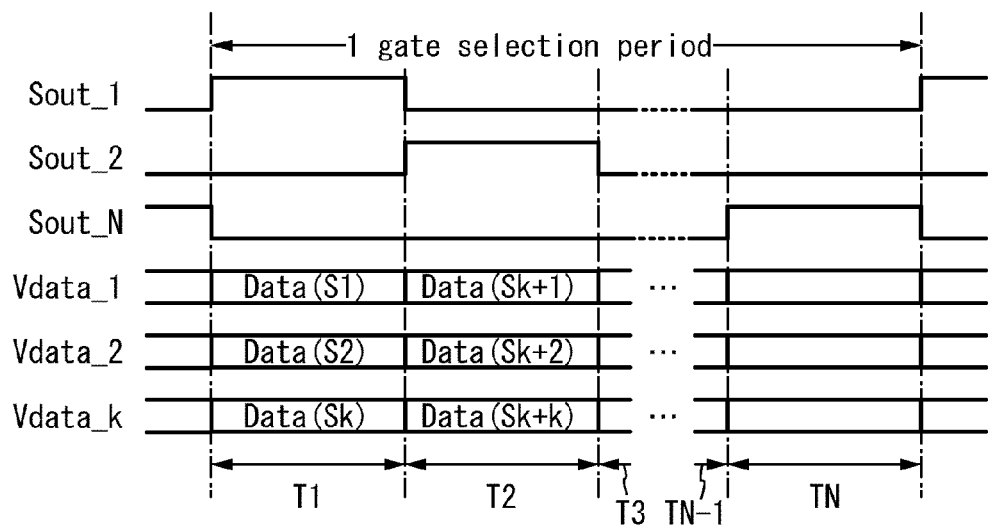

The thin film transistors described in Embodiments 1, 2, 3, 4, and 5 are n-channel TFTs. FIGS. 13A and 13B illustrate an example of a configuration and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ ($k$ is a natural number). The example where the thin film transistors 5603_1 to 5603_$k$ are n-channel TFTs is described below.

A connection relation in the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has a function of controlling electrical continuity between the wirings 5604_1 to 5604_$k$ and the signal lines S1 to Sk (electrical continuity between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Moreover, the thin film transistors 5603_1 to 5603_$k$ have functions of controlling conduction states between the wirings 5604_1 to 5604_$k$ and the signal lines S1 to Sk, respectively, that is, functions of supplying potentials of the wirings 5604_1 to 5604_$k$ to the signal lines S1 to Sk, respectively. In this manner, each of the thin film transistors 5603_1 to 5603_$k$ functions as a switch.

The video signal data (DATA) is input to each of the wirings 5604_1 to 5604_$k$. The video signal data (DATA) is often an analog signal that corresponds to an image signal or image data.

Next, the operation of the signal line driver circuit in FIG. 13A is described with reference to a timing chart in FIG. 13B. FIG. 13B illustrates examples of signals Sout_1 to Sout_N and signals Vdata_1 to Vdata_$k$. The signals Sout_1 to Sout_N are examples of output signals from the shift register 5601. The signals Vdata_1 to Vdata_$k$ are examples of signals input to the wirings 5604_1 to 5604_$k$. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603__k are turned on, so that the wirings 5604_1 to 5604__k and the signal lines S1 to Sk are brought into conduction. At this time, Data(S1) to Data(Sk) are input to the wirings 5604_1 to 5604__k, respectively. The Data(S1) to Data(Sk) are written into pixels in a first to kth columns in the selected row through the thin film transistors 5603_1 to 5603__k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when a video signal is written into pixels by a plurality of columns; thus, insufficient writing of a video signal can be prevented.

Note that any of the circuits constituted by the thin film transistors in any of Embodiments 1, 2, 3, 4 and 5 can be used for the shift register 5601 and the switching circuit 5602. In that case, the shift register 5601 can be constituted by only n-channel transistors.

One embodiment of a shift register which is used for part of the scan line driver circuit and/or the signal line driver circuit is described with reference to FIGS. 14A to 14D and FIGS. 15A and 15B.

The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply large current is used.

The shift register includes first to N-th pulse output circuits 10_1 to 10_N (N is a natural number greater than or equal to 3) (see FIG. 14A). In the shift register illustrated in FIG. 14A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to N-th pulse output circuits 10_1 to 10_N. A start pulse SP1 (a first start pulse) is input from a fifth wiring 15 to the first pulse output circuit 10_1. To the n-th pulse output circuit 10__n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2 and less than or equal to N) is input. To the first pulse output circuit 10_1, a signal from the third pulse output circuit 10_3 of the stage following the next stage is input. Similarly, to the n-th pulse output circuit 10__n of the second or subsequent stage, a signal from the (n+2)-th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage and second output signals (OUT(1) to OUT(N)) to be input to another circuit or the like. Note that since the subsequent-stage signal OUT(n+2) is not input to the last two stages of the shift register as illustrated in FIG. 14A, a second start pulse SP2 and a third start pulse SP3 may be input to the pulse output circuits of the last two stages, for example.

Note that a clock signal (CK) is a signal that alternates between an H level and an L level (also referred to as an L signal or a signal at low power supply potential level) at regular intervals. Here, the first clock signal (CK1) to the fourth clock signal (CK4) are sequentially deviated by ¼ cycle. In this embodiment, driving or the like of the pulse output circuit is controlled with the first to fourth clock signals (CK1) to (CK4). Note that the clock signal is also referred to as GCLK or SCLK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 14A, the first input terminal 21 is electrically connected to the first wiring 11, the second input terminal 22 is electrically connected to the second wiring 12, and the third input terminal 23 is electrically connected to the third wiring 13. In the second pulse output circuit 102, the first input terminal 21 is electrically connected to the second wiring 12, the second input terminal 22 is electrically connected to the third wiring 13, and the third input terminal 23 is electrically connected to the fourth wiring 14.

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 14B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1) (SR) is output from the first output terminal 26; and the second output signal OUT(1) is output from the second output terminal 27.

In the first to N-th pulse output circuits 10_1 to 10_N, the thin film transistor (TFT) having four terminals described in the above embodiment can be used in addition to a thin film transistor having three terminals. FIG. 14C illustrates the equivalent circuit of a thin film transistor 28 having four terminals, which is described in the above embodiment. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the four-terminal thin film transistor 28 can be controlled to be a desired level by controlling a potential of an upper gate electrode and/or a lower gate electrode.

Next, an example of a specific circuit configuration of the pulse output circuit illustrated in FIG. 14B will be described with reference to FIG. 14D.

The pulse output circuit illustrated in FIG. 14D includes a first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 14D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. Note that a thin film transistor having four terminals is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected depending on a control signal of the gate electrode, and can reduce a malfunction of the pulse output circuit by quick response (sharp rising of on-current) to the control signal input to the gate electrode. By using the thin film transistor having four terminals, the threshold voltage can be controlled, and a malfunction of the pulse output circuit can be further reduced.

In FIG. 14D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 14D, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Figure 15A:
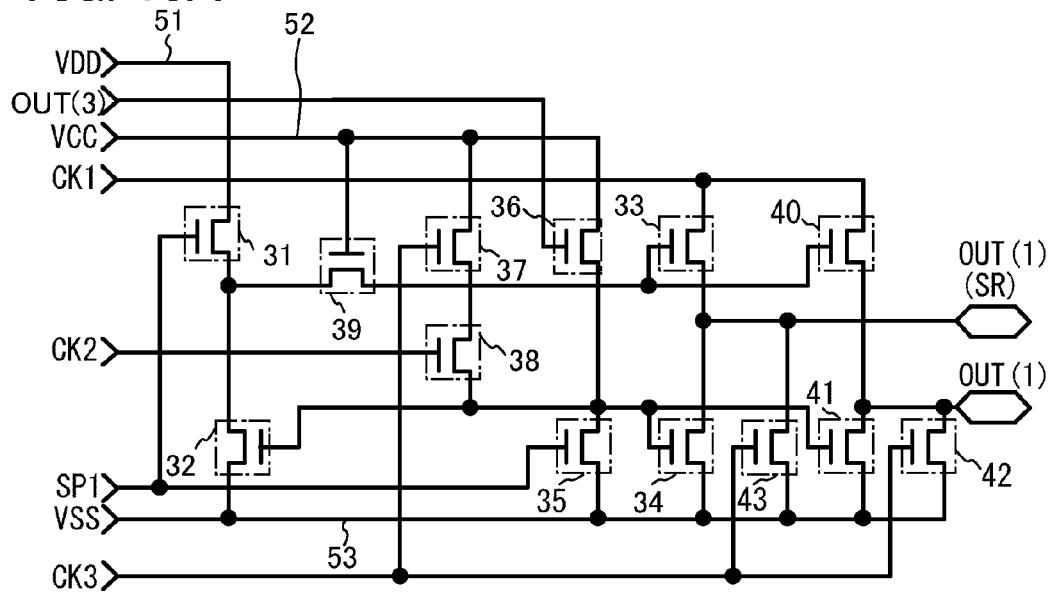
FIG. 15A shows a circuit diagram showing a configuration of a shift register and FIG. 15B shows a timing chart of operation of the shift register.

FIG. 15A illustrates signals that are input to or output from the first to fifth input terminals 21 to 25 and the first and second output terminals 26 and 27 in the case where the pulse output circuit illustrated in FIG. 14D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel formation region formed in a region overlapping with the gate. Current that flows between the drain and the source through the channel formation region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 14D and FIG. 15A, a capacitor for performing bootstrap operation by bringing the node A into a floating state may be additionally provided. Furthermore, a capacitor having one electrode electrically connected to the node B may be additionally provided in order to hold a potential of the node B.

Figure 15B:
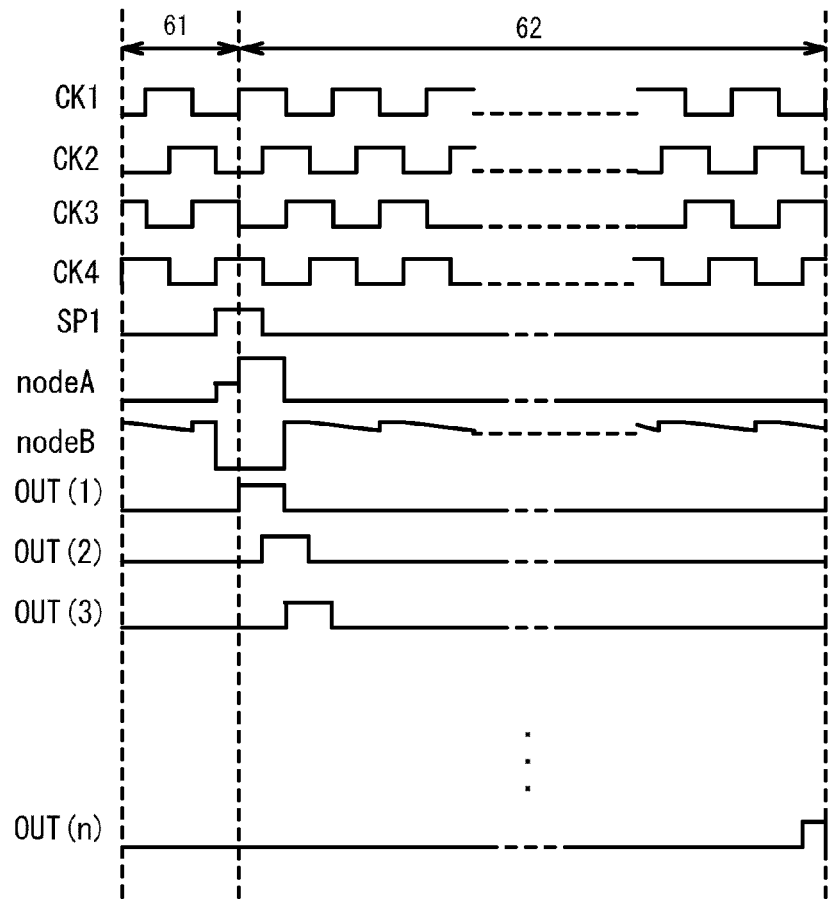

FIG. 15B is a timing chart of a shift register including a plurality of pulse output circuits illustrated in FIG. 15A. Note that when the shift register is included in a scan line driver circuit, a period 61 in FIG. 15B corresponds to a vertical retrace period and a period 62 corresponds to a gate selection period.

Note that by providing the ninth transistor 39 in which the second power supply potential VCC is applied to the gate as illustrated in FIG. 15A, the following advantages before and after bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31. Consequently, in the first transistor 31, high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, provision of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the transistor including an oxide semiconductor less deteriorates by application of a high potential to a gate electrode as compared to a transistor including amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 may be supplied from the second input terminal 22 and the third input terminal 23, respectively. In the shift register illustrated in FIG. 15A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in shift register illustrated in FIG. 15A, both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by fall in potentials of the second input terminal 22 and the third input terminal 23, is caused only once by fall in potential of the gate electrode of the eighth transistor 38. Therefore, such a connection relation that the clock signal CK3 is supplied from the third input terminal 23 to the gate electrodes (the lower gate electrode and the upper gate electrode) of the seventh transistor 37 and the clock signal CK2 is supplied from the second input terminal 22 to the gate electrodes (the lower gate electrode and the upper gate electrode) of the eighth transistor 38, is preferable. That is because the number of times of the change in the potential of the node B can be reduced, whereby the noise can be decreased.

In such a manner, an H-level signal is regularly supplied to the node B in a period during which the potentials of the first output terminal 26 and the second output terminal 27 are held at an L level; thus, a malfunction of the pulse output circuit can be suppressed.

Embodiment 7

By manufacturing thin film transistors and using the thin film transistors for a pixel portion and driver circuits, a semiconductor device having a display function (also referred to as a display device) can be manufactured. Moreover, some or all of the driver circuits which include the thin film transistors can be formed over a substrate where the pixel portion is formed, whereby a system-on-panel can be obtained.

The display device includes a display element. Examples of the display element include a liquid crystal element (also referred to as a liquid crystal display element). Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 16A to 16C. FIGS. 16A and 16B are plan views of panels in which thin film transistors 4010 and 4011 and a liquid crystal element 4013 are sealed between a first substrate 4001 and a second substrate 4006 with a sealant 4005. FIG. 16C is a cross-sectional view taken along M-N in FIGS. 16A and 16B.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 16A illustrates an example in which the signal line driver circuit 4003 is mounted by a COG method. FIG. 16B illustrates an example in which the signal line driver circuit 4003 is mounted by a TAB method.

The pixel portion 4002 and the scan line driver circuit 4004 provided over the first substrate 4001 include a plurality of thin film transistors. FIG. 16C illustrates the thin film transistor 4010 included in the pixel portion 4002 and the thin film transistor 4011 included in the scan line driver circuit 4004, as an example. Protective insulating layers 4020 and 4021 are provided over the thin film transistors 4010 and 4011.

As the thin film transistors 4010 and 4011, any of the highly reliable thin film transistors including the oxide semiconductor layer, which are described in Embodiments 1 to 5, can be employed. As the thin film transistor 4011 used for the driver circuit, any of the thin film transistors 180, 181, 182, and 183 described in Embodiments 1 to 5 can be employed. As the thin film transistor 4010 used for a pixel, any of the thin film transistors 170, 171, 172, and 173 described in Embodiments 1 to 5 can be employed. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided in the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Further, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

Note that a light-transmitting substrate can be used as the first substrate 4001 and the second substrate 4006; glass, ceramics, or plastics can be used. The plastic may be a fiberglass-reinforced plastics (FRP) plate, a polyvinyl fluoride (PVF) film, a polyester film, or an acrylic resin film.

Reference numeral 4035 is a columnar spacer which is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

Although a polarizing plate is provided on the outer surface of the substrate (on the viewer side) and a coloring layer (a color filter) and an electrode layer used for a display element are sequentially provided on the inner surface of the substrate in the example of the liquid crystal display device, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

Further, the insulating layer 4020 is formed over the thin film transistors 4010 and 4011. The insulating layer 4020 can be formed using a material and a method similar to those of the oxide insulating film 107 described in Embodiment 1. Here, a silicon oxide film is formed by a sputtering method as the insulating layer 4020.

Further, a protective insulating layer may be formed over the insulating layer 4020. Here, a silicon nitride film is formed by an RF sputtering method as the protective insulating layer (not illustrated).

The insulating layer 4021 is formed as the planarization insulating film. The insulating layer 4021 can be formed using a material and a method which are similar to those of the planarization insulating layer 109 described in Embodiment 2, and a heat-resistant organic material such as acrylic, polyimide, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using these materials.

The formation method of the insulating layer 4021 is not limited to a particular method, and the following method can be used depending on the material: a sputtering method, an SOG method, a spin coating method, a dipping method, a spray coating method, a droplet discharge method (such as an inkjet method, screen printing, offset printing, or the like), or the like. Further, the planarization insulating layer 4021 can be formed with a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a light transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed and the scan line driver circuit 4004 or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistor 4011.

Note that FIGS. 16A, 16B, and 16C illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 17:
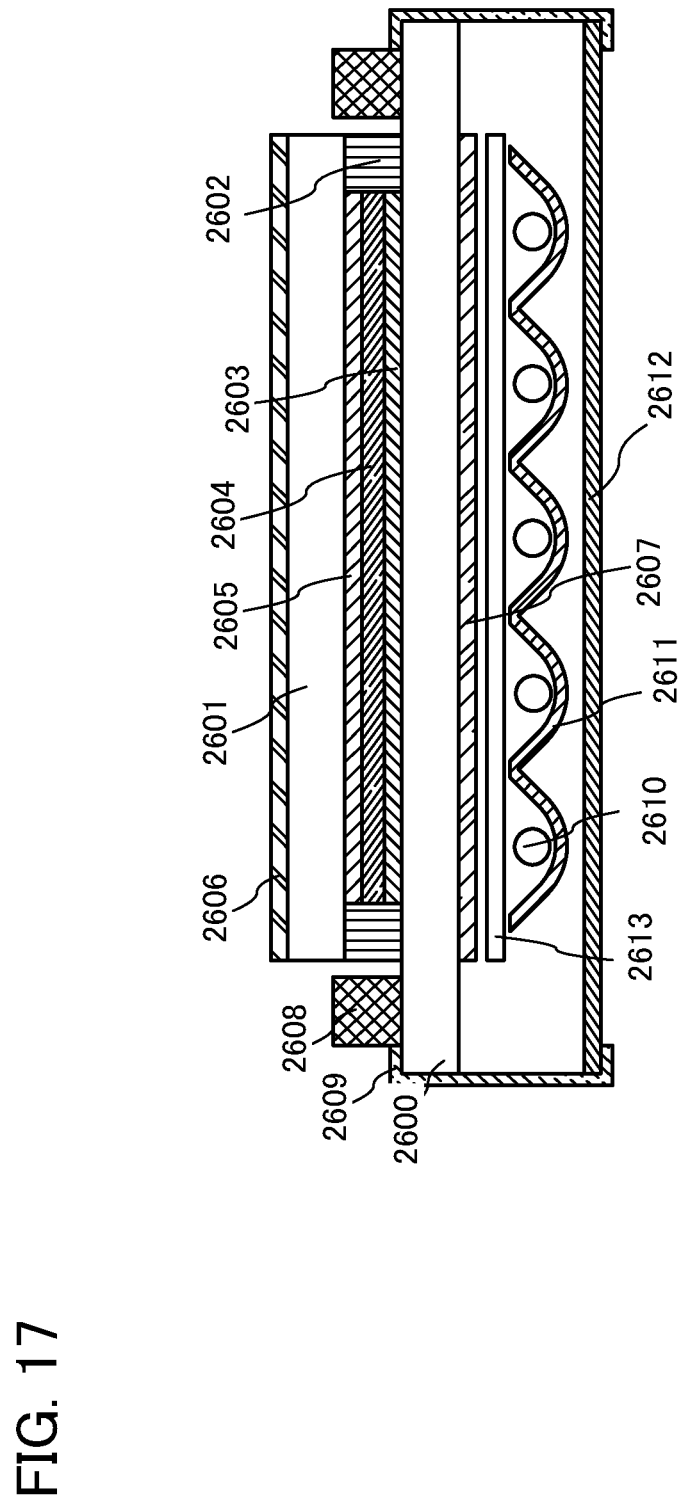
FIG. 17 illustrates a semiconductor device.

FIG. 17 illustrates an example of a liquid crystal display module which is formed as a semiconductor device using a TFT substrate 2600 manufactured according to the manufacturing method disclosed in this specification.

FIG. 17 illustrates an example of the liquid crystal display module, in which the TFT substrate 2600 and a counter substrate 2601 are bonded to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above process, a highly reliable liquid crystal display panel as a semiconductor device can be manufactured.

This embodiment can be implemented in appropriate combination with any of the structures described in the other embodiments.

Embodiment 8

A semiconductor device disclosed in this specification can be applied to display portions of an electronic book reader (an e-book reader), a poster, an advertisement in a vehicle such as a train, a variety of cards such as a credit card, and the like. Examples of the electronic appliances are illustrated in FIG. 18.

FIG. 18 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where different images are displayed, for example, text can be displayed on a display portion on the right side (the display portion 2705 in FIG. 18) and graphics can be displayed on a display portion on the left side (the display portion 2707 in FIG. 18).

FIG. 18 illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Embodiment 9

A semiconductor device disclosed in this specification can be applied as a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 19A:
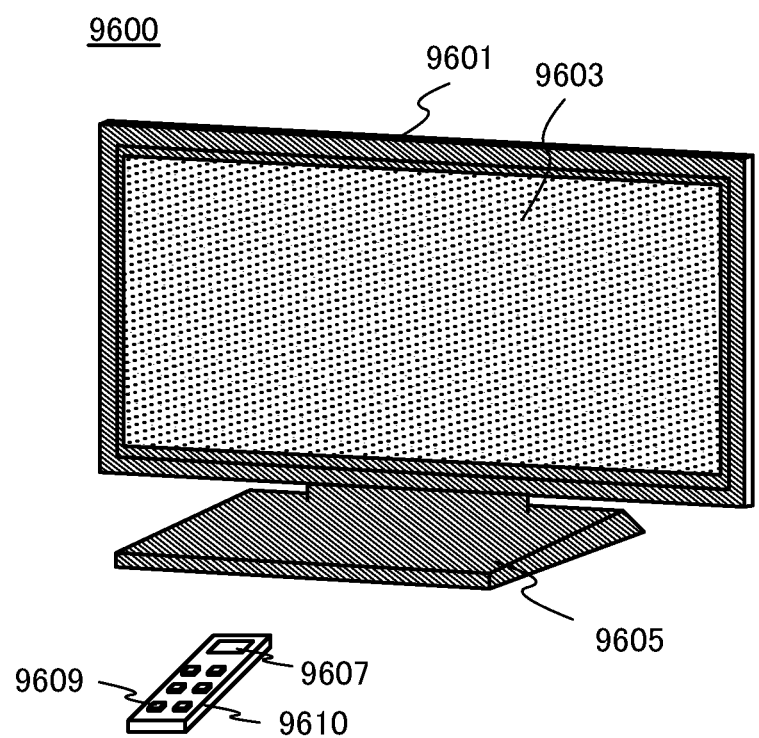
FIGS. 19A and 19B are external views of an example of a television set and an example of a digital photo frame, respectively.

FIG. 19A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 19B:
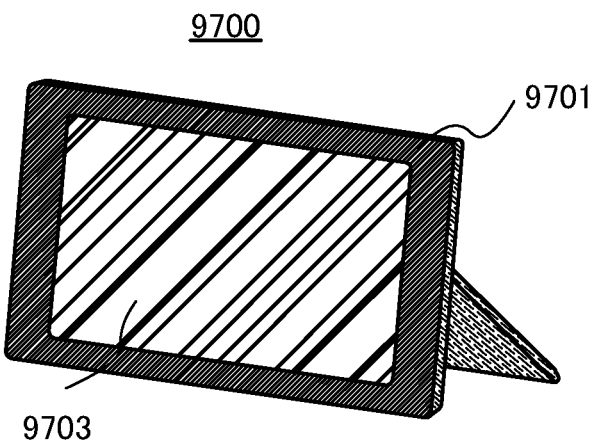

FIG. 19B illustrates an example of a digital photo frame. For example, in a digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 20A:
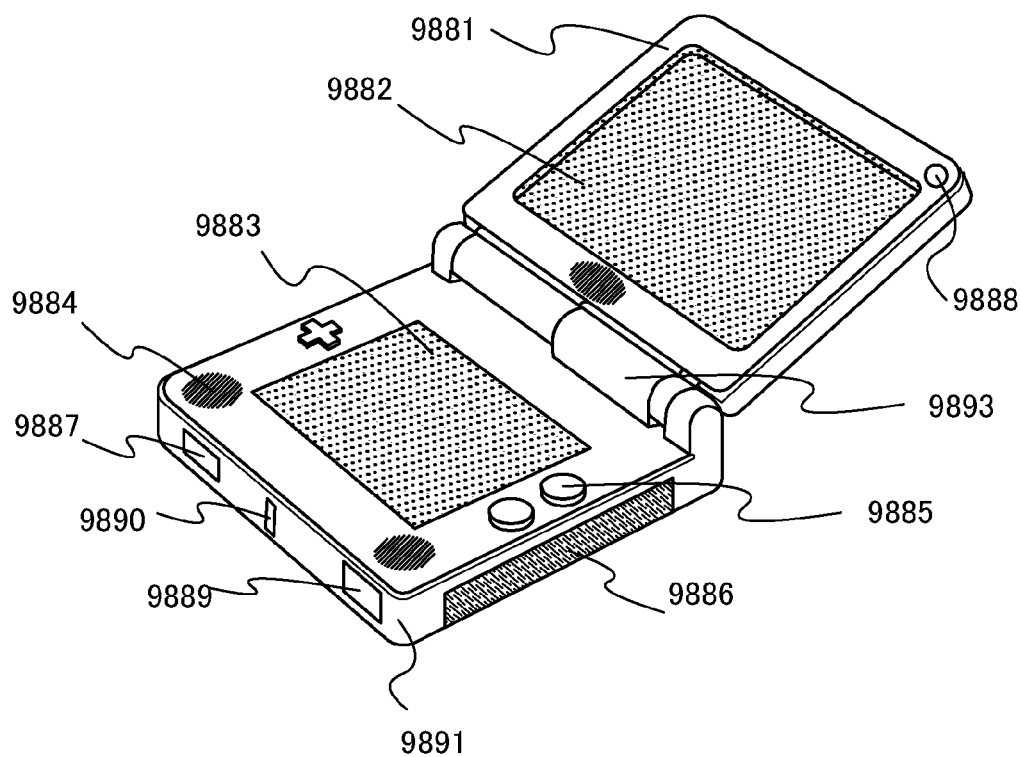
FIGS. 20A and 20B are external views of examples of game machines.

FIG. 20A illustrates a portable amusement machine including two housings, a housing 9881 and a housing 9891. The housings 9881 and 9891 are connected with a joint portion 9893 so as to be opened and closed. A display portion 9882 and a display portion 9883 are incorporated in the housing 9881 and the housing 9891, respectively. In addition, the portable amusement machine illustrated in FIG. 20A includes a speaker portion 9884, a recording medium insertion portion 9886, an LED lamp 9890, input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and other structures provided with at least a semiconductor device disclosed in this specification may be employed. The portable amusement machine can include other accessory equipment as appropriate. The portable amusement machine illustrated in FIG. 20A has a function of reading a program or data stored in a recording medium to display it on the display portion, and a function of sharing information with another portable amusement machine by wireless communication. The portable amusement machine illustrated in FIG. 20A can have various functions without limitation to the above.

Figure 20B:
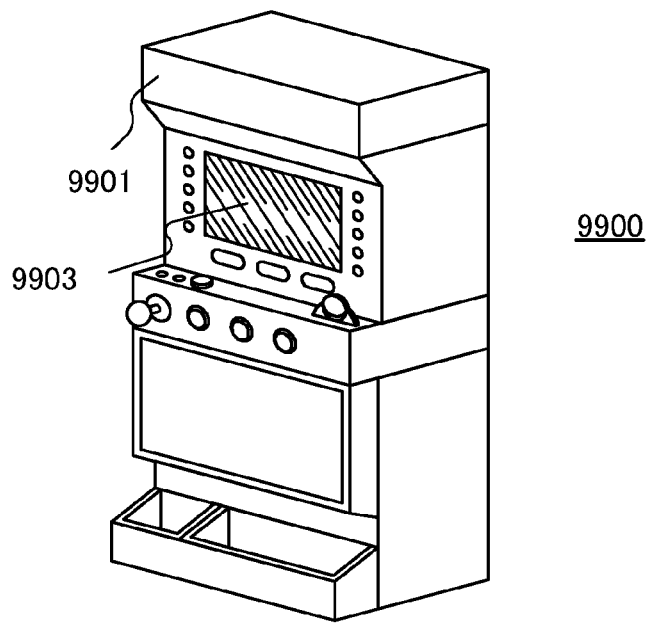

FIG. 20B illustrates an example of a slot machine which is a large-sized amusement machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 can include other accessory equipment as appropriate.

Figure 21A:
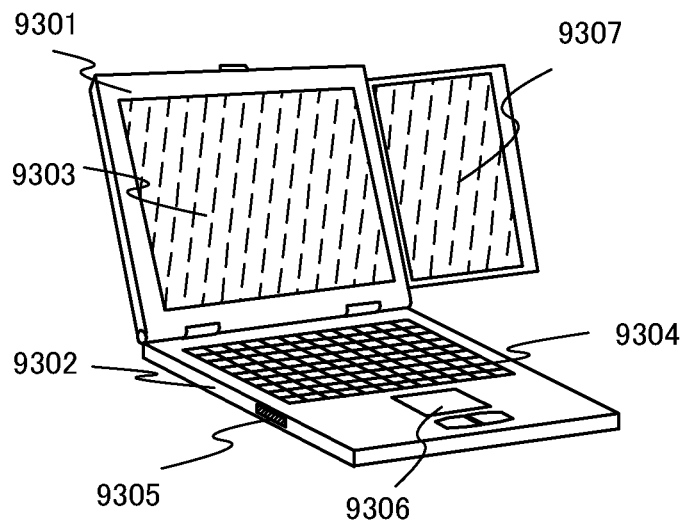
FIGS. 21A and 21B are external views of an example of a portable computer and an example of a cellular phone, respectively.

FIG. 21A is a perspective view illustrating an example of a portable computer.

In the portable computer of FIG. 21A, a top housing 9301 having a display portion 9303 and a bottom housing 9302 having a keyboard 9304 can overlap with each other by closing a hinge unit which connects the top housing 9301 and the bottom housing 9302. The portable computer of FIG. 21A is convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device such as a liquid crystal display panel.

In addition, the portable computer of FIG. 21A can be provided with a receiver and the like and can receive a television broadcast to display an image on the display portion 9303 or the display portion 9307. In the state where the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit for displaying a television broadcast is performed. Therefore, power consumption can be minimized, which is useful for the portable computer whose battery capacity is limited.

Figure 21B:
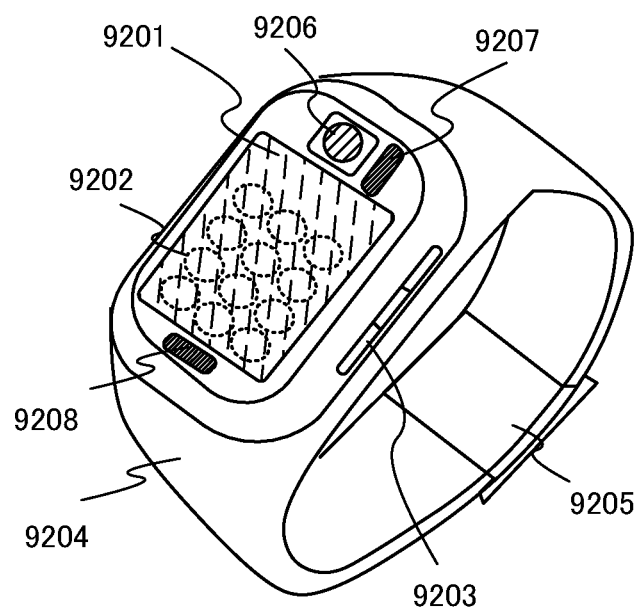

FIG. 21B is a perspective view illustrating an example of a cellular phone that the user can wear on the wrist like a wristwatch.

This cellular phone includes a main body which includes a communication device having at least a telephone function, and battery; a band portion 9204 which enables the main body to be worn on the wrist; an adjusting portion 9205 for adjusting the fixation of the band portion fixed for the wrist; a display portion 9201; a speaker 9207; and a microphone 9208.

In addition, the main body includes operation switches 9203. The operation switches 9203 serve, for example, as a switch for starting a program for the Internet when the switch is pushed, in addition to serving as a switch for turning on a power source, a switch for shifting a display, a switch for instructing to start taking images, or the like, and can be used so as to correspond to each function.

Input to this cellular phone is performed by touching the display portion 9201 with a finger, an input pen, or the like, operating the operation switches 9203, or inputting voice into the microphone 9208. Note that displayed buttons 9202 which are displayed on the display portion 9201 are illustrated in FIG. 21B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 21B can be provided with a receiver of a television broadcast and the like, and can display an image on the display portion 9201 by receiving a television broadcast. In addition, the cellular phone illustrated in FIG. 21B can be provided with a memory device and the like such as a memory, and can record a television broadcast in the memory. The cellular phone illustrated in FIG. 21B may have a function of collecting location information such as GPS.

An image display device such as a liquid crystal display panel is used as the display portion 9201. The cellular phone illustrated in FIG. 21B is compact and lightweight, and the battery capacity thereof is limited. Therefore, a panel which can be driven with low power consumption is preferably used as a display device for the display portion 9201.

Note that FIG. 21B illustrates the electronic appliance which is worn on the wrist; however, this embodiment is not limited thereto as long as a portable shape is employed.

Embodiment 10

In this embodiment, an example of a display device including the thin film transistor described in any of Embodiments 1 to 5 will be described as an embodiment of a semiconductor device with reference to FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, and FIG. 35. In this embodiment, an example of a liquid crystal display device including a liquid crystal element as a display element will be described with reference to FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, and FIG. 35. As TFTs 628 and 629 used for the liquid crystal display devices in FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, and FIG. 35, the thin film transistor described in any of Embodiments 1 to 5 can be employed. The TFTs 628 and 629 are thin film transistors having high electric characteristics and reliability, which can be manufactured in a process similar to that described in any of Embodiments 1 to 5.

First, a vertical alignment (VA) liquid crystal display device is described. The VA liquid crystal display device employs a method of controlling alignment of liquid crystal molecules of a liquid crystal display panel. In the VA method, liquid crystal molecules are aligned in a vertical direction with respect to a panel surface when no voltage is applied. In this embodiment, in particular, a pixel is divided into several regions (subpixels), and molecules are aligned in different directions in their respective regions. This is referred to as multi-domain or multi-domain design. A liquid crystal display device of multi-domain design is described below.

Figure 22:
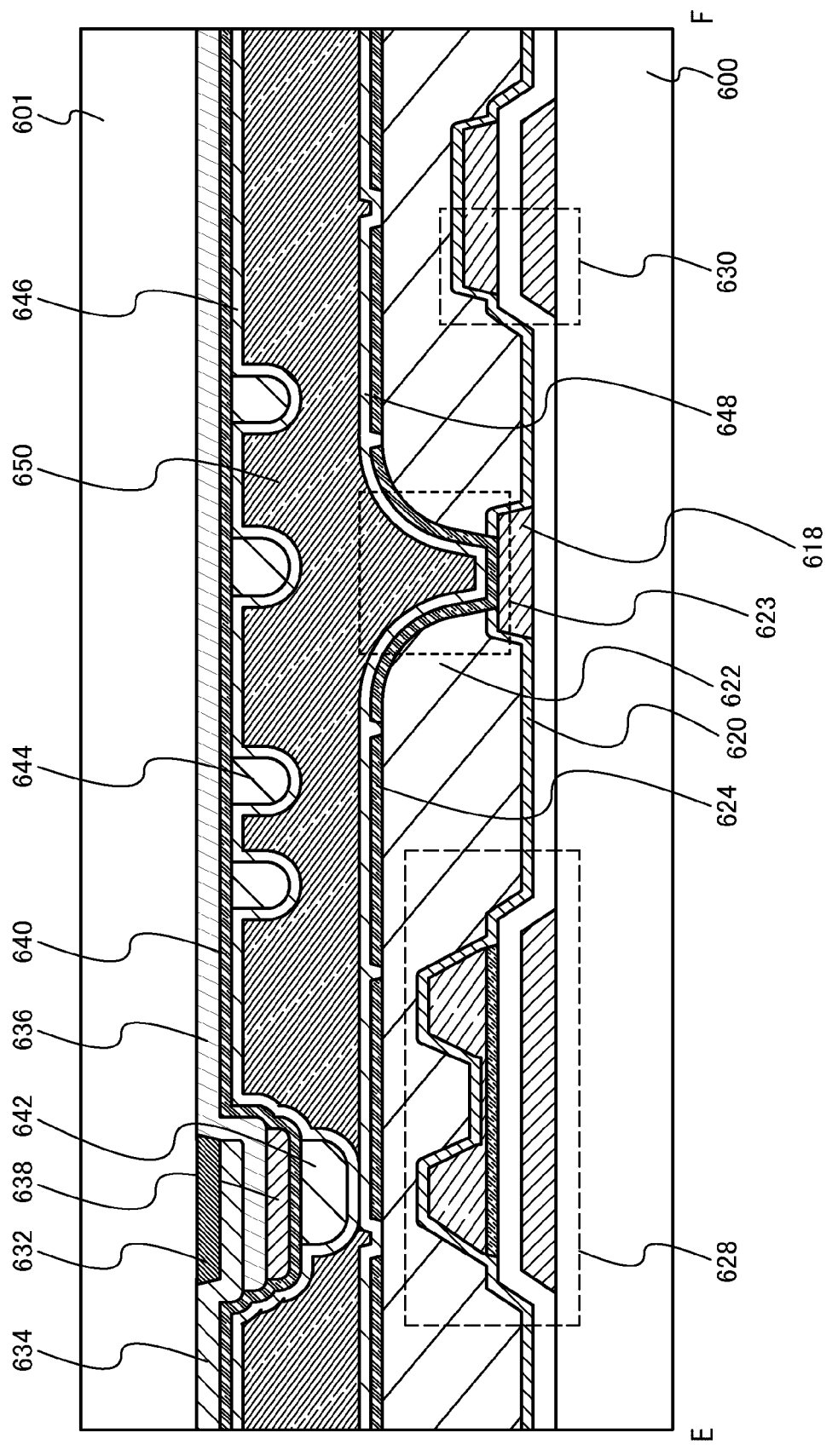
FIG. 22 illustrates a semiconductor device.
Figure 23:
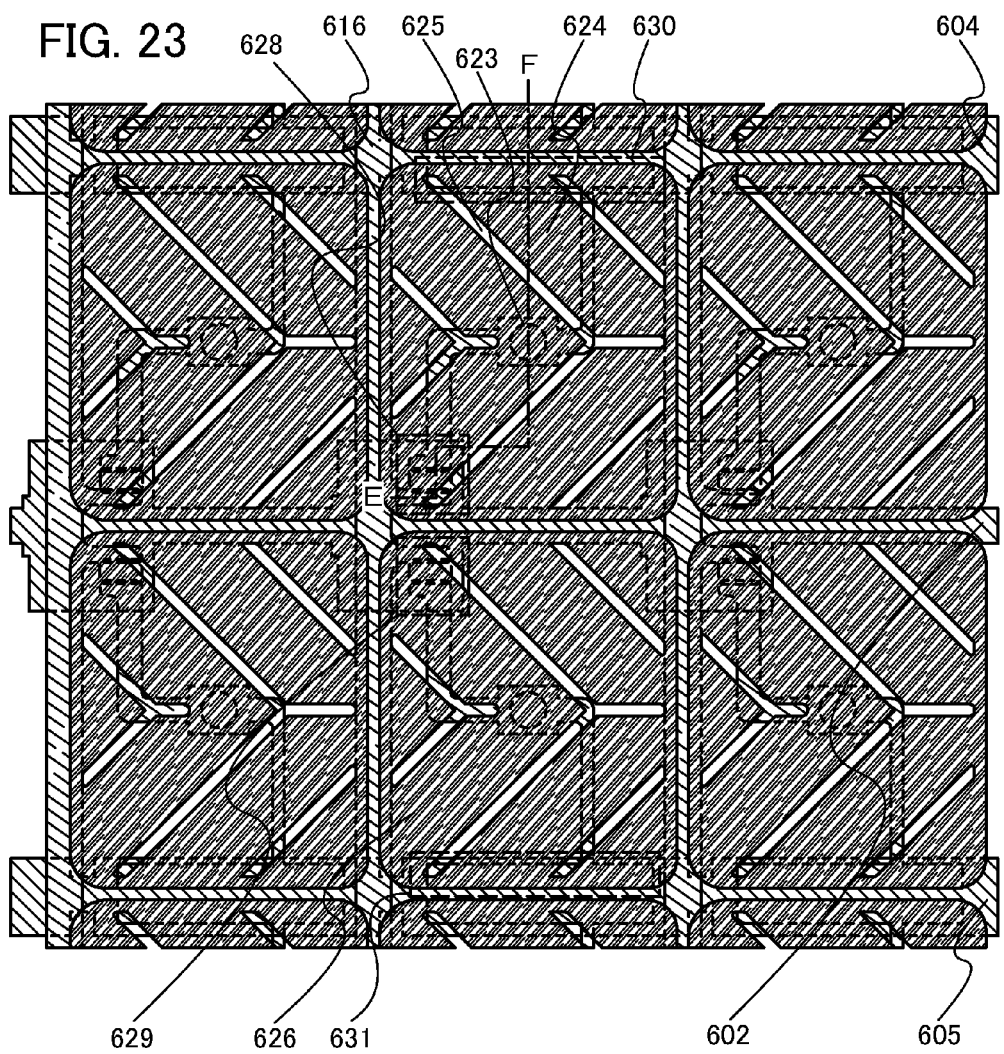
FIG. 23 illustrates a semiconductor device.
Figure 24:
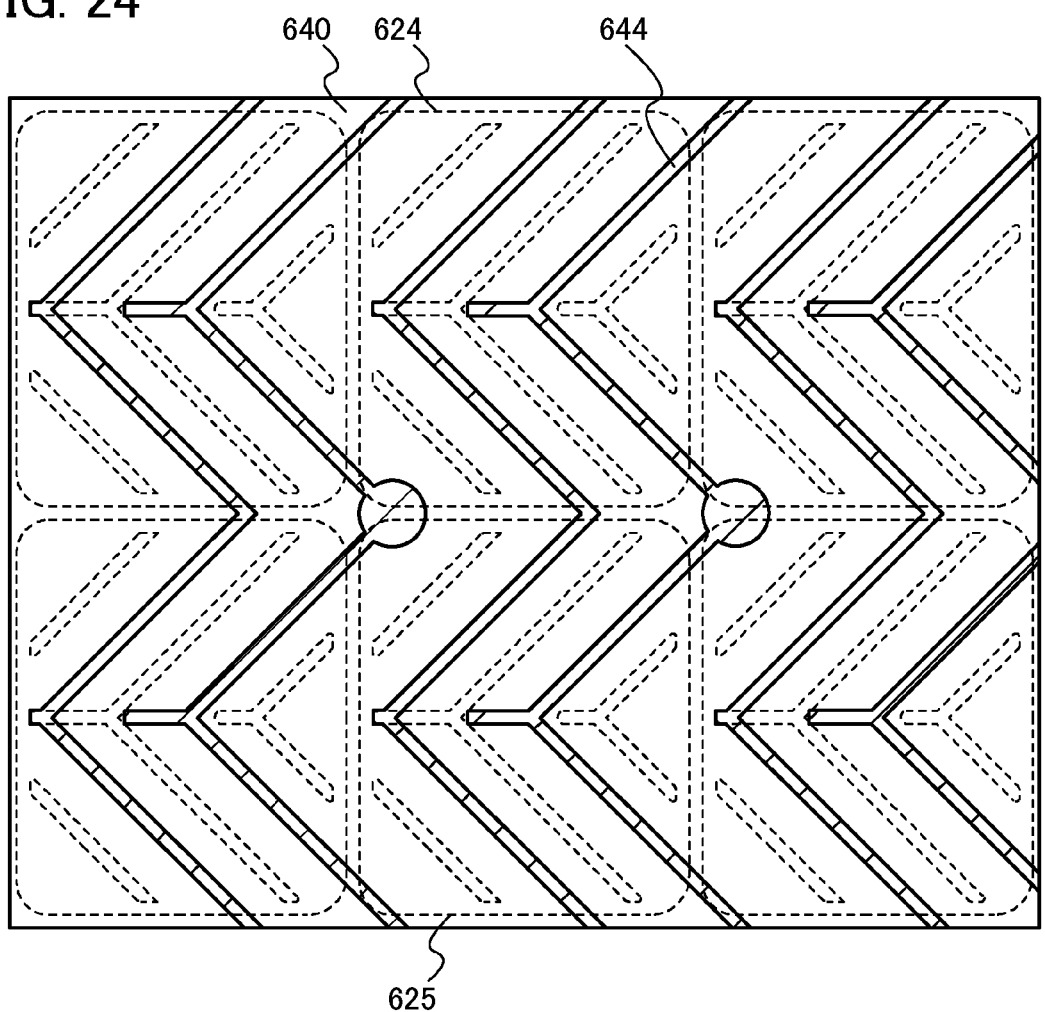
FIG. 24 illustrates a semiconductor device.

FIG. 23 and FIG. 24 illustrate a pixel electrode and a counter electrode, respectively. FIG. 23 is a plan view on a substrate side over which the pixel electrode is formed. A cross-sectional structure taken along line E-F of FIG. 23 is illustrated in FIG. 22. FIG. 24 is a plan view on a substrate side on which the counter electrode is formed. Hereinafter, description is made with reference to these drawings.

In FIG. 22, a substrate 600 over which a TFT 628, a pixel electrode layer 624 connected to the TFT 628, and a storage capacitor portion 630 are formed and a counter substrate 601 on which a counter electrode layer 640 and the like are formed overlap with each other, and liquid crystal is injected between the substrates.

Although not illustrated, a first coloring film, a second coloring film, a third coloring film, and the counter electrode layer 640 are provided in a position where the counter substrate 601 is provided with a spacer. This structure makes the height of projections 644 for controlling alignment of liquid crystal different from that of the spacer. An alignment film 648 is formed over the pixel electrode layer 624. Similarly, the counter electrode layer 640 is provided with an alignment film 646. A liquid crystal layer 650 is formed between the substrate 600 and the counter substrate 601.

As the spacer, a columnar spacer may be formed or a bead spacer may be dispersed. When the spacer has a light-transmitting property, it may be formed over the pixel electrode layer 624 over the substrate 600.

The TFT 628, the pixel electrode layer 624 connected to the TFT 628, and the storage capacitor portion 630 are formed over the substrate 600. The pixel electrode layer 624 is connected to a wiring 618 in a contact hole 623 that is formed in an insulating film 620 covering the TFT 628, a wiring 616, and the storage capacitor portion 630, and a third insulating film 622 covering the insulating film 620. The thin film transistor described in any of Embodiments 1 to 5 can be used as appropriate as the TFT 628.

The pixel electrode layer 624, the liquid crystal layer 650, and the counter electrode layer 640 overlap with each other, so that a liquid crystal element is formed.

FIG. 23 illustrates a structure over the substrate 600. The pixel electrode layer 624 is formed using a material described in Embodiment 1. Slits 625 are formed in the pixel electrode layer 624. The slits 625 are formed to control alignment of the liquid crystal.

A TFT 629, a pixel electrode layer 626 connected to the TFT 629, and a storage capacitor portion 631, which are illustrated in FIG. 23, can be formed in a similar manner to that of the TFT 628, the pixel electrode layer 624, and the storage capacitor portion 630, respectively. Both of the TFTs 628 and 629 are connected to the wiring 616. A pixel of this liquid crystal display panel includes the pixel electrode layers 624 and 626. The pixel electrode layers 624 and 626 are subpixels.

FIG. 24 illustrates a structure on the counter substrate side. The counter electrode layer 640 is preferably formed using a material similar to that of the pixel electrode layer 624. The projections 644 that controls alignment of liquid crystal are formed over the counter electrode layer 640.

Figure 25:
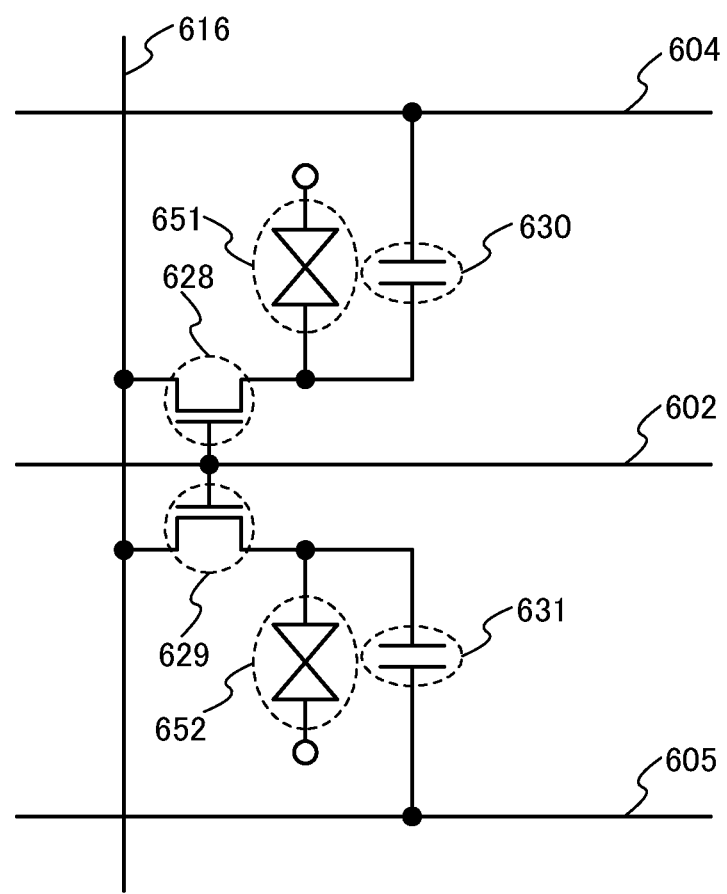
FIG. 25 illustrates a semiconductor device.

FIG. 25 illustrates an equivalent circuit of this pixel structure. Both of the TFTs 628 and 629 are connected to the gate wiring 602 and the wiring 616. In this case, by making the potential of the capacitor wiring 604 different from that of a capacitor wiring 605, operation of a liquid crystal element 651 can be different from that of a liquid crystal element 652. That is, potentials of the capacitor wirings 604 and 605 are controlled individually, whereby alignment of liquid crystal is precisely controlled and the viewing angle is increased.

When voltage is applied to the pixel electrode layer 624 provided with the slits 625, a distorted electric field (an oblique electric field) is generated in the vicinity of the slits 625. The slits 625 and the projections 644 on the counter substrate 601 side are disposed so as not to overlap with each other, whereby the oblique electric field is effectively generated to control alignment of the liquid crystal, and thus the direction in which liquid crystal is aligned is different depending on the location. That is, the viewing angle of a liquid crystal display panel is increased by employing multi-domain.

Next, a VA liquid crystal display device different from the above is described with reference to FIG. 26, FIG. 27, FIG. 28, and FIG. 29.

Figure 26:
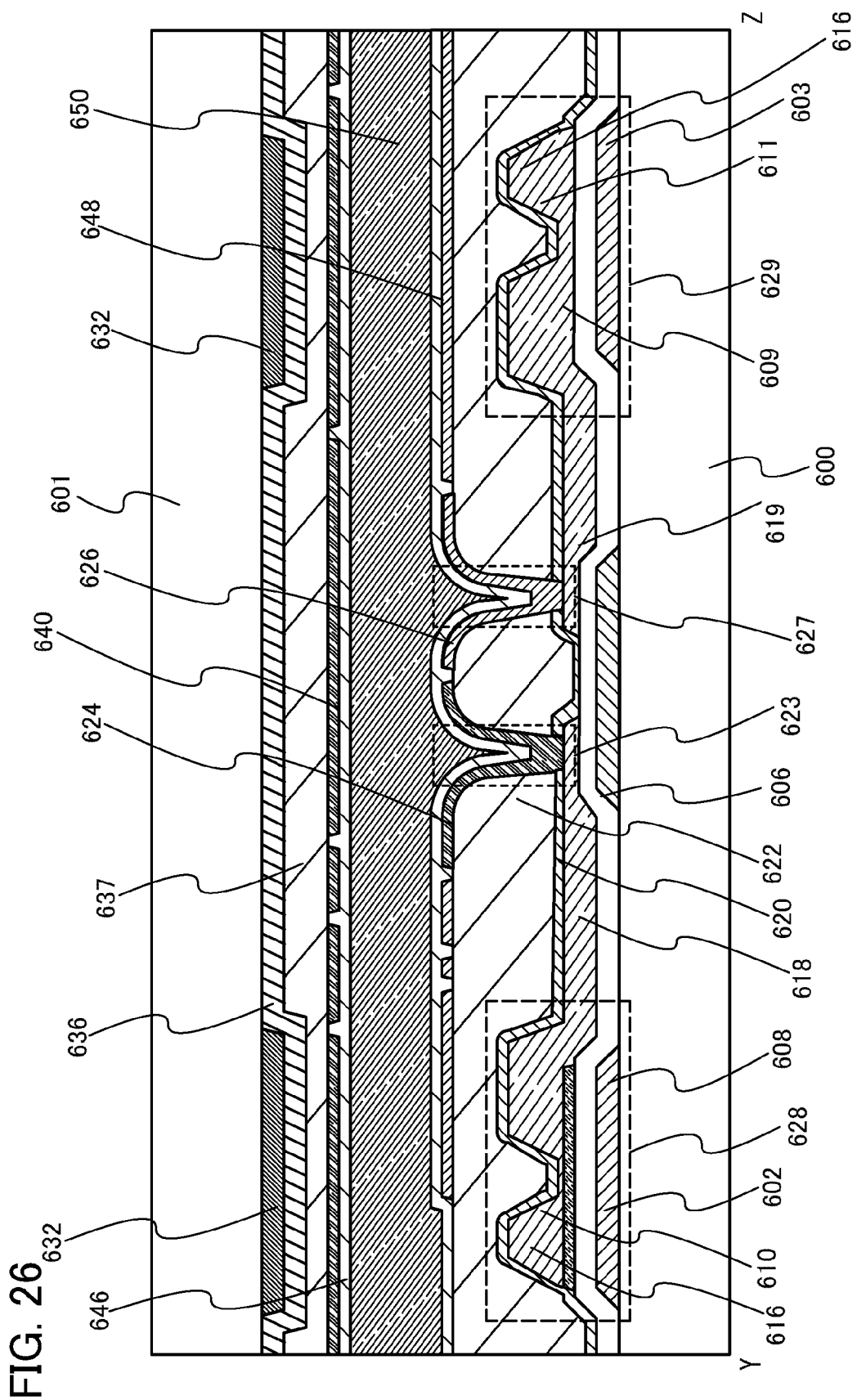
FIG. 26 illustrates a semiconductor device.
Figure 27:
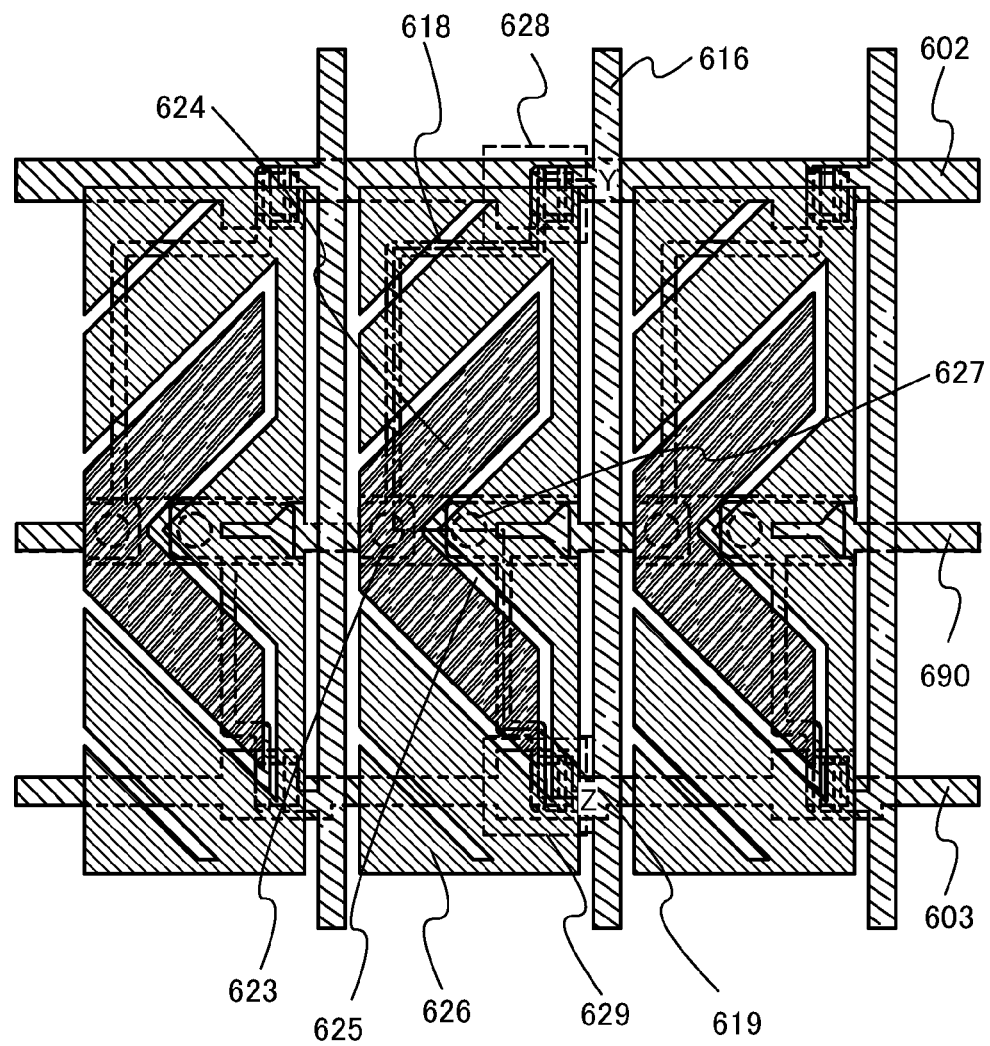
FIG. 27 illustrates a semiconductor device.

FIG. 26 and FIG. 27 illustrate a pixel structure of a VA liquid crystal display panel. FIG. 27 is a plan view over the substrate 600. A cross-sectional structure taken along line Y-Z of FIG. 27 is illustrated in FIG. 26.

In this pixel structure, one pixel has a plurality of pixel electrodes, and a TFT is connected to each of the pixel electrodes. Each TFT is driven with a gate signal different from each other. Specifically, in the pixel of multi-domain design, a signal applied to each pixel electrode is controlled independently.

The pixel electrode layer 624 is connected to the TFT 628 in the contact hole 623 through the wiring 618. In addition, the pixel electrode layer 626 is connected to the TFT 629 in a contact hole 627 through a wiring 619. The gate wiring 602 of the TFT 628 is separated from a gate wiring 603 of the TFT 629 so that different gate signals can be supplied. On the other hand, the wiring 616 functioning as a data line is shared by the TFTs 628 and 629. The thin film transistors described in any of Embodiments 1, 2, 5, and 6 can be used as appropriate as the TFTs 628 and 629.

Figure 29:
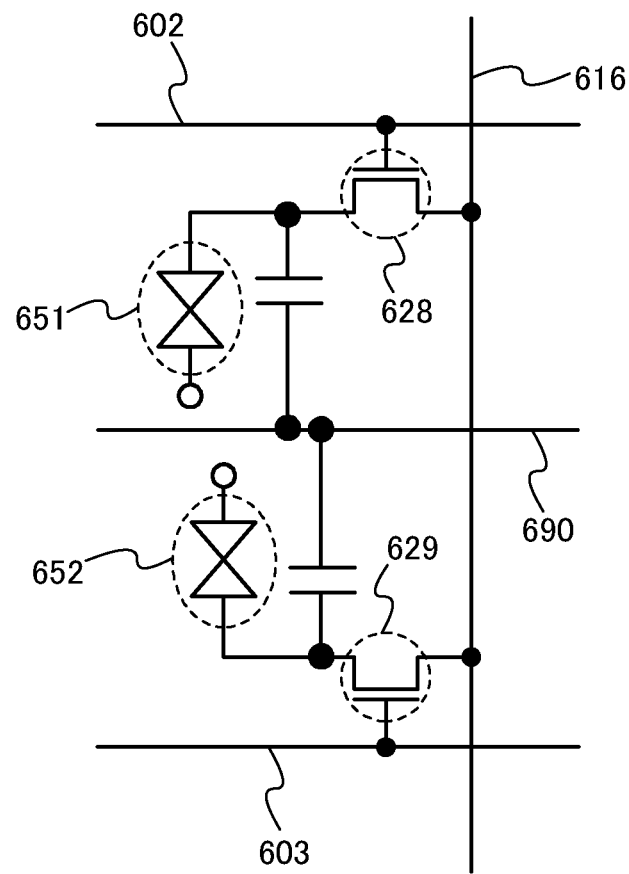
FIG. 29 illustrates a semiconductor device.

The shape of the pixel electrode layer 624 is different from that of the pixel electrode layer 626, and the pixel electrode layers are separated by slits 625. The pixel electrode layer 626 surrounds the pixel electrode layer 624, which has a V-shape. The TFTs 628 and 629 make the application voltage to the pixel electrode layers 624 and 626 different from each other, thereby controlling alignment of liquid crystal. FIG. 29 illustrates an equivalent circuit of this pixel structure. The TFT 628 is connected to the gate wiring 602, and the TFT 629 is connected to the gate wiring 603. Further, the TFTs 628 and 629 are both connected to the wiring 616. By supplying different gate signals to the gate wiring 602 and the gate wiring 603, operation of the liquid crystal element 651 can be different from that of the liquid crystal element 652. That is, operations of the TFTs 628 and 629 are controlled individually, whereby alignment of liquid crystal in the liquid crystal elements 651 and 652 can be precisely controlled and the viewing angle can be increased.

Figure 28:
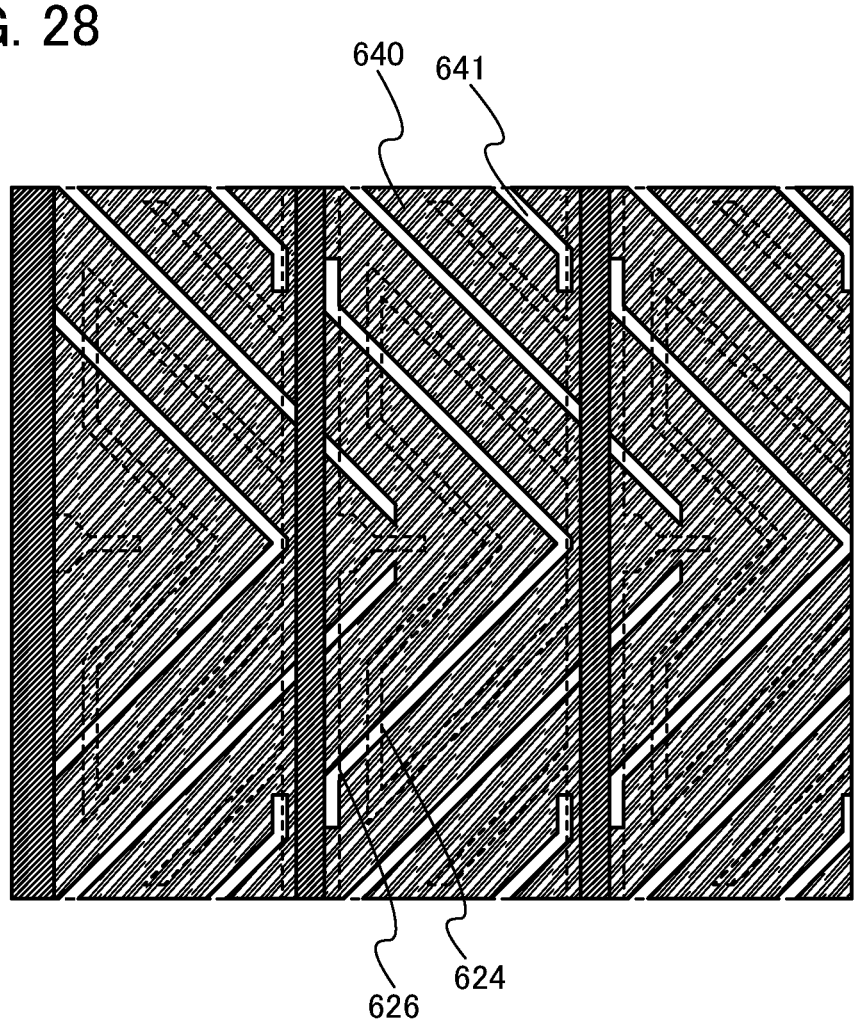
FIG. 28 illustrates a semiconductor device.

The counter substrate 601 is provided with the coloring film 636 and the counter electrode layer 640. In addition, a planarization film 637 is formed between the coloring film 636 and the counter electrode layer 640, thereby preventing alignment disorder of liquid crystal. FIG. 28 illustrates a structure of the counter substrate side. The counter electrode layer 640 is shared by plural pixels, and slits 641 are formed in the counter electrode layer 640. The slits 641 and the slits 625 on the pixel electrode layers 624 and 626 side are disposed so as not to overlap with each other, whereby an oblique electric field is effectively generated and alignment of liquid crystal is controlled. Accordingly, the direction in which liquid crystal is aligned can be different depending on the location, and thus the viewing angle is increased. Note that in FIG. 28, the dashed line indicates the pixel electrode layers 624 and 626 which are formed over the substrate 600 in FIG. 26, and the counter electrode layer 640 is provided to overlap with the pixel electrode layers 624 and 626.

The alignment film 648 is formed over the pixel electrode layers 624 and 626, and the alignment film 646 is formed on the counter electrode layer in a similar manner. The liquid crystal layer 650 is formed between the substrate 600 and the counter substrate 601. Further, the pixel electrode layer 624, the liquid crystal layer 650, and the counter electrode layer 640 overlap with each other, so that a first liquid crystal element is formed. The pixel electrode layer 626, the liquid crystal layer 650, and the counter electrode layer 640 overlap with each other, so that a second liquid crystal element is formed. Furthermore, the pixel structure of the display panel illustrated in FIG. 26, FIG. 27, FIG. 28, and FIG. 29 is a multi-domain structure in which the first liquid crystal element and the second liquid crystal element are provided in one pixel.

Next, a liquid crystal display device of a horizontal electric field mode is described. In a horizontal electric field mode, an electric field is applied in a horizontal direction with respect to liquid crystal molecules in a cell, whereby liquid crystal is driven to express gray scales. In accordance with this method, the viewing angle can be expanded to approximately 180°. Hereinafter, a liquid crystal display device of the horizontal electric field mode is described.

Figure 30:
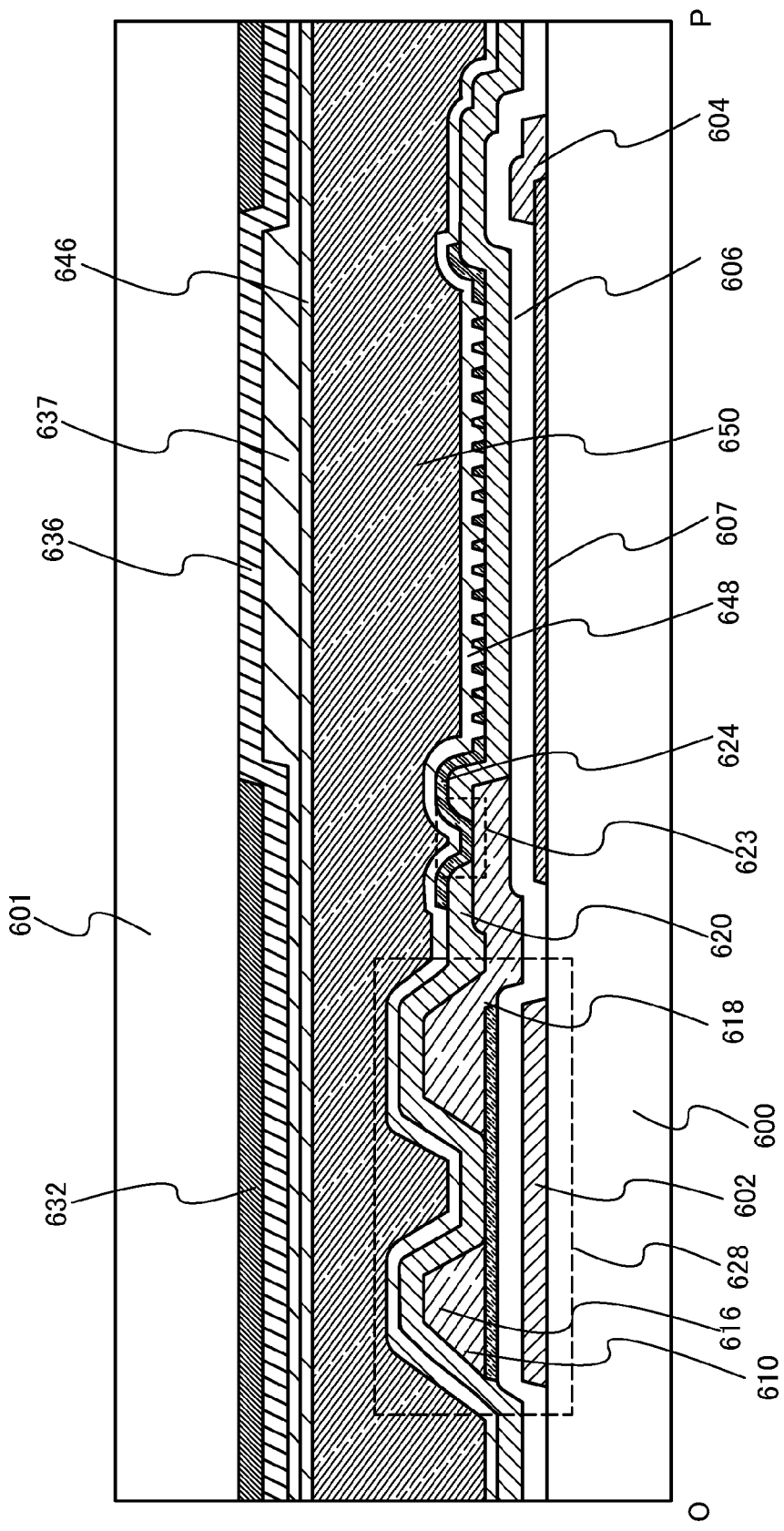
FIG. 30 illustrates a semiconductor device.

In FIG. 30, the counter substrate 601 is superposed on the substrate 600 over which an electrode layer 607, the TFT 628, and the pixel electrode layer 624 connected to the TFT 628 are formed, and liquid crystal is injected therebetween. The counter substrate 601 is provided with the coloring film 636, the planarization film 637, and the like. Note that a counter electrode is not provided on the counter substrate 601 side. The liquid crystal layer 650 is formed between the substrate 600 and the counter substrate 601 with the alignment film 646 and the alignment film 648 interposed therebetween.

The electrode layer 607, the capacitor wiring 604 connected to the electrode layer 607, and the TFT 628 are formed over the substrate 600. The capacitor wiring 604 can be formed at the same time as the gate wiring 602 of the TFT 628. The thin film transistor described in any of Embodiments 1 to 5 can be employed as the TFT 628. The electrode layer 607 can be formed using a material similar to that of the pixel electrode layer described in any of Embodiments 1 to 5. The electrode layer 607 is formed in a shape which is compartmentalized roughly in a pixel shape. The gate insulating film 606 is formed over the electrode layer 607 and the capacitor wiring 604.

The wirings 616 and 618 of the TFT 628 are formed over the gate insulating film 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624.

The insulating film 620 is formed over the wirings 616 and 618. Further, the pixel electrode layer 624 that is connected to the wiring 618 through the contact hole 623 formed in the insulating film 620 is formed over the insulating film 620. The pixel electrode layer 624 is formed using a material similar to that of the pixel electrode layer described in any of Embodiments 1 to 5.

In this manner, the TFT 628 and the pixel electrode layer 624 connected thereto are formed over the substrate 600. A storage capacitor is formed by providing the gate insulating film 606 between the electrode layer 607 and the pixel electrode layer 624.

Figure 31:
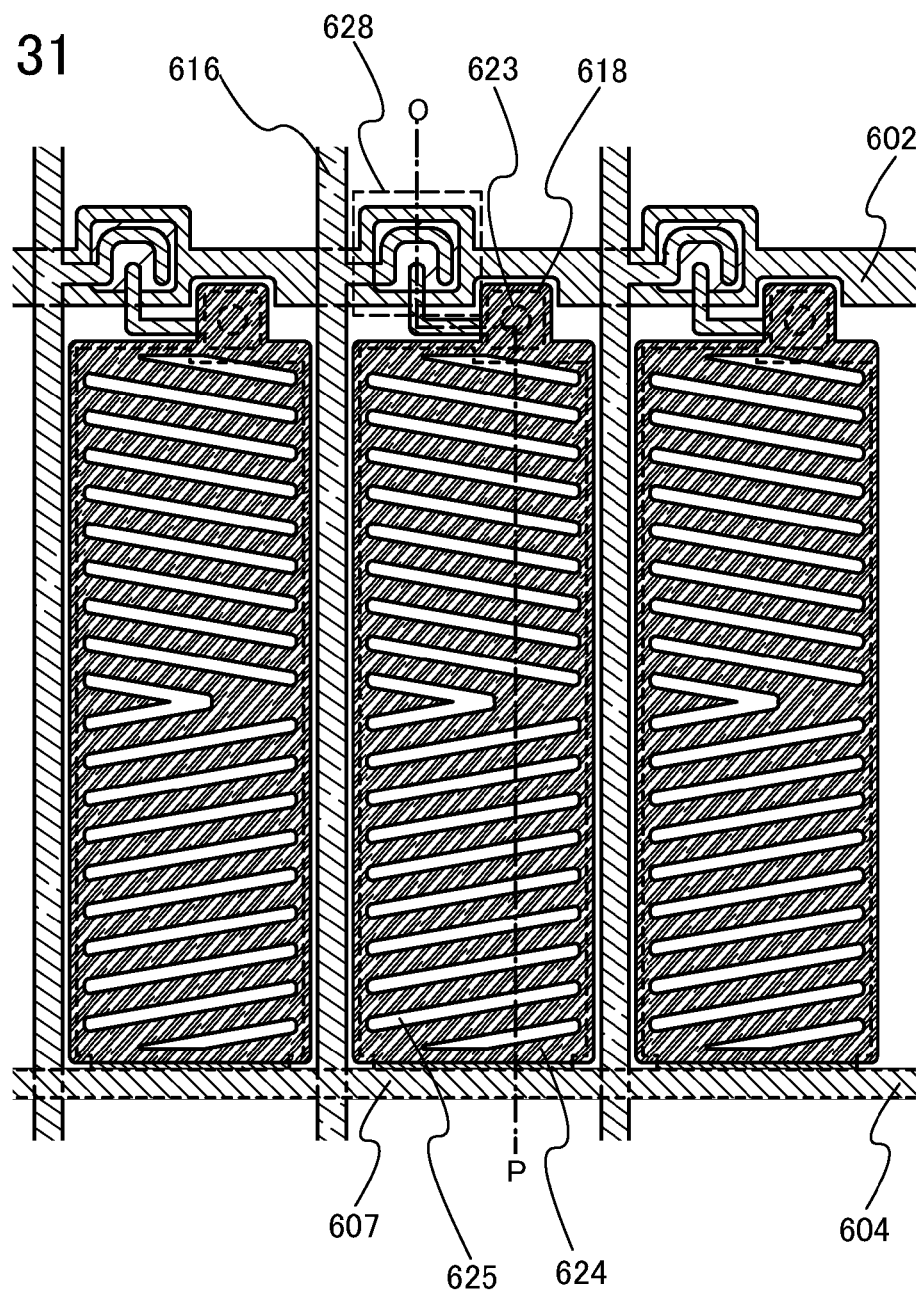
FIG. 31 illustrates a semiconductor device.

FIG. 31 is a plan view illustrating a structure of the pixel electrode. A cross-sectional structure taken along line O-P of FIG. 31 is illustrated in FIG. 30. The pixel electrode layer 624 is provided with the slits 625. The slits 625 are provided to control alignment of liquid crystal. In this case, an electric field is generated between the electrode layer 607 and the pixel electrode layer 624. The gate insulating film 606 is formed between the electrode layer 607 and the pixel electrode layer 624, and the gate insulating film 606 has a thickness of 50 nm to 200 nm inclusive, which is thin enough as compared to that of the liquid crystal layer having a thickness of 2 μm to 10 μm inclusive. Therefore, an electric field is generated in a direction which is substantially parallel to the substrate 600 (a horizontal direction). The alignment of the liquid crystal is controlled with this electric field. Liquid crystal molecules are horizontally rotated with the use of the electric field in the direction roughly parallel to the substrate. In this case, since the liquid crystal molecules are horizontally aligned in any state, the contrast or the like is less influenced by the viewing angle; thus, the viewing angle is increased. In addition, the aperture ratio can be improved because both the electrode layer 607 and the pixel electrode layer 624 are light-transmitting electrodes.

Next, another example of a liquid crystal display device of a horizontal electric field mode is described.

Figure 32:
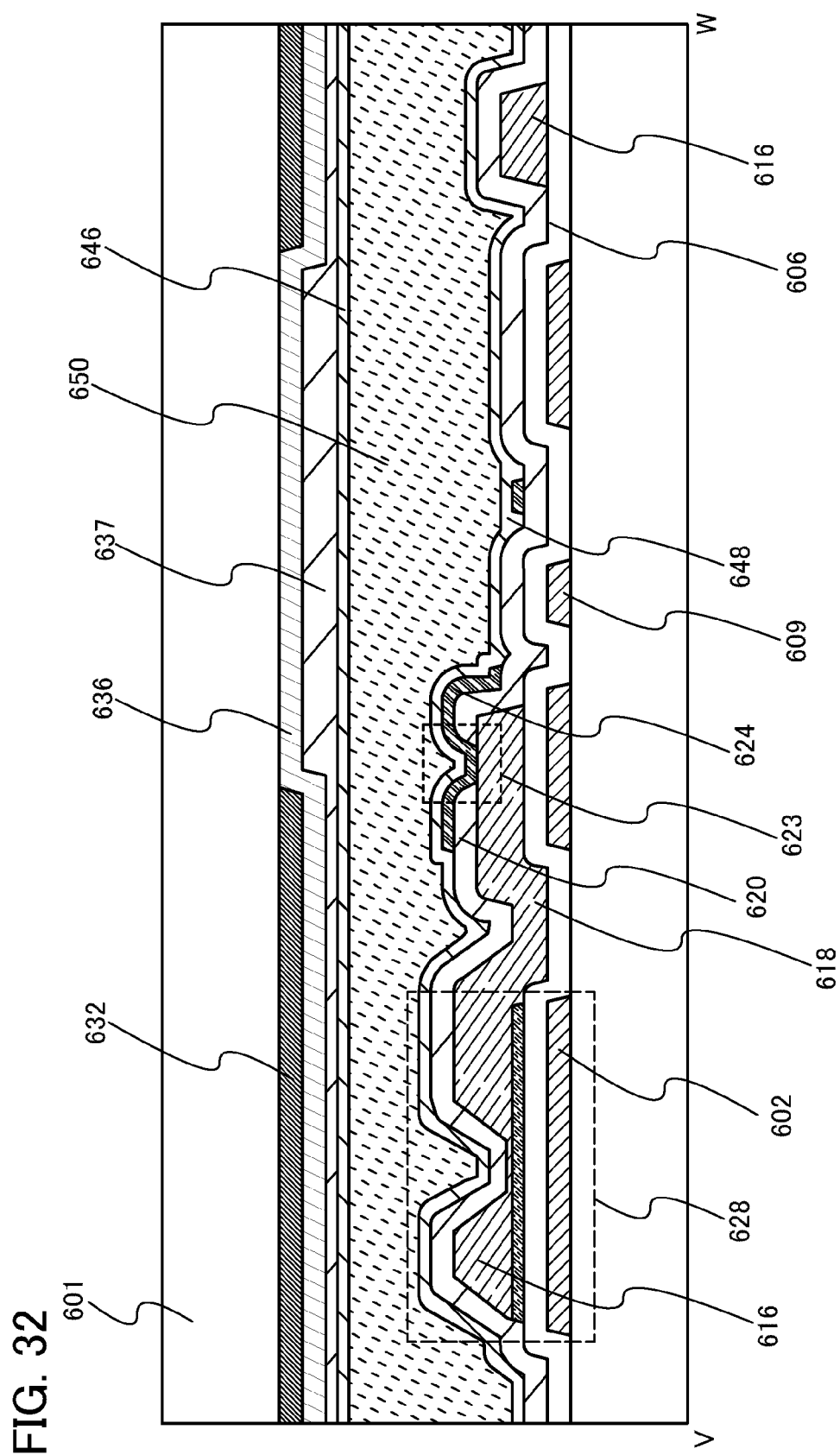
FIG. 32 illustrates a semiconductor device.
Figure 33:
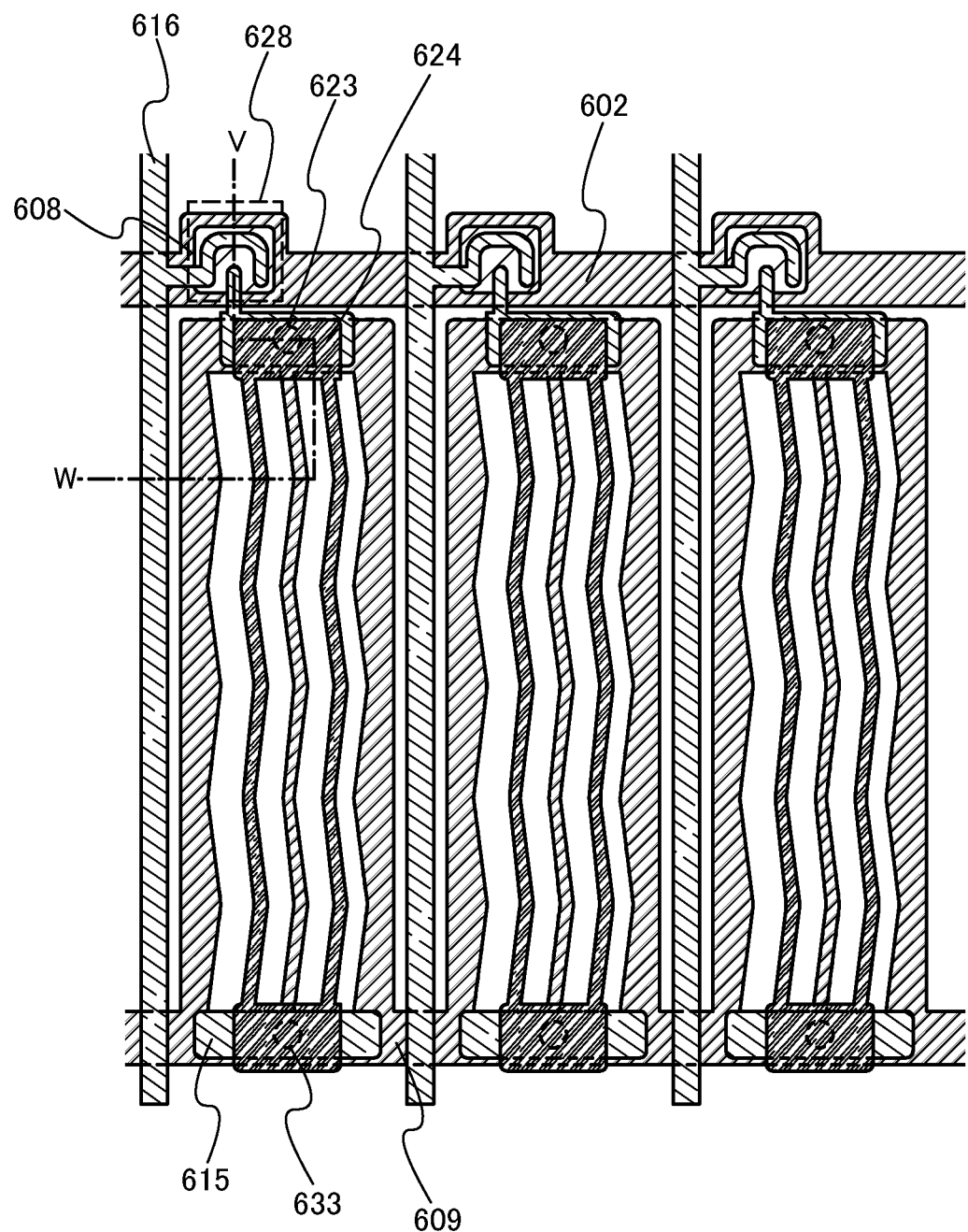
FIG. 33 illustrates a semiconductor device.

FIG. 32 and FIG. 33 illustrate a pixel structure of a liquid crystal display device of an IPS mode. FIG. 33 is a plan view, and a cross-sectional structure taken along line V-W of FIG. 33 is illustrated in FIG. 32.

In FIG. 32, the counter substrate 601 is superposed on the substrate 600 over which the TFT 628 and the pixel electrode layer 624 connected thereto are formed, and liquid crystal is injected between the substrates. The counter substrate 601 is provided with the coloring film 636, the planarization film 637, and the like. Note that since a pixel electrode is provided on the substrate 600 side, a counter electrode is not provided on the counter substrate 601 side. The liquid crystal layer 650 is formed between the substrate 600 and the counter substrate 601 with the alignment films 646 and 648 interposed therebetween.

A common potential line 609 and the TFT 628 are formed over the substrate 600. The common potential line 609 can be formed at the same time as the gate wiring 602 of the TFT 628. The thin film transistor described in any of Embodiments 1 to 5 can be employed as the TFT 628.

The wirings 616 and 618 of the TFT 628 are formed over a gate insulating film 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624.

The insulating film 620 is formed over the wirings 616 and 618. The insulating film 620 is provided with the pixel electrode layer 624 that is connected to the wiring 618 through the contact hole 623 formed in the insulating film 620. The pixel electrode layer 624 is formed using a material similar to that of the pixel electrode layer described in any of Embodiments 1 to 5. As illustrated in FIG. 33, the pixel electrode layer 624 is formed so that the pixel electrode layer 624 and a comb-like electrode that is formed at the same time as the common potential line 609 can generate a horizontal electric field. Further, a comb-like portion of the pixel electrode layer 624 and the comb-like electrode that is formed at the same time as the common potential line 609 are formed so as not to overlap with each other.

When an electric field is generated between the potential applied to the pixel electrode layer 624 and that applied to the common potential line 609, the alignment of liquid crystal is controlled with this electric field. Liquid crystal molecules are horizontally rotated with the use of the electric field in the direction roughly parallel to the substrate. In this case, since the liquid crystal molecules are horizontally aligned in any state, the contrast or the like is less influenced by the viewing angle; thus, the viewing angle is increased.

In this manner, the TFT 628 and the pixel electrode layer 624 connected thereto are formed over the substrate 600. A storage capacitor is formed by providing the gate insulating film 606 between the common potential line 609 and a capacitor electrode 615. The capacitor electrode 615 is connected to the pixel electrode layer 624 through a contact hole 633.

Next, a mode of a liquid crystal display device in a TN mode will be described.

Figure 34:
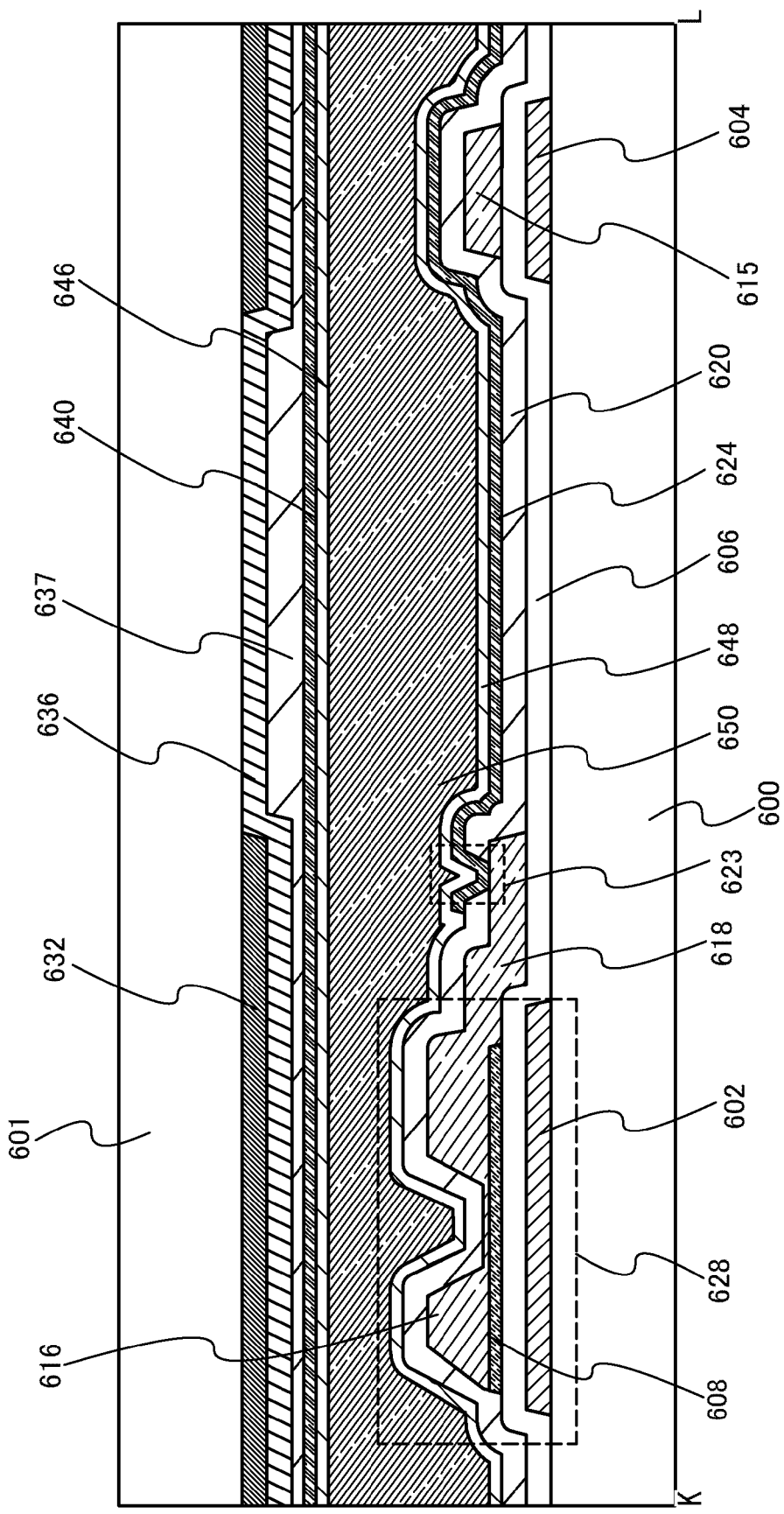
FIG. 34 illustrates a semiconductor device.
Figure 35:
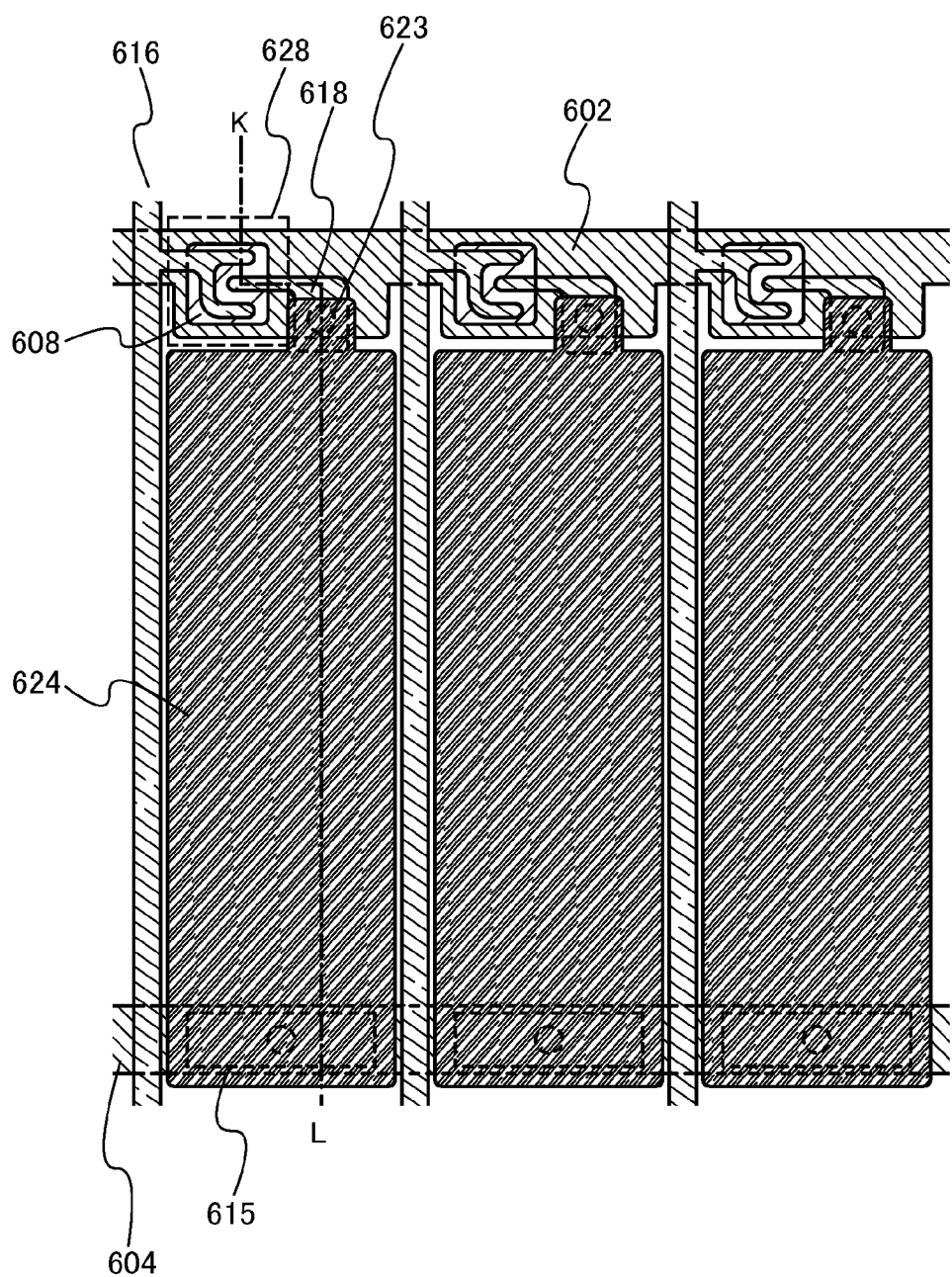
FIG. 35 illustrates a semiconductor device.

FIG. 34 and FIG. 35 illustrate a pixel structure of a liquid crystal display device in a TN mode. FIG. 35 is a plan view. A cross-sectional structure taken along line K-L of FIG. 35 is illustrated in FIG. 34. Description below will be given with reference to both the drawings.

The pixel electrode layer 624 is connected to the TFT 628 via a wiring 618 and through the contact hole 623 formed in the insulating film 620. The wiring 616 serving as a data line is connected to the TFT 628. The TFT described in any of Embodiments 1 to 5 can be used as the TFT 628.

The pixel electrode layer 624 is formed using the pixel electrode layer described in any of Embodiments 1 to 5. The capacitor wiring 604 can be formed at the same time as the gate wiring 602 of the TFT 628. The first gate insulating film 606 is formed over the gate wiring 602 and the capacitor wiring 604. A storage capacitor is formed from the capacitor wiring 604, a capacitor electrode 615, and the gate insulating film 606 therebetween. The capacitor electrode 615 and the pixel electrode layer 624 are connected to each other through the contact hole 623.

The counter substrate 601 is provided with the coloring film 636 and the counter electrode layer 640. The planarization film 637 is formed between the coloring film 636 and the counter electrode layer 640 to prevent alignment disorder of liquid crystal. The liquid crystal layer 650 is formed between the pixel electrode layer 624 and the counter electrode layer 640, and the alignment films 646 and 648 are provided between the liquid crystal layer 650 and the pixel electrode layer 624 and the counter electrode layer 640.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is opposite to the surface provided with the thin film transistor, and a polarizing plate is attached to a surface of the counter substrate 601, which is opposite to the surface provided with the counter electrode layer 640.

Through the above process, a liquid crystal display device can be manufactured as a display device.

Embodiment 11

In this embodiment, another example of a manufacturing method of a semiconductor device which is an embodiment of the present invention will be described with reference to FIG. 37.

Figure 37:
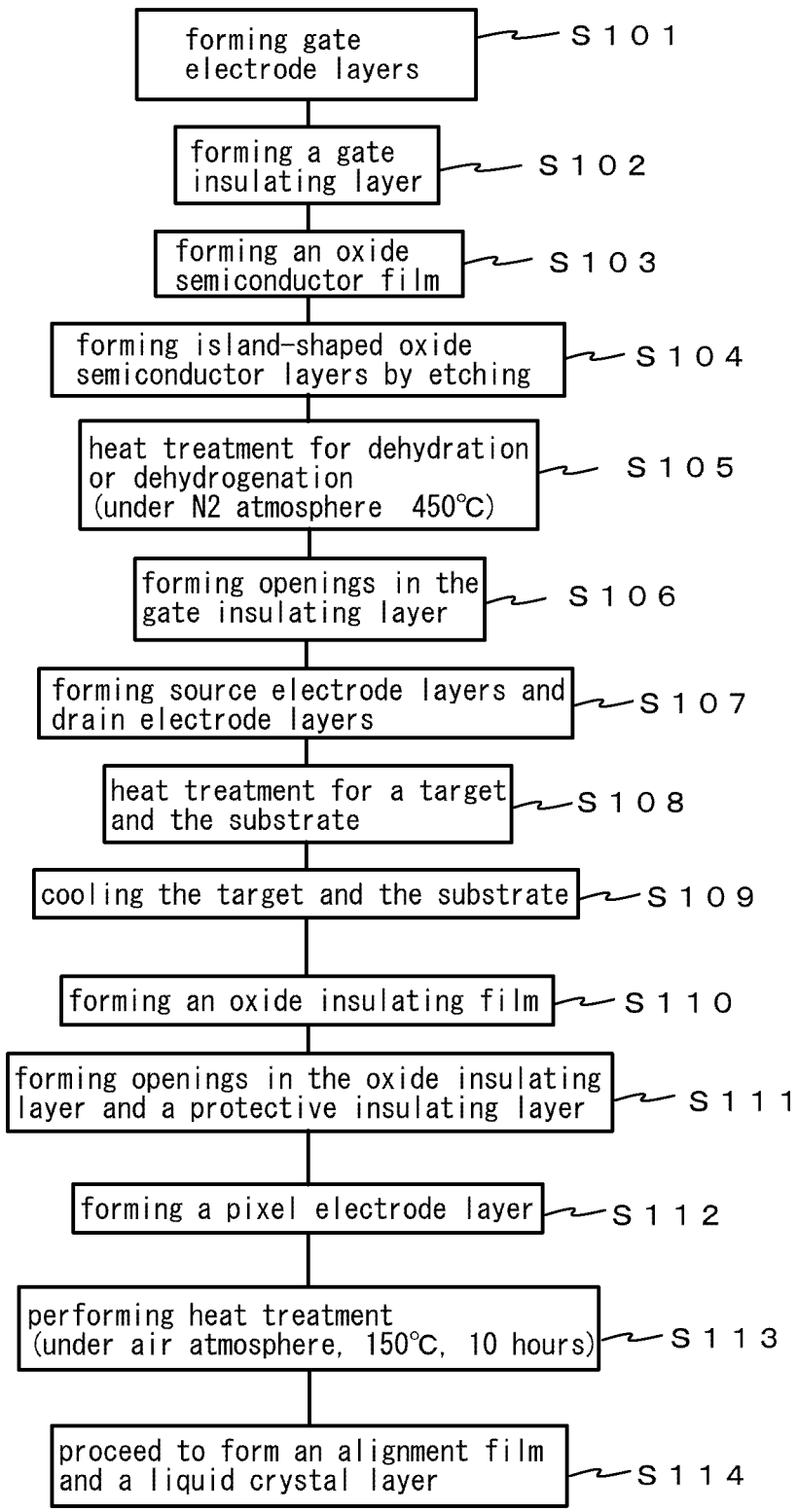
FIG. 37 shows a manufacturing process of a semiconductor device.

Gate electrode layers are formed over a substrate having an insulating surface (S101 in FIG. 37). The gate electrode layers can be formed to have a single-layer or stacked-layer structure using a metal material such as molybdenum, titanium, chromium, tantalum, tungsten, aluminum, copper, neodymium, or scandium, or an alloy material which contains any of these materials as its main component.

A gate insulating layer is formed over the gate electrode layers (S102 in FIG. 37). The gate insulating layer can be formed to have a single-layer or stacked-layer structure using a silicon oxide layer, a silicon nitride layer, a silicon oxynitride layer, a silicon nitride oxide layer, or an aluminum oxide layer by a plasma CVD method, a sputtering method, or the like. In this embodiment, a silicon nitride layer having a thickness of less than or equal to 200 nm is formed as the gate insulating layer by a plasma CVD method.

Next, an oxide semiconductor film having a thickness of greater than or equal to 2 nm and less than or equal to 200 nm is formed over the gate insulating layer (S103 in FIG. 37). In this embodiment, an In—Ga—Zn—O-based oxide semiconductor film is formed by a sputtering method using an In—Ga—Zn—O-based oxide semiconductor target.

Then, the oxide semiconductor film is etched with a resist mask that is formed by a photolithography step, so that island-shaped oxide semiconductor layers are formed (S104 in FIG. 37).

Next, heat treatment for dehydration or dehydrogenation of the oxide semiconductor layers is performed. The temperature of the heat treatment for dehydration or dehydrogenation is set to a temperature of higher than or equal to 400° C. and lower than or equal to 700° C. (S105 in FIG. 37). In this embodiment, heat treatment is performed at 450° C. in a nitrogen atmosphere. Here, the substrate is introduced into an electric furnace which is one example of a heat treatment apparatus, and the oxide semiconductor layers are subjected to heat treatment under a nitrogen atmosphere. Then, the oxide semiconductor layers are not exposed to air, and water and hydrogen can be prevented from being contained again in the oxide semiconductor layers. In this manner, the oxide semiconductor layers are formed. In this embodiment, slow cooling is performed from a heating temperature T at which the dehydration or dehydrogenation is performed on the oxide semiconductor layers to such a temperature that water is not contained again, specifically, to a temperature that is lower than the heating temperature T by 100° C. or more, with use of one electric furnace under a nitrogen atmosphere. The dehydration or dehydrogenation may be performed under a rare gas (e.g., helium, neon, or argon) atmosphere without limitation to a nitrogen atmosphere.

When the oxide semiconductor layers are subjected to heat treatment at 400° C. to 700° C., the dehydration or dehydrogenation of the oxide semiconductor layers can be achieved; thus, water ($H_2O$) can be prevented from being contained again in the oxide semiconductor layers later.

The heat treatment apparatus is not limited to the electric furnace, and for example may be an RTA (rapid thermal annealing) apparatus such as a GRTA (gas rapid thermal annealing) apparatus or an LRTA (lamp rapid thermal annealing) apparatus. An LRTA apparatus is an apparatus for heating a process object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. Further, the LRTA apparatus may have not only a lamp but also a device for heating a process object by heat conduction or heat radiation from a heating element such as a resistance heating element. GRTA is a method of heat treatment using a high-temperature gas. As the gas, an inert gas which does not react with a process object by heat treatment, such as nitrogen or a rare gas such as argon is used. The heat treatment may be performed at 600° C. to 750° C. for several minutes using an RTA method.

Note that in the heat treatment for dehydration or dehydrogenation, it is preferable that water, hydrogen, and the like be not contained in nitrogen or a rare gas such as helium, neon, or argon. In particular, the heat treatment which is performed on the oxide semiconductor layers for dehydration or dehydrogenation at 400° C. to 700° C. is preferably performed in a nitrogen atmosphere in which the concentration of $H_2O$ is 20 ppm or lower. Alternatively, it is preferable that nitrogen or a rare gas such as helium, neon, or argon introduced into an apparatus for heat treatment have a purity of 6N (99.9999%) or more, more preferably, 7N (99.99999%) or more; that is, an impurity concentration is preferably set to 1 ppm or lower, more preferably, 0.1 ppm or lower.

Next, unnecessary portions of the gate insulating layer are removed with the use of resist masks formed by a photolithography step, so that openings (contact holes) are formed in the gate insulating layer (S106 in FIG. 37).

Next, a metal conductive film is formed using a metal material over the oxide semiconductor layers by a sputtering method or a vacuum evaporation method.

As a material of the metal conductive film, an element selected from Al, Cr, Cu, Ta, Ti, Mo, or W; an alloy containing any of these elements as a component; an alloy film containing any of these elements in combination; and the like can be given. The metal conductive film may have a single-layer structure or a stacked-layer structure of two or more layers. For example, a single-layer structure of an aluminum film containing silicon; a two-layer structure of an aluminum film and a titanium film stacked thereover; a three-layer structure of a Ti film, an aluminum film stacked thereover, and a Ti film stacked thereover; and the like can be given. Alternatively, a film containing an element selected from titanium (Ti), tantalum (Ta), tungsten (W), molybdenum (Mo), chromium (Cr), neodymium (Nd), or scandium (Sc); a film containing any of these elements in combination; an alloy film containing any of these elements; or a nitride film containing any of these elements may be used.

If heat treatment is performed after formation of the metal conductive film, it is preferable that the metal conductive film have heat resistance enough to withstand the heat treatment.

Next, resist masks are formed by a photolithography step, and unnecessary portions of the metal conductive film are removed by etching, so that source electrode layers and drain electrode layers are formed (S107 in FIG. 37).

Note that each material and etching conditions are adjusted as appropriate so that the oxide semiconductor layers are not removed by etching of the metal conductive film.

In this embodiment, a three-layer structure of a Ti film, an aluminum film, and a Ti film is used as the metal conductive film, an In—Ga—Zn—O-based oxide is used for the oxide semiconductor layers, and an ammonium hydroxide/hydrogen peroxide mixture (a mixed solution of ammonia, water, and a hydrogen peroxide solution) is used as an etchant.

Then, the target and the substrate are subjected to heat treatment in a chamber for forming an oxide insulating film (S108 in FIG. 37). After the heat treatment, the target and the substrate are cooled (S109 in FIG. 37), and the oxide insulating film is formed at a room temperature (S110 in FIG. 37). The heating temperature may be set to 100° C. to 250° C. inclusive.

The oxide insulating film is formed to a thickness of at least 1 nm or more (preferably, 100 nm or more and 500 nm or less) and can be formed using a method by which impurities such as water and hydrogen are prevented from entering the oxide insulating film, for example, by a sputtering method as appropriate. In this embodiment, a silicon oxide film is formed to a thickness of 300 nm as the oxide insulating film by a sputtering method. The substrate temperature in film formation may be from room temperature to 300° C. or lower and in this embodiment, is room temperature. The formation of the silicon oxide film by a sputtering method can be performed under a rare gas (typically, argon) atmosphere, an oxygen atmosphere, or a mixed atmosphere of a rare gas (typically, argon) and oxygen. As a target, a silicon oxide target or a silicon target can be used. For example, with use of a silicon target, a silicon oxide film can be formed by a sputtering method under an oxygen atmosphere. Note that as the oxide insulating film formed in contact with the oxide semiconductor layers which are to have low resistance later, an inorganic insulating film which does not contain impurities such as moisture, hydrogen ions, and $OH^-$ and which blocks entry of these from the outside is used. Typically, a silicon oxide film, a silicon nitride oxide film, an aluminum oxide film, an aluminum oxynitride film, or the like is used.

A protective insulating layer may be additionally formed over the oxide insulating film. For example, a silicon nitride film is formed by an RF sputtering method. The RF sputtering method is preferable as a formation method of the protective insulating layer because it achieves high mass productivity. The protective insulating layer is formed using an inorganic insulating film which does not contain impurities such as moisture, hydrogen ions, and $OH^-$ and blocks entry of these from the outside. Typically, a silicon nitride film, an aluminum nitride film, a silicon nitride oxide film, an aluminum oxynitride film, or the like is used. In this embodiment, the protective insulating layer is formed using a silicon nitride film.

Alternatively, the oxide insulating film may be a silicon oxide film having a thickness of 100 nm that is formed by a sputtering method (under an oxygen atmosphere at a room temperature), and the protective insulating layer stacked thereover may be formed to have a thickness of 100 nm by a sputtering method (under a mixed atmosphere of nitrogen and argon at a room temperature).

After formation of the oxide insulating film, heat treatment (preferably at higher than or equal to 200° C. and lower than or equal to 400° C., for example, higher than or equal to 250° C. and lower than or equal to 350° C.) may be performed in an inert gas atmosphere or a nitrogen gas atmosphere. For example, the heat treatment is performed at 250° C. for one hour in a nitrogen atmosphere.

Next, the oxide insulating film and the protective insulating layer are selectively etched to form openings (S111 in FIG. 37). A planarization insulating layer may be formed over the protective insulating layer. Depending on the material and the formation method of the planarization insulating layer, heat treatment at approximately 250° C. may be performed at the time of formation. In such a case, the above-mentioned heat treatment in an inert gas atmosphere or a nitrogen gas atmosphere after formation of the oxide insulating film may be omitted.

Next, a conductive film having a light-transmitting property is formed. The conductive film having a light-transmitting property is formed using indium oxide ($In_2O_3$), an indium oxide-tin oxide alloy ($In_2O_3$—$SnO_2$, abbreviated as ITO), or the like by a sputtering method, a vacuum evaporation method, or the like. Alternatively, the conductive film having a light-transmitting property may be formed using an Al—Zn—O-based non-single-crystal film containing nitrogen (i.e., an Al—Zn—O—N-based non-single-crystal film), a Zn—O-based non-single-crystal film containing nitrogen, or a Sn—Zn—O-based non-single-crystal film containing nitrogen. Note that the proportion (atomic %) of zinc in the Al—Zn—O—N-based non-single-crystal film is 47 atomic % or less, and is larger than that of aluminum in the Al—Zn—O—N-based non-single-crystal film. The proportion (atomic %) of aluminum in the Al—Zn—O—N-based non-single-crystal film is larger than that of nitrogen in the Al—Zn—O—N-based non-single-crystal film. Etching treatment of such a material is performed with a hydrochloric acid based solution. However, since a residue is easily generated particularly in etching of ITO, an indium oxide-zinc oxide alloy ($In_2O_3$—ZnO) may be used to improve etching processability.

Next, resist masks are formed by performing a photolithography step, and unnecessary portions of the conductive film having a light-transmitting property are removed by etching, so that a pixel electrode layer and a conductive layer are formed. Then, the resist masks are removed (S112 in FIG. 37).

Next, heat treatment is performed at 100° C. to 200° C. inclusive for one hour to 30 hours inclusive in an air atmosphere (S113 in FIG. 37). In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Further, this heat treatment may be performed before formation of the oxide insulating film under a reduced pressure. Under the reduced pressure, the heat treatment time can be shortened. With such heat treatment, hydrogen is introduced from the oxide semiconductor layers to the oxide insulating layer; thus, normally-off thin film transistors can be obtained. Therefore, reliability of the semiconductor device can be improved.

Through the above-described steps, thin film transistors can be manufactured in a driver circuit portion and a pixel portion over one substrate.

In a similar manner to that of Embodiment 1, a counter substrate is attached to the substrate with a liquid crystal layer interposed therebetween; thus, a liquid crystal display device of this embodiment can be manufactured.

Embodiment 12

Figure 38:
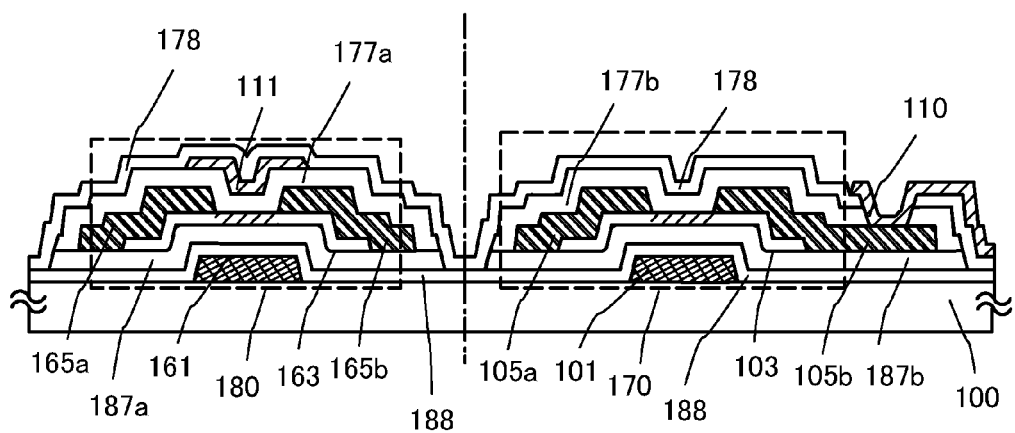
FIG. 38 illustrates a semiconductor device.

In this embodiment, an example in which an oxide semiconductor layer is surrounded by nitride insulating films when seen in cross section will be described with reference to FIG. 38. FIG. 38 is the same as FIG. 1 except the top surface shape of the oxide insulating layers, the positions of end portions of the oxide insulating layers, and the structure of the gate insulating layer. Thus, the same portions will be denoted by the same reference numerals and the detailed description of the same portions will be omitted.

The thin film transistor 180 disposed in the driver circuit is a channel-etched thin film transistor and includes, over the substrate 100 having an insulating surface, the gate electrode layer 161, a first gate insulating layer 188 formed using a nitride insulating film, a second gate insulating layer 187a formed using an oxide insulating film, the oxide semiconductor layer 163, the source electrode layer 165a, and the drain electrode layer 165b. Further, an oxide insulating layer 177a which covers the thin film transistor 180 and is in contact with the channel formation region of the oxide semiconductor layer 163 is provided. A protective insulating layer 178 is further formed over the oxide insulating layer 177a, and the conductive layer 111 is further provided over the oxide insulating layer 177a in a region overlapping with the gate electrode layer 161 and the oxide semiconductor layer 163.

The thin film transistor 170 disposed in the pixel portion is a channel-etched thin film transistor and includes, over the substrate 100 having an insulating surface, the gate electrode layer 101, the first gate insulating layer 188 formed using a nitride insulating film, a second gate insulating layer 187b formed using an oxide insulating film, the oxide semiconductor layer 103, the source electrode layer 105a, and the drain electrode layer 105b. Further, an oxide insulating layer 177b which covers the thin film transistor 170 and is in contact with the channel formation region of the oxide semiconductor layer 103 is provided. The protective insulating layer 178 is further formed over the oxide insulating layer 177b, and the pixel electrode layer 110 which is in contact with the drain electrode layer 105b is further provided over the protective insulating layer 178.

In each of the thin film transistors 170 and 180 of this embodiment, the gate insulating layer has a stacked structure in which a nitride insulating film and an oxide insulating film are stacked from the gate electrode layer side. At the time of forming an opening in the oxide insulating layer, the oxide insulating film of the second gate insulating layer is selectively removed to expose part of the nitride insulating film.

At least the area of the top surfaces of the oxide insulating layers 177a and 177b and the area of the top surfaces of the second gate insulating layers 187a and 187b are each larger than that of the top surfaces of the oxide semiconductor layers 163 and 103, and the top surfaces of the oxide insulating layers 177a and 177b and the top surfaces of the second gate insulating layers 187a and 187b preferably cover the thin film transistors 180 and 170.

Further, the protective insulating layer 178 formed using a nitride insulating film is formed so as to cover the top surfaces and side surfaces of the oxide insulating layers 177a and 177b and be in contact with the nitride insulating film of the first gate insulating layer.

For the protective insulating layer 178 and the first gate insulating layer 188 which are each formed using a nitride insulating film, an inorganic insulating film which does not contain impurities such as moisture, a hydrogen ion, and OH$^-$ and blocks entry of the impurities from the outside is used: for example, a silicon nitride film, a silicon oxynitride film, an aluminum nitride film, or an aluminum oxynitride film obtained by a sputtering method or a plasma CVD method is used.

In this embodiment, as the protective insulating layer 178 formed using a nitride insulating film, a silicon nitride film having a thickness of 100 nm is formed by an RF sputtering method so as to cover the top surfaces and side surfaces of the oxide semiconductor layers 163 and 103. In addition, the protective insulating layer 178 is in contact with the first gate insulating layer 188 formed using a nitride insulating film.

With the structure illustrated in FIG. 38, entry of moisture from the outside can be prevented in a manufacturing process after formation of the protective insulating layer 178 formed using a nitride insulating film. Further, even after a device is completed as a semiconductor device such as a liquid crystal display device, entry of moisture from the outside can be prevented in the long term; therefore, long-term reliability of the device can be improved.

In this embodiment, the structure in which one thin film transistor is covered with a nitride insulating film is described; however, the embodiment of the present invention is not limited thereto. A plurality of thin film transistors may be covered with a nitride insulating film, or a plurality of thin film transistors in a pixel portion may be collectively covered with a nitride insulating film. A region where the protective insulating layer 178 and the first gate insulating layer 188 are in contact with each other may be formed so that at least the pixel portion of the active matrix substrate is surrounded.

This embodiment can be implemented in appropriate combination with any of the structures described in the other embodiments.

This application is based on Japanese Patent Application serial no. 2009-185317 filed with Japan Patent Office on Aug. 7, 2009 and Japanese Patent Application serial no. 2009-206489 filed with Japan Patent Office on Sep. 7, 2009, the entire contents of which are hereby incorporated by reference.

What is claimed is:

1. A semiconductor device comprising:
a driver circuit portion comprising a transistor; and
a pixel portion comprising a capacitor,
wherein the transistor comprises:
an oxide semiconductor layer comprising a crystal;
an insulating layer over and in contact with the oxide semiconductor layer; and
a transparent conductive layer over the insulating layer,
wherein one of electrodes of the capacitor is a same material as the transparent conductive layer, and
wherein the oxide semiconductor layer has a degree of crystallization of 80% or more.

2. The semiconductor device according to claim 1, wherein another of the electrodes of the capacitor is a same material as a gate electrode of the transistor.

3. The semiconductor device according to claim 1, wherein the oxide semiconductor layer comprises indium, gallium, and zinc.

4. The semiconductor device according to claim 1, wherein the oxide semiconductor layer comprises indium, gallium, and zinc.

5. The semiconductor device according to claim 1, wherein the transparent conductive layer comprises indium and zinc.

6. The semiconductor device according to claim 1, wherein the insulating layer comprises a silicon oxide film and a silicon nitride film.

7. The semiconductor device according to claim 1, wherein the pixel portion further comprises a liquid crystal layer over the capacitor.

8. The semiconductor device according to claim 1, wherein the transparent conductive layer is electrically connected to a gate electrode of the transistor.

9. A semiconductor device comprising:
a driver circuit portion comprising a first transistor; and
a pixel portion comprising a second transistor and a capacitor;
wherein the first transistor comprises:
a first oxide semiconductor layer comprising a crystal;
an insulating layer over and in contact with the first oxide semiconductor layer; and
a transparent conductive layer over the insulating layer,
wherein the second transistor comprises:
a second oxide semiconductor layer comprising a crystal; and
the insulating layer over and in contact with the second oxide semiconductor layer,
wherein the transparent conductive layer does not overlap a channel formation region of the second transistor,
wherein one of electrodes of the capacitor is a same material as the transparent conductive layer, and
wherein each of the first oxide semiconductor layer and the second oxide semiconductor layer has a degree of crystallization of 80% or more.

10. The semiconductor device according to claim 9, wherein another of the electrodes of the capacitor is a same material as a gate electrode of the second transistor.

11. The semiconductor device according to claim 9, wherein each of the first oxide semiconductor layer and the second oxide semiconductor layer comprises indium, gallium, and zinc.

12. The semiconductor device according to claim 9, wherein each of the first oxide semiconductor layer and the second oxide semiconductor layer comprises indium, gallium, and zinc.

13. The semiconductor device according to claim 9, wherein the transparent conductive layer comprises indium and zinc.

14. The semiconductor device according to claim 9, wherein the insulating layer comprises a silicon oxide film and a silicon nitride film.

15. The semiconductor device according to claim 9, wherein the pixel portion further comprises a liquid crystal layer over the capacitor.

16. The semiconductor device according to claim 9, wherein the transparent conductive layer is electrically connected to a gate electrode of the first transistor.

* * * * *